(12) United States Patent  
Miyairi et al.

(10) Patent No.: US 8,093,112 B2
(45) Date of Patent: Jan. 10, 2012

(54) METHOD FOR MANUFACTURING DISPLAY DEVICE

(75) Inventors: Hidekazu Miyairi, Isehara (JP); Yasuhiro Jinbo, Atsugi (JP); Kosei Nei, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 247 days.

(21) Appl. No.: 12/219,018

(22) Filed: Jul. 15, 2008

(65) Prior Publication Data

US 2009/0023236 A1    Jan. 22, 2009

(30) Foreign Application Priority Data

Jul. 20, 2007   (JP) ................. 2007-190236

(51) Int. Cl.
H01L 21/84       (2006.01)

(52) U.S. Cl. . 438/158; 438/487; 438/795; 257/E21.414; 257/E21.415

(58) Field of Classification Search ............. 438/151, 438/158, 486, 487, 795; 257/E21.414, E21.415
See application file for complete search history.

(56) References Cited

U.S. PATENT DOCUMENTS

| 4,409,134 A | 10/1983 | Yamazaki |
| 5,453,858 A | 9/1995 | Yamazaki |
| 5,464,792 A * | 11/1995 | Tseng et al. .................. 438/585 |
| 5,502,315 A * | 3/1996 | Chua et al. ..................... 257/50 |
| 5,514,879 A | 5/1996 | Yamazaki |
| 5,539,219 A | 7/1996 | Boer et al. |
| 5,614,732 A | 3/1997 | Yamazaki |
| 5,648,662 A | 7/1997 | Zhang et al. |
| 5,701,167 A | 12/1997 | Yamazaki |
| 5,757,451 A | 5/1998 | Miyazaki et al. |
| 5,766,989 A | 6/1998 | Maegawa et al. |
| 5,815,232 A | 9/1998 | Miyazaki et al. |
| 5,827,773 A | 10/1998 | Voutsas |
| 5,849,601 A | 12/1998 | Yamazaki |
| 5,859,445 A | 1/1999 | Yamazaki |
| 5,917,572 A | 6/1999 | Kurauchi et al. |
| 5,932,302 A | 8/1999 | Yamazaki et al. |
| 5,942,767 A | 8/1999 | Na et al. |

(Continued)

FOREIGN PATENT DOCUMENTS

CN           1577775         2/2005

(Continued)

OTHER PUBLICATIONS

Arai et al., "Micro Silicon Technology for Active Matrix OLED Display" SID 07 Digest, 2007, pp. 1370-1373.

(Continued)

*Primary Examiner* — Tuan N. Quach
(74) *Attorney, Agent, or Firm* — Eric J. Robinson; Robinson Intellectual Property Law Office, P.C.

(57) ABSTRACT

A method for manufacturing display devices including thin film transistors with high reliability in a high yield is provided. A gate insulating film is formed over a gate electrode; a microcrystalline semiconductor is formed over the gate insulating film; the microcrystalline semiconductor film is irradiated with a laser beam from the surface side thereof, whereby the crystallinity of the microcrystalline semiconductor film is improved. Then, a thin film transistor is formed using the microcrystalline semiconductor film whose crystallinity is improved. Further, a display device including the thin film transistor is manufactured.

24 Claims, 52 Drawing Sheets

U.S. PATENT DOCUMENTS

| | | | |
|---|---|---|---|
| 6,011,277 | A | 1/2000 | Yamazaki |
| 6,023,075 | A | 2/2000 | Yamazaki |
| 6,104,042 | A | 8/2000 | Sah |
| 6,171,674 | B1 | 1/2001 | Yamazaki et al. |
| 6,183,816 | B1 | 2/2001 | Yamazaki et al. |
| 6,197,625 | B1 | 3/2001 | Choi |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,323,521 | B1 | 11/2001 | Seo |
| 6,377,328 | B1 | 4/2002 | Morimoto et al. |
| 6,468,617 | B1 | 10/2002 | Yamazaki et al. |
| 6,493,050 | B1 | 12/2002 | Lien et al. |
| 6,671,025 | B1 | 12/2003 | Ikeda et al. |
| 6,737,676 | B2 | 5/2004 | Yamazaki |
| 6,756,258 | B2 | 6/2004 | Zhang et al. |
| 6,835,523 | B1 | 12/2004 | Yamazaki et al. |
| 6,836,308 | B2 | 12/2004 | Sawasaki et al. |
| 6,888,608 | B2 | 5/2005 | Miyazaki et al. |
| 7,029,995 | B2 * | 4/2006 | Todd et al. .................. 438/481 |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,199,846 | B2 | 4/2007 | Lim |
| 7,229,862 | B2 | 6/2007 | Yamazaki et al. |
| 7,417,249 | B2 | 8/2008 | Akimoto et al. |
| 7,433,004 | B2 | 10/2008 | Tsubata et al. |
| 7,572,688 | B2 | 8/2009 | Yamazaki et al. |
| 7,576,360 | B2 | 8/2009 | Yamazaki |
| 7,579,220 | B2 | 8/2009 | Ohnuma et al. |
| 7,609,331 | B2 | 10/2009 | Lim |
| 7,635,889 | B2 * | 12/2009 | Isa et al. .................. 257/309 |
| 7,700,164 | B2 | 4/2010 | Yamazaki et al. |
| 2002/0001777 | A1 * | 1/2002 | Kido .................. 430/313 |
| 2003/0143784 | A1 | 7/2003 | Nishitani et al. |
| 2005/0012097 | A1 | 1/2005 | Yamazaki |
| 2005/0014319 | A1 * | 1/2005 | Yamazaki et al. ........... 438/197 |
| 2005/0022864 | A1 | 2/2005 | Fujioka et al. |
| 2005/0116294 | A1 * | 6/2005 | Hayakawa et al. .......... 257/351 |
| 2005/0205870 | A1 | 9/2005 | Yamazaki |
| 2005/0263765 | A1 * | 12/2005 | Maekawa .................. 257/69 |
| 2006/0024866 | A1 | 2/2006 | Gan et al. |
| 2006/0091394 | A1 * | 5/2006 | Honda .................. 257/66 |
| 2006/0110862 | A1 * | 5/2006 | Gan et al. .................. 438/149 |
| 2006/0186413 | A1 | 8/2006 | Sakakura et al. |
| 2006/0238132 | A1 | 10/2006 | Kitamura et al. |
| 2006/0263952 | A1 | 11/2006 | Hiroki et al. |
| 2006/0287461 | A1 | 12/2006 | Henze et al. |
| 2008/0308807 | A1 | 12/2008 | Yamazaki et al. |
| 2009/0001375 | A1 | 1/2009 | Yamazaki et al. |
| 2009/0002590 | A1 | 1/2009 | Kimura |
| 2009/0002591 | A1 | 1/2009 | Yamazaki et al. |
| 2009/0008645 | A1 | 1/2009 | Yamazaki et al. |
| 2009/0009677 | A1 | 1/2009 | Yamazaki et al. |
| 2009/0039351 | A1 | 2/2009 | Kobayashi et al. |
| 2010/0238391 | A1 | 9/2010 | Yamazaki et al. |

FOREIGN PATENT DOCUMENTS

| | | |
|---|---|---|
| CN | 1790741 | 6/2006 |
| EP | 1505174 A | 2/2005 |
| JP | 04-242724 | 8/1992 |
| JP | 08-195492 | 7/1996 |
| JP | 11-121761 A | 4/1999 |
| JP | 2000-232066 | 8/2000 |
| JP | 2001-007024 A | 1/2001 |
| JP | 3558200 | 8/2004 |
| JP | 2005-049832 | 2/2005 |
| JP | 2005-167051 A | 6/2005 |

OTHER PUBLICATIONS

Sazonov et al. "Low-Temperature Materials and Thin Film Transistors for Flexible Electronics", Proceedings of the IEEE, vol. 93, No. 8, Aug. 2005, pp. 1420-1428.

Lee et al. "Top Gate TFTs Using 13.56 MHz PECVD Microcrystalline Silicon", IEEE Electron Device Letters, vol. 26, No. 9, Sep. 2005, pp. 637-639.

Lee et al. "Postdeposition Thermal Annealing and Material Stability of 75° C. Hydrogenated Nanocrystalline Silicon Plasma-Enhanced Chemical Vapor Deposition Films", Journal of Applied Physics, vol. 98, Aug. 4, 2005, pp. 034305-1-034305-7.

Esmaeili-Rad et al. "Stability of Nanocrystalline Silicon Bottom-Gate Thin Film Transistors with Silicon Nitride Gate Dielectric", Journal of Applied Physics, vol. 102, Sep. 28, 2007, pp. 064512-1-064512-7.

Esmaeili-Rad et al. "Absence of Defect State Creation in Nanocrystalline Silicon Thin Film Transistors Deduced from Constant Current Stress Measurements", Applied Physics Letters, vol. 91, Sep. 12, 2007, pp. 113511-1-113511-3.

Lee et al. "Leakage Current Mechanisms in Top-Gate Nanocrystalline Silicon Thin Film Transistors", Applied Physics Letters, vol. 92, Feb. 28, 2008, pp. 083509-1-83509-3.

Chinese Office Action (Application No. 200810131636.4) Dated Jan. 11, 2011.

Kim, C et al., "A Novel Four-Mask-Count Process Architecture for TFT-LCDS,", SID Digest '00: SID International Symposium Digest of Technical Papers, 2000, vol. 31, pp. 1006-1009.

Lee, C et al., "How To Achieve High Mobility Thin Film Transistors by Direct Deposition of Silicon Using 13.56 MHZ RF PECVD?,", IEDM 06: Technical Digest of International Electron Devices Meeting, Dec. 11, 2006, pp. 295-298.

Lee, C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Song, J et al., "34.1: Advanced Four-Mask Process Architecture for the A-SI TFT Array Manufacturing Method,", SID Digest '02 : SID International Symposium Digest of Technical Papers, 2002, vol. 32, pp. 1038-1041.

Choi, S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee, C et al., "High-Mobility Nanocrystalline Silicon Thin-Film Transistors Fabricated by Plasma-Enhanced Chemical Vapor Deposition,", Appl. Phys. Lett. (Applied Physics Letters) , May 24, 2005, vol. 86, pp. 222106-1-222106-3.

Lee, C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee, C et al., "Stability of NC-SI:H TFTS With Silicon Nitride Gate Dielectric,", IEEE Transactions on Electron Devices, 2007, vol. 54, No. 1, pp. 45-51.

* cited by examiner

FIG. 21A  Side View
FIG. 21B  Elevation View
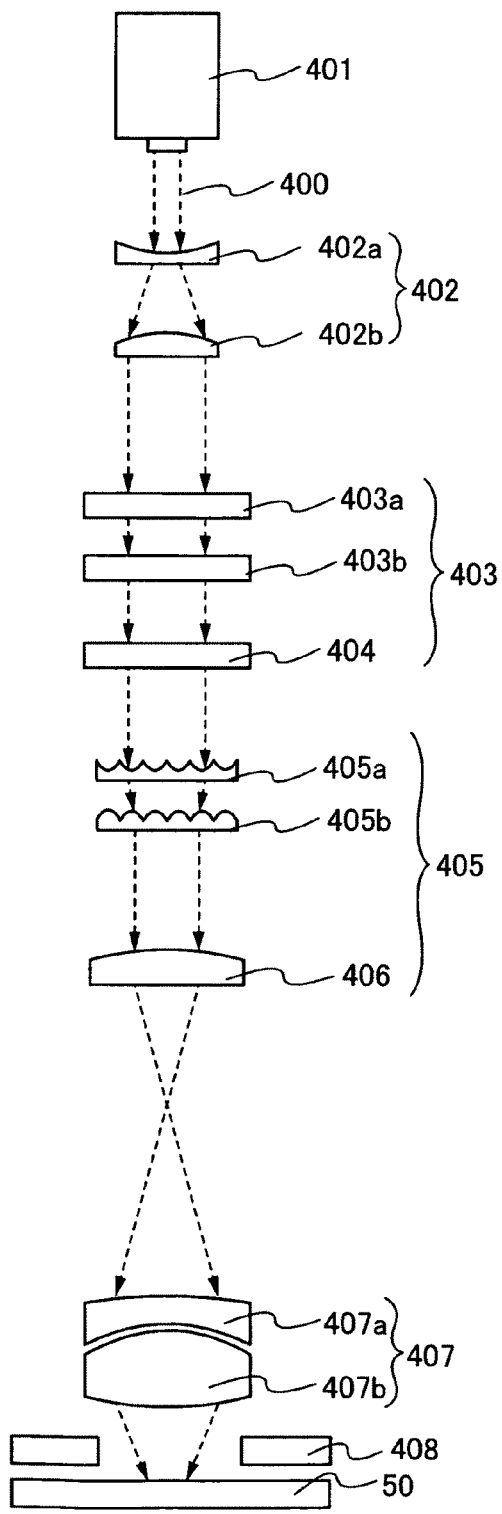
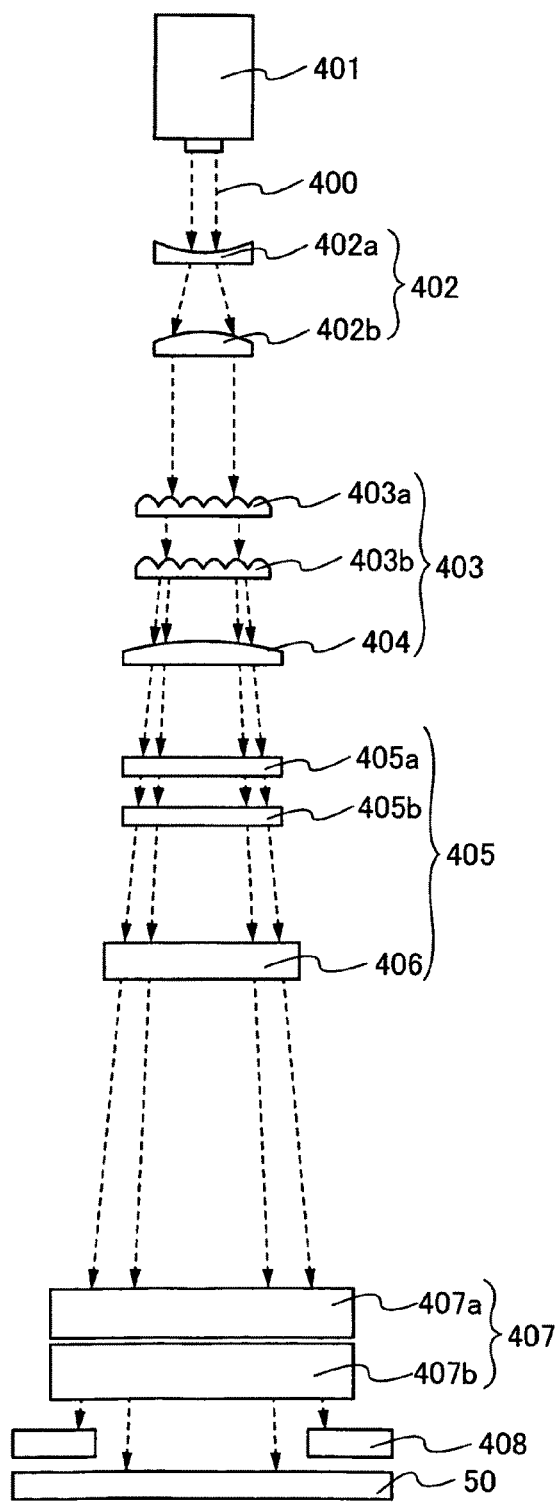

Light Transmittance

Light Transmittance

FIG. 40A
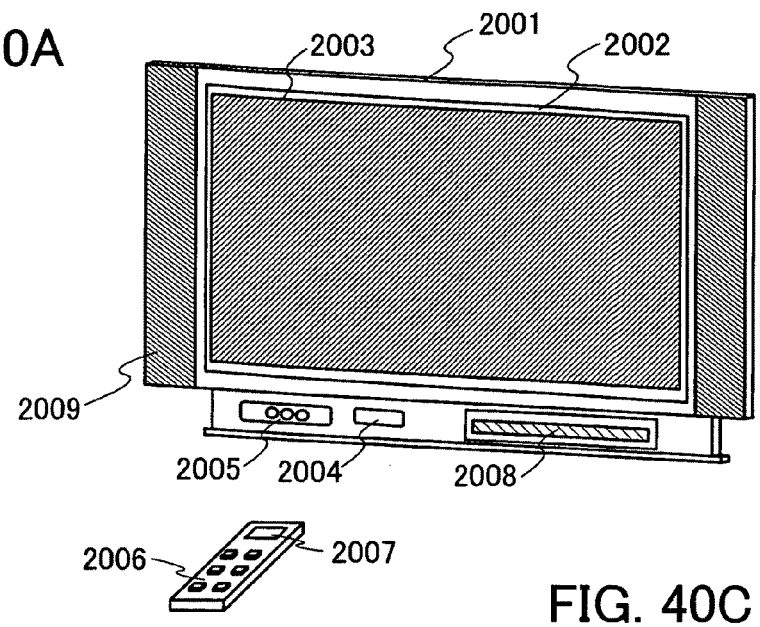
FIG. 40B
FIG. 40C
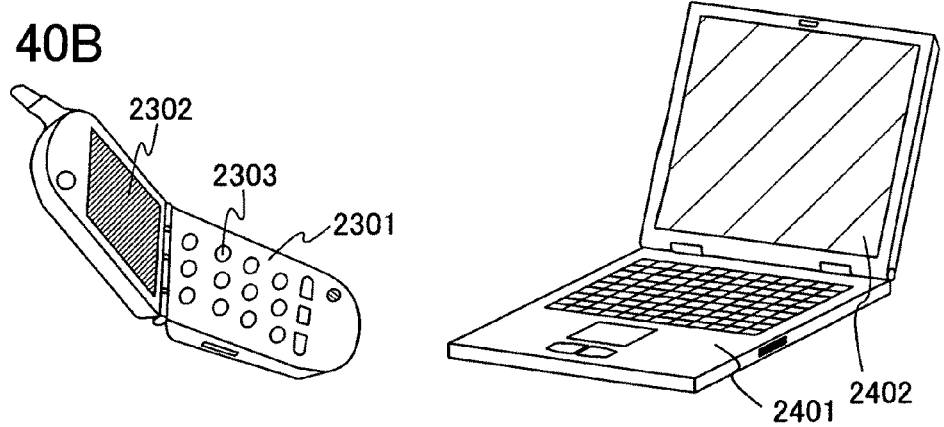
FIG. 40D
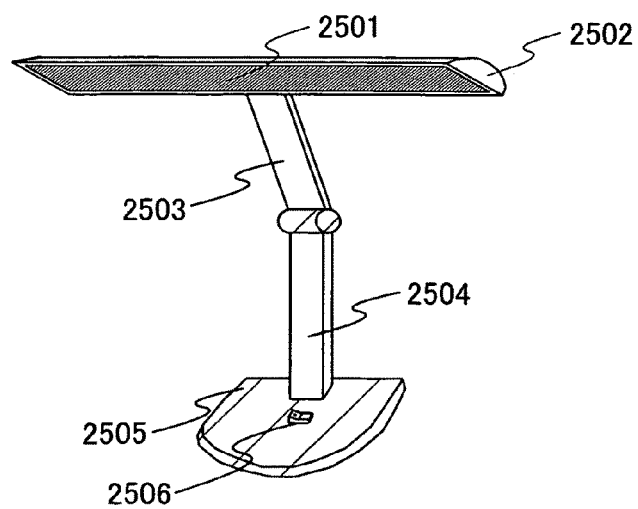

METHOD FOR MANUFACTURING DISPLAY DEVICE

BACKGROUND OF THE INVENTION

1. Field of the Invention

The present invention relates to a method for manufacturing a display device in which a thin film transistor is used at least in a pixel portion.

2. Description of the Related Art

In recent years, technology for forming thin film transistors using semiconductor thin films (with thicknesses of from several tens of nanometers to several hundreds of nanometers, approximately) formed over substrates having an insulating surface, for channel formation regions, has been attracting attention. Thin film transistors are applied to a wide range of electronic devices such as ICs or electro-optical devices, and prompt development of thin film transistors that are to be used as switching elements in image display devices, in particular, is being pushed.

As a switching element in an image display device, a thin film transistor in which an amorphous semiconductor film is used for a channel formation region, a thin film transistor in which a polycrystalline semiconductor film is used for a channel formation region, or the like is used. As a method for forming a polycrystalline semiconductor film, a technique is known in which a pulsed excimer laser beam is processed into a linear shape with an optical system, and an amorphous silicon film is scanned with the linear beam, thereby being crystallized.

As a switching element in an image display device, further, a thin film transistor in which a microcrystalline semiconductor film is used for a channel formation region is used (see Reference 1: Japanese Published Patent Application No. H4-242724; and Reference 2: Japanese Published Patent Application No. 2005-49832).

As a conventional method for manufacturing a thin film transistor, a method is known in which after forming an amorphous silicon film over a gate insulating film, a metal film is formed thereover, and the metal film is irradiated with diode laser, whereby the amorphous silicon film is changed in quality to be a microcrystalline silicon film. According to this method, the metal film formed over the amorphous silicon film is formed to convert optical energy of the diode laser into thermal energy, and needs to be removed later in order to complete a thin film transistor. That is to say, in the above method, the amorphous silicon film is heated only with heat conduction from the metal film, thereby forming the microcrystalline silicon film.

SUMMARY OF THE INVENTION

A thin film transistor using a polycrystalline semiconductor film for a channel formation region has an advantage that mobility is higher than that of a thin film transistor using an amorphous semiconductor film for a channel formation region by two or more digits, and a pixel portion and a peripheral driver circuit of a semiconductor display device can be formed over the same substrate. However, the thin film transistor using a polycrystalline semiconductor film for a channel formation region requires a more complicated process than the thin film transistor using an amorphous semiconductor film for a channel formation region because of crystallization of the semiconductor film. Thus, there are problems such as a reduction in yield and an increase in cost.

Further, an inversely-staggered thin film transistor using a microcrystalline semiconductor film for a channel formation region has problems in that the crystallinity of an interface region between a gate insulating film and a microcrystalline semiconductor film is low and electric characteristics are poor.

In view of the above problems, it is an object of the present invention to provide a method for manufacturing a display device including a thin film transistor with excellent electric characteristics and high reliability, in a high yield.

One of features of the present invention is that a gate insulating film is formed over a gate electrode; a microcrystalline semiconductor film is formed over the gate insulating film; the microcrystalline semiconductor film is irradiated with a laser beam from the surface, thereby improving the crystallinity of the microcrystalline semiconductor film; and then, a thin film transistor is formed using the microcrystalline semiconductor film having the improved crystallinity for a channel formation region.

Further, a buffer layer is formed over the microcrystalline semiconductor film having the improved crystallinity, and a source region and a drain region, and a source wiring and a drain wiring are formed over the buffer layer, to form a thin film transistor.

Irradiation of the microcrystalline semiconductor film with a laser beam can improve the crystallinity of an interface between the gate insulating film and the microcrystalline semiconductor film, enables formation of a transistor which has a bottom gate structure and in which the channel formation region is formed using the microcrystalline semiconductor film, and can improve the electric characteristics of the thin film transistor.

The buffer layer is formed between the microcrystalline semiconductor film having the improved crystallinity and the source and drain regions. The microcrystalline semiconductor film functions as the channel formation region. The buffer layer prevents the microcrystalline semiconductor film from being oxidized and further functions as a high resistant region. The thin film transistor has high mobility, little leakage current, and high resistance to pressure because the buffer layer is formed between the microcrystalline semiconductor film and the source and drain regions.

An example of the buffer layer is an amorphous semiconductor film, preferably an amorphous semiconductor film including at least one of nitrogen, hydrogen, and halogen. The amorphous semiconductor film including any one of nitrogen, hydrogen, and halogen can reduce oxidation of a crystal grain included in the microcrystalline semiconductor film.

A buffer layer can be formed by a plasma CVD method, a sputtering method, or the like. Further, a buffer layer can be formed by forming an amorphous semiconductor film and then nitriding, hydrogenating, or halogenating a surface of the amorphous semiconductor film by nitrogen plasma treatment, hydrogen plasma treatment, or halogen plasma treatment to the surface of the amorphous semiconductor film.

The buffer layer provided on a surface of the microcrystalline semiconductor film can reduce oxidation of a crystal grain included in the microcrystalline semiconductor film, and thus deterioration of electric characteristics of the thin film transistor can be reduced.

Further, thin film transistors (TFTs) are manufactured using the microcrystalline semiconductor film for channel formation regions, and a display device is manufactured using the thin film transistors for a pixel portion and further for a driver circuit. A thin film transistor including a microcrystalline semiconductor film as a channel formation region has a mobility of from 1 to 20 $cm^2/V \cdot sec$, which is 2 to 20 times higher than that of a thin film transistor including an amorphous semiconductor film as a channel formation region; thus, part of the driver circuit or the entire driver circuit can be formed over the same substrate as that of the pixel portion, so that a system-on-panel can be manufactured.

Examples of the display device include a light-emitting device and a liquid crystal display device. A light-emitting device includes a light-emitting element, and a liquid crystal display device includes a liquid crystal element. Examples of a light-emitting element include, in its category, an element whose luminance is controlled with current or voltage, specifically, an inorganic electroluminescence (EL) element, an organic EL element, and the like.

In addition, the display device includes a panel in which a display element is sealed, and a module in which an IC and the like including a controller are mounted on the panel. The present invention further relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module including an integrated circuit (IC) which is directly mounted on a display element by a chip on glass (COG) method.

According to the present invention, a display device including a thin film transistor with high reliability can be manufactured in a high yield.

BRIEF DESCRIPTION OF DRAWINGS

In the accompanying drawings:

FIGS. 21A and 21B illustrate an optical system applicable to the present invention;

FIGS. 40A to 40D are perspective views illustrating electronic devices including light-emitting devices of the present invention;

DETAILED DESCRIPTION OF THE INVENTION

Hereinafter, embodiment modes of the present invention are described with reference to the drawings. It is easily understood by those skilled in the art that the modes and details disclosed herein can be modified in various ways without departing from the spirit and scope of the present invention. Therefore, the present invention should not be interpreted as being limited to the description of the embodiment modes to be given below.

Embodiment Mode 1

This embodiment mode describes a process of manufacturing a thin film transistor used for a display device with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A and 7B, FIGS. 8A to 8D, FIGS. 9A and 9B, FIGS. 10A to 10C, FIGS. 11A and 11B, FIGS. 12A to 12C, FIGS. 13A to 13C, FIGS. 14A to 14C, FIG. 15, FIGS. 16A to 16D, FIG. 17, FIGS. 18A to 18C, and FIG. 19. FIGS. 1A to 1C, FIGS. 2A to 2C, FIGS. 3A to 3C, FIGS. 5A to 5C, FIGS. 6A to 6C, FIGS. 7A and 7B, FIGS. 9A and 9B, FIGS. 10A to 10C, FIGS. 11A and 11B, FIGS. 13A to 13C, FIGS. 14A to 14C, FIG. 15, FIG. 17, FIGS. 18A to 18C, and FIG. 19 are cross-sectional views illustrating processes of manufacturing thin film transistors. FIGS. 4A to 4C, FIGS. 8A to 8D, FIGS. 12A to 12C, and FIGS. 16A to 16D are each a top view of a region where a thin film transistor is connected to a pixel electrode in one pixel.

With regard to a thin film transistor including a microcrystalline semiconductor film, an n-channel thin film transistor has higher mobility than a p-channel thin film transistor; thus, an n-channel thin film transistor is more suitable for a driver circuit. Further, it is preferable that all the thin film transistors formed over one substrate have the same polarity so that the number of manufacturing steps is reduced. In description of this embodiment mode, an n-channel thin film transistor is used.

Figure 1A:
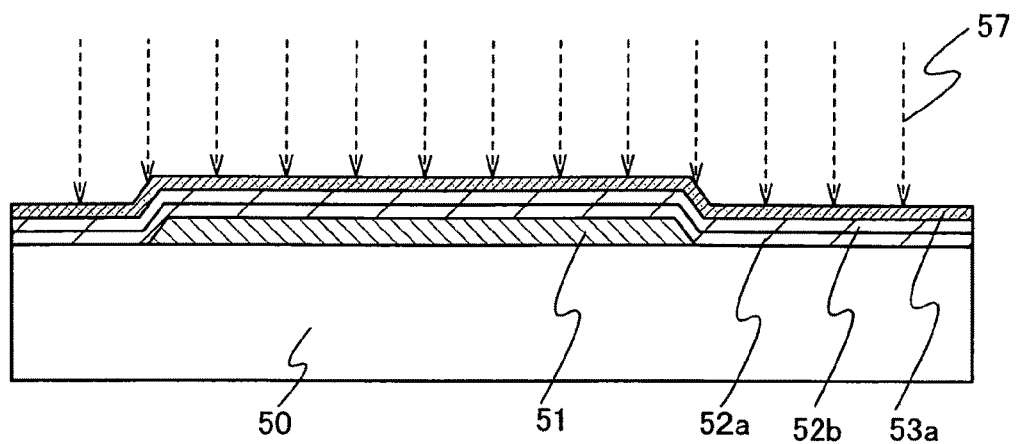
FIGS. 1A to 1C are cross-sectional views illustrating a method for manufacturing a display device of the present invention.

As illustrated in FIG. 1A, a gate electrode 51 is formed over a substrate 50. As the substrate 50, a plastic substrate having sufficient heat resistance to withstand a processing temperature of a manufacturing process or the like as well as a non-alkaline glass substrate manufactured by a fusion method or a float method, such as a substrate of barium borosilicate glass, aluminoborosilicate glass, or aluminosilicate glass, or a ceramic substrate can be used. Alternatively, a metal substrate such as a stainless steel alloy substrate which is provided with an insulating film over the surface may also be used. When the substrate 50 is mother glass, a first generation (320 mm×400 mm), a second generation (400 mm×500 mm), a third generation (550 mm×650 mm), a fourth generation (680 mm×880 mm or 730 mm×920 mm), a fifth generation (1000 mm×1200 mm or 1100 mm×1250 mm), a sixth generation (1500 mm×1800 mm), a seventh generation (1900 mm×2200 mm), an eighth generation (2160 mm×2460 mm), a ninth generation (2400 mm×2800 mm or 2450 mm×3050 mm), a tenth generation (2950 mm×3400 mm), or the like can be employed.

The gate electrode 51 is formed of a metal material such as titanium, molybdenum, chromium, tantalum, tungsten, aluminum, or copper, or an alloy material thereof (e.g., an aluminum-neodymium alloy or an aluminum-selenium alloy). The gate electrode 51 can be formed as follows: a conductive film is formed over the substrate 50 by a sputtering method or a vacuum evaporation method; a mask is formed by a photolithography technique or an inkjet method over the conductive film; and the conductive film is etched using the mask. In order to improve adhesion, a stacked-layer structure of a barrier layer formed of a metal material selected from the above metal materials or nitride thereof, and a layer of a metal material selected from the above metal materials may be employed. Typical examples are a stacked layer of molybdenum and aluminum, a stacked layer of titanium and aluminum, a stacked layer of titanium nitride and aluminum, a stacked layer of tantalum nitride and aluminum, a stacked layer of molybdenum and copper, a stacked layer of titanium nitride and copper, a stacked layer of tantalum nitride and copper, and the like. Further, a stacked-layer structure of a layer of the a metal material selected from the above metal materials and a barrier layer formed of a metal material selected from the above metal materials or nitride thereof may be employed in order to prevent the above metal material from diffusing into a gate insulating film which is formed over the gate electrode 51. Further, a three-layer structure of the above barrier layer, the layer of the above metal material, and the above barrier layer may also be employed. In this embodiment mode, a molybdenum film is formed as a conductive film over the substrate 50 by a sputtering method, and is etched using a resist mask formed using a first photomask, to form the gate electrode.

The gate electrode 51 is formed with a thickness of from 50 to 300 nm inclusive. The thickness of from 50 to 100 nm inclusive of the gate electrode 51 can prevent a disconnection of a semiconductor film and a wiring, which are formed later. Further, the thickness of from 150 to 300 nm inclusive of the gate electrode 51 can lower the resistance of the gate electrode 51, and increase the size of the substrate.

Since the semiconductor film and the wiring are formed over the gate electrode 51, the gate electrode 51 is preferably processed to have a tapered end portion so that the semiconductor film and the wiring thereover are not disconnected. Further, although not illustrated, a wiring connected to the gate electrode can also be formed at the same time when the gate electrode is formed.

Subsequently, gate insulating films 52a and 52b and a microcrystalline semiconductor film 53a are formed over the gate electrode 51.

The gate insulating films 52a and 52b each can be formed using a silicon oxide film, a silicon nitride film, a silicon oxynitride film, or a silicon nitride oxide film by a CVD method, a sputtering method, or the like. This embodiment mode presents an example in which a silicon nitride film or a silicon nitride oxide film is formed as the gate insulating film 52a, and a silicon oxide film or a silicon oxynitride film is formed thereover as the gate insulating film 52b to form a stacked-layer structure. Instead of a two-layer structure, a silicon nitride film or a silicon nitride oxide film, a silicon oxide film or a silicon oxynitride film, and a silicon nitride film or a silicon nitride oxide film may be stacked in this order from the substrate side to form the gate insulating film with a three-layer structure. Further, it is also possible to form the gate insulating film with a single layer of a silicon oxide film, a silicon nitride film, a silicon oxynitride film, or a silicon nitride oxide film.

If the gate insulating film 52a is formed using a silicon nitride film or a silicon nitride oxide film, adhesion between the substrate 50 and the gate insulating film 52a is increased, and further, impurities from the substrate 50 can be prevented from diffusing into the microcrystalline semiconductor film when a glass substrate is used for the substrate 50. Furthermore, oxidation of the gate electrode 51 can be prevented. That is to say, film peeling can be prevented, and thus electric characteristics of a thin film transistor which is completed later can be improved. Further, the gate insulating films 52a and 52b with a thickness of greater than or equal to 50 nm are preferable because the gate insulating films 52a and 52b with the above thickness can alleviate reduction in coverage caused by unevenness due to the gate electrode 51.

Further, if the gate insulating film 52b is a silicon oxide film or a silicon oxynitride film, forming a silicon nitride film with a thickness of from 1 to 5 nm inclusive on a surface of the gate insulating film 52b can prevent a surface of the microcrystalline semiconductor film from being oxidized at an interface between the microcrystalline semiconductor film and the gate insulating film 52b in irradiating the microcrystalline semiconductor film with a laser beam. Examples of a method for forming the silicon nitride film include a plasma CVD method, a sputtering method, and the like. Alternatively, the surface of the gate insulating film 52b may undergo nitrogen plasma treatment. By nitriding the surface of the gate insulating film 52b with nitrogen radicals generated with microwave plasma as the above nitrogen plasma, the silicon nitride film can be formed on the surface of the gate insulating film 52b.

Note that a silicon oxynitride film means a film that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that includes more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 53a is a film including a semiconductor having an intermediate structure between amorphous and crystalline (including single-crystalline and polycrystalline) structures. This semiconductor is in a third state, in which the semiconductor is stable in free energy, and is a crystalline semiconductor having short-range order and lattice distortion; and columnar or needle-shaped crystals thereof with a diameter of 0.5 nm to 20 nm are grown in a direction of the normal to the surface of the substrate. Further, the microcrystalline semiconductor film 53a includes both a microcrystalline semiconductor and an amorphous semiconductor. A Raman spectrum of microcrystalline silicon, which is a typical example of a microcrystalline semiconductor, is located in lower wave numbers than 520.5 cm$^{-1}$, which represents a peak of a Raman spectrum of single-crystalline silicon. That is to say, a peak of a Raman spectrum of microcrystalline silicon lies between 520.5 cm$^{-1}$, which represents a peak of a Raman spectrum of single-crystalline silicon, and 480 cm$^{-1}$, which represents a peak of a Raman spectrum of amorphous silicon. Furthermore, the microcrystalline semiconductor film 53a includes hydrogen or halogen at 1 at. % or more in order to terminate a dangling bond. The microcrystalline semiconductor film 53a may further include a rare gas element such as helium, argon, krypton, or neon to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The microcrystalline semiconductor film can be formed with use of a high frequency plasma CVD apparatus with a frequency of several tens of MHz to several hundreds of MHz, or a microwave plasma CVD apparatus with a frequency of greater than or equal to 1 GHz. Typically, the microcrystalline semiconductor film can be formed using silicon hydride (e.g., $SiH_4$ or $Si_2H_6$) which is diluted with hydrogen. Further, the microcrystalline semiconductor film can be formed using silicon hydride, hydrogen, and one or plural kinds of rare gas elements selected from helium, argon, krypton, and neon. In such a case, a flow rate of hydrogen is 6 to 1000 times, preferably 50 to 200 times, more preferably 100 to 150 times as high as that of silicon hydride. $SiH_2Cl_2$, $SiHCl_3$, $SiCl_4$, $SiF_4$, or the like can be used instead of silicon hydride.

The microcrystalline semiconductor film has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold value can be controlled. A typical example of the impurity element imparting p-type conductivity is boron, and an impurity gas such as $B_2H_6$ or $BF_3$ may be mixed into silicon hydride at a concentration of from 1 to 1000 ppm, preferably from 1 to 100 ppm. A concentration of boron is preferably set to be $1\times10^{14}$ to $6\times10^{16}$ atoms/cm$^3$.

Preferably, the microcrystalline semiconductor film includes oxygen at a concentration of $5\times10^{19}$ atoms/cm$^3$ or less, more preferably $1\times10^{19}$ atoms/cm$^3$ or less. Further, the microcrystalline semiconductor film preferably includes nitrogen and carbon each at a concentration of $3\times10^{18}$ atoms/cm$^3$ or less. Reducing concentrations of oxygen, nitrogen, and carbon in the microcrystalline semiconductor film can prevent the microcrystalline semiconductor film from assuming an n-type.

It is preferable to form the microcrystalline semiconductor film 53a with a thickness of from 1 to 200 nm inclusive, preferably from 1 to 10 nm inclusive, from 1 to 50 nm inclusive, from 1 to 30 nm inclusive, from 1 to 20 nm inclusive, or greater than or equal to 1 nm and less than 15 nm. The microcrystalline semiconductor film 53a functions as a channel formation region of a thin film transistor, which is completed later. The microcrystalline semiconductor film 53a with a thickness of from 1 to 50 nm inclusive makes the thin film transistor, which is completed later, a complete depletion type. Further, by reducing the thickness of the microcrystalline semiconductor film 53a, throughput can be improved because the deposition rate of the microcrystalline semiconductor film 53a is $\frac{1}{10}$ to $\frac{1}{1000}$ times as low as that of an amorphous semiconductor film. Furthermore, by making the thickness of the microcrystalline semiconductor film 53a from 1 to 30 nm inclusive, preferably from 5 to 20 nm inclusive, the microcrystalline semiconductor film 53a can absorb a laser beam, which is applied later, at a higher absorption rate.

Further, a surface of the gate insulating film 52b may undergo hydrogen plasma treatment before forming the microcrystalline semiconductor film 53a. The hydrogen plasma treatment can reduce lattice distortion at the interface between the gate insulating film and the microcrystalline semiconductor film, and improve the property of the interface between the gate insulating film and the microcrystalline semiconductor film. Thus, the thin film transistor, which is completed later, can have improved electric characteristics.

Subsequently, irradiation with a laser beam 57 is performed from a surface of the microcrystalline semiconductor film 53a side. The irradiation is performed with such energy that the laser beam 57 does not melt the microcrystalline semiconductor film. That is to say, a laser process (also referred to as "LP," hereinafter) according to this embodiment mode proceeds by solid phase crystal growth, in which the microcrystalline semiconductor film 53a is processed by radiation heat without being melted. In other words, the laser process according to this embodiment mode utilizes a critical region in a solid phase where the deposited microcrystalline semiconductor film 53a is on the point of turning into a liquid phase. In that sense, the solid phase crystal growth can also be referred to as "critical growth."

The laser beam 57 can have action to the interface between the microcrystalline semiconductor film 53a and the gate insulating film 52b, whereby a microcrystalline semiconductor film 53b can be formed, in which a crystal in the microcrystalline semiconductor film 53a has grown in a solid phase, functioning as a nucleus, and in which the crystallinity is improved. In a typical example of the microcrystalline semiconductor film 53b, a crystal on the surface side of the microcrystalline semiconductor film 53a has grown in a solid phase from the surface to an interface between the microcrystalline semiconductor film 53b and the insulating film, functioning as a nucleus, and the crystallinity is improved. In another example of the microcrystalline semiconductor film 53b, a crystal in the microcrystalline semiconductor film 53a has grown in a solid phase from a region where a nucleus is present to a surface of the microcrystalline semiconductor film 53b and to the interface between the microcrystalline semiconductor film 53b and the insulating film, functioning as the nucleus, and the crystallinity is improved (see FIG. 1B). Solid phase crystal growth by an LP improves the crystallinity in a direction of a film thickness instead of increasing a crystal diameter. That is to say, the LP has an effect of improving the crystallinity of the interface region with the gate insulating film and improving the electric characteristics of the thin film transistor with a bottom gate structure.

Such critical growth has a feature of maintaining planarity on the surface of the microcrystalline semiconductor film 53b which has undergone the LP, which is different from conventional low-temperature polysilicon, which has a rough surface (a portion in a shape of reverse T, called a "ridge"). As in this embodiment mode, the crystalline semiconductor film obtained by applying the laser beam 57 directly to the deposited microcrystalline semiconductor film 53a undoubtedly has a different growth mechanism and film quality from those of a conventional as-deposited microcrystalline semiconductor film or a microcrystalline semiconductor film which is changed in quality by heat conduction (in Reference 3: Toshiaki Arai et al., "SID 07 DIGEST" 2007, pp. 1370-1373). In this specification, the microcrystalline semiconductor film 53b obtained by performing the LP to the deposited microcrystalline semiconductor film 53a is called an LPSAS (laser process semiamorphous semiconductor) film 53b.

The LPSAS film 53b has lower resistance than an amorphous semiconductor film because the LPSAS film 53b includes a microcrystal. Therefore, a thin film transistor in which the LPSAS film 53b is used for a channel formation region has such a current-voltage property that a curve showing the current-voltage property has a rising portion with a steep slope, and is excellent in response speed as a switching element; and thus can operate at high speed. Further, if the LPSAS film 53b is used for a channel formation region of a thin film transistor, variation in a threshold value of the thin film transistor can be suppressed. Thus, a display device with little variation in electric characteristics can be manufactured.

Further, the LPSAS film 53b has higher mobility than an amorphous semiconductor film. Therefore, if a thin film transistor in which a channel formation region is formed of the LPSAS film 53b is used as a switching element of a display element, the area of the channel formation region can be reduced; in other words, the area of the thin film transistor can be reduced. Thus, the area of a thin film transistor in each pixel is reduced, whereby the aperture rate of the pixel can be increased. Accordingly, the display device can have high definition.

If an excimer laser is used for the laser beam 57, a pulse repetition rate is greater than or equal to 1 Hz and less than 10 MHz, preferably from 100 Hz to 10 kHz; and laser energy is from 0.2 to 0.45 J/cm$^2$, preferably from 0.2 to 0.35 J/cm$^2$, more preferably and typically from 0.2 to 0.3 J/cm$^2$. If a YAG laser is used, the third harmonic thereof is used; a preferable pulse repetition rate is greater than or equal to 1 Hz and less than 10 MHz; and preferable laser energy is from 0.2 to 0.35 J/cm$^2$ (typically, from 0.2 to 0.3 J/cm$^2$).

As a laser oscillator of the laser beam 57, a laser oscillator capable of pulsed oscillation or continuous oscillation can be used. A laser wavelength is set to be in a visible region to an ultraviolet region (less than or equal to 800 nm), preferably an ultraviolet region (less than or equal to 400 nm) so that the semiconductor film can efficiently absorb the laser beam. If a laser beam with a wavelength in an ultraviolet region (from 300 to 400 nm) is used for irradiation, the microcrystalline semiconductor film can efficiently absorb the laser beam. As the laser oscillator, an excimer laser oscillator such as a KrF excimer laser oscillator, an ArF excimer laser oscillator, a XeCl excimer laser oscillator, or a XeF excimer laser oscillator; a gas laser oscillator such as a N$_2$ laser oscillator, a He laser oscillator, a He—Cd laser oscillator, an Ar laser oscillator, a He—Ne laser oscillator, a HF laser oscillator, or a CO$_2$ laser oscillator; a solid state laser oscillator using a crystal of YAG, GdVO$_4$, YVO$_4$, YLF, YAlO$_3$, ScO$_3$, Lu$_2$O$_3$, or Y$_2$O$_3$, doped with Cr, Nd, Er, Ho, Ce, Co, Ti, Yb, or Tm; a solid state laser oscillator such as a KGW laser, a KYW laser, an alexandrite laser, a Ti:sapphire laser; a metal vapor laser oscillator such as a helium cadmium laser; or the like can be used. In a solid state laser oscillator, the second harmonic to the fifth harmonic of the fundamental wave is preferably used.

An excimer laser beam with a wavelength of less than or equal to 400 nm and typically 308 nm, or the third harmonic (355 nm) of a YAG laser may be used for the laser beam 57.

In the LP, by condensing the laser beam in a rectangular form with a long length, to have a linear form in the surface of the object, the microcrystalline semiconductor film 53a over a glass substrate with an area of 730 mm×920 mm, for example, can be scanned with the laser beam only for one time. In such a case, an overlap rate of the linear laser beams is 0 to 95% (preferably 0 to 67%). Accordingly, process time of each substrate can be shortened and productivity can be improved. The form of the laser beam is not limited to a linear form, and a planar beam can also be used in the LP similarly. Further, the LP can be applied to substrates with various sizes without limitation to the above size of the glass substrate.

In a case of using a laser beam of continuous oscillation for the laser beam 57, throughput of the LP can be improved by providing a polygon mirror or a galvanometer mirror between an oscillator and the substrate, and scanning the laser beam with high speed; for example, the LP can be performed to a microcrystalline semiconductor film formed over a glass substrate of 730 mm×920 mm or larger.

The microcrystalline semiconductor film 53a may be irradiated with the laser beam 57 in an argon atmosphere, a hydrogen atmosphere, an atmosphere of argon and hydrogen, a nitrogen atmosphere, or the like. If the microcrystalline semiconductor film 53a is irradiated with the laser beam in an inert atmosphere in such a manner, an oxide film is less likely to be formed on a surface of the LPSAS film 53b.

Further, washing the surface of the microcrystalline semiconductor film 53a before irradiating the microcrystalline semiconductor film 53a with the laser beam 57 can prevent impurities on the surface of the microcrystalline semiconductor film 53a from entering the microcrystalline semiconductor film by the irradiation with the laser beam 57.

The microcrystalline semiconductor film 53a may undergo heating as well as irradiation with the laser beam 57. Typically, it is possible to enhance the crystallinity of the microcrystalline semiconductor film 53a by being irradiated with the laser beam 57 with the substrate 50 heated at 300 to 400° C. Alternatively, it is also possible to increase the temperature of the microcrystalline semiconductor film 53a in a moment by being irradiated with the laser beam and intense light. As a typical example of the intense light, an infrared ray with a peak of 1 to 2 µm (preferably, halogen light (1.3 µm)) can be used in particular.

If an oxide film is formed on the surface of the LPSAS film 53a, the oxide film is preferably removed by wet etching. As a result, it is possible to alleviate inhibition of carrier travel which is caused by the insulating film formed at an interface between the LPSAS film 53b and a buffer layer 54.

Further, the LPSAS film 53b may be etched to have a smaller thickness. If the LPSAS film has a thickness of from 1 to 50 nm inclusive, a thin film transistor of a complete depletion type can be manufactured.

Figure 1B:
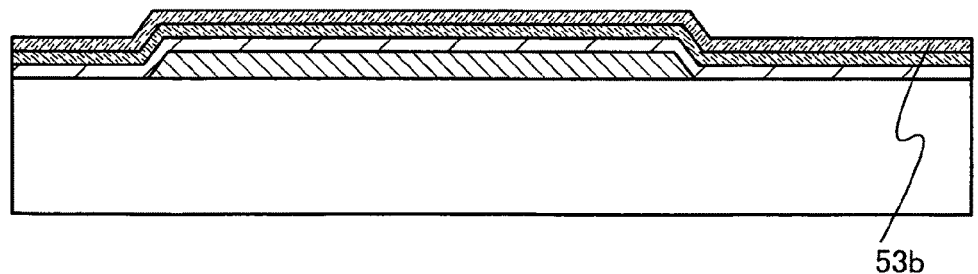
Figure 1C:
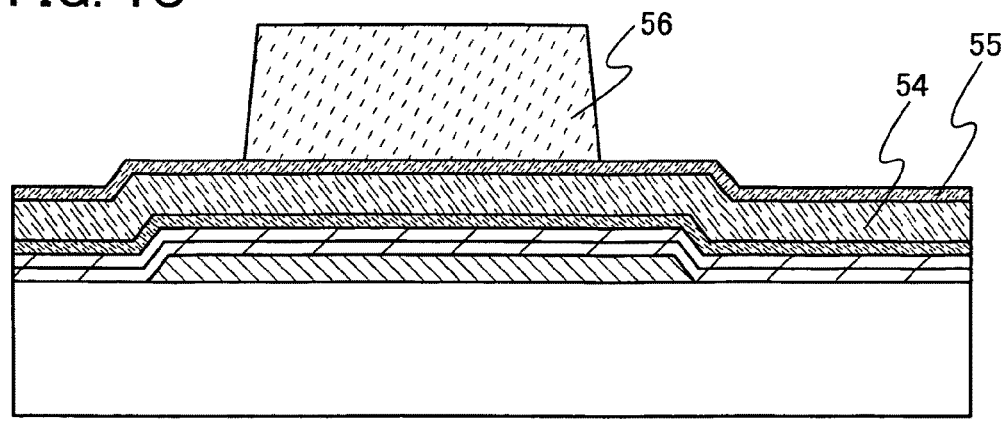

Next, as shown in FIG. 1C, the buffer layer 54 and a semiconductor film 55 to which an impurity element imparting one conductivity type is added (hereinafter, simply referred to as an "impurity semiconductor film 55") is formed over the LPSAS film 53b. Then, a resist mask 56 is formed over the impurity semiconductor film 55.

The buffer layer 54 can be formed by a plasma CVD method using silicon hydride such as SiH$_4$ or Si$_2$H$_6$. Further, as the buffer layer 54, an amorphous semiconductor film can also be formed using the above silicon hydride which is diluted with any one or plural elements of helium, argon, krypton, or neon. Furthermore, an amorphous semiconductor film including hydrogen can also be formed using hydrogen with a flow rate of 1 to 10 times, preferably 1 to 5 times as high as that of silicon hydride. Still furthermore, an amorphous semiconductor film including nitrogen can also be formed using the silicon hydride, and nitrogen or ammonia. Even furthermore, an amorphous semiconductor film including fluorine or chlorine can also be formed using the above silicon hydride, and a gas including fluorine or chlorine (e.g., F$_2$, Cl$_2$, HF, or HCl). Further, SiH$_2$Cl$_2$, SiHCl$_3$, SiCl$_4$, SiF$_4$, or the like can be used instead of silicon hydride.

Further, as the buffer layer 54, an amorphous semiconductor film can be formed by sputtering an amorphous semiconductor, which is a target, with hydrogen or a rare gas. At this time, if ammonia, nitrogen, or N$_2$O is included in the atmosphere, an amorphous semiconductor film including nitrogen can be formed. If a gas including fluorine, chlorine, bromine, or iodine (e.g., F$_2$, Cl$_2$, Br$_2$, I$_2$, HF, HCl, HBr, or HI) is included in the atmosphere, an amorphous semiconductor film including fluorine, chlorine, bromine, or iodine can be formed.

Furthermore, as the buffer layer 54, an amorphous semiconductor film may be formed on a surface of the LPSAS film 53b by a plasma CVD method or a sputtering method, and then an surface of the amorphous semiconductor film may undergo hydrogen plasma treatment, nitrogen plasma treatment, or halogen plasma treatment, to be hydrogenated, nitrided, or halogenated. Alternatively, the surface of the amorphous semiconductor film may be treated with helium plasma, neon plasma, argon plasma, krypton plasma, or the like.

It is preferable to form the buffer layer 54 using an amorphous semiconductor film which does not include a crystal grain. Therefore, if the buffer layer 54 is formed by a high-frequency plasma CVD method with a frequency of several tens of MHz to several hundreds of MHz, or a microwave plasma CVD method, it is preferable to control the film deposition conditions so that the buffer layer 54 may be an amorphous semiconductor film that does not include a crystal grain.

In a later process of forming a source region and a drain region, the buffer layer 54 can be etched partly. In such a case, it is preferable to form the buffer layer 54 with such a thickness that part of the buffer layer 54 can remain. Typically, it is preferable to form the buffer layer 54 with a thickness of from 30 to 500 nm inclusive, preferably from 50 to 300 nm inclusive. In a display device including a thin film transistor to which high voltage (e.g., about 15 V) is applied, typically in a liquid crystal display device, if the buffer layer 54 is formed to have a large thickness as shown above, resistance of the drain region to voltage is increased and concentration of an electric field in the buffer layer is reduced. Thus, deterioration of the thin film transistor can be reduced even when high voltage is applied to the thin film transistor.

It is preferable that an impurity element imparting one conductivity type, such as phosphorus or boron, be not added to the buffer layer 54. In particular, it is preferable that boron that is included in the LPSAS film 53b in order to control the threshold value, or phosphorus that is included in the semiconductor film to which an impurity element imparting one conductivity type is added be not mixed in the buffer layer 54. As a result, the thin film transistor is free from a region where leakage current is caused by a PN junction, whereby leakage current can be reduced. Further, when the amorphous semiconductor film to which an impurity element imparting one conductivity type, such as phosphorus or boron, is not added is formed between the semiconductor film to which an impurity element imparting one conductivity type is added and the LPSAS film 53b, impurities included in each of the LPSAS film 53b and the source and drain regions can be prevented from diffusing.

Formation of the amorphous semiconductor film or the amorphous semiconductor film including hydrogen, nitrogen, or halogen on the surface of the LPSAS film 53b can prevent a surface of a crystal grain included in the LPSAS film 53b from being oxidized naturally. In particular, a region where an amorphous semiconductor and the crystal grain are in contact with each other is easily cracked because of local stress. If a crack is exposed to oxygen, the crystal grain is oxidized to form silicon oxide. However, formation of the buffer layer 54 on the surface of the LPSAS film 53b can prevent the crystal grain from being oxidized. Further, formation of the buffer layer can prevent an etching residue which is left in forming the source and drain regions later from entering the LPSAS film 53b.

The buffer layer 54 is formed using an amorphous semiconductor film or an amorphous semiconductor film including hydrogen, nitrogen, or halogen. The amorphous semiconductor film has a large energy gap than the LPSAS film 53b (an energy gap of the amorphous semiconductor film is 1.6 to 1.8 eV, whereas an energy gap of the LPSAS film 53b is 1.1 to 1.5 eV), high resistance, and as low mobility as ⅕ to 1/10 of that of the LPSAS film 53b. Thus, in the thin film transistor that is completed later, the buffer layer formed between the source and drain regions and the LPSAS film 53b functions as a high resistant region, and the LPSAS film 53b functions as a channel formation region. Therefore, off current of the thin film transistor can be reduced. If the thin film transistor is used as a switching element of a display device, the display device can have an improved contrast.

It is preferable to form the buffer layer 54 at a temperature of 300 to 400° C. by a plasma CVD method after forming the LPSAS film 53b. This film formation treatment supplies hydrogen included in the buffer layer to the LPSAS film 53b, thereby providing the same effect as hydrogenation treatment for the LPSAS film 53b. That is to say, depositing the buffer layer 54 on the LPSAS film 53b can diffuse hydrogen into the LPSAS film 53b, thereby terminating a dangling bond.

If an n-channel thin film transistor is formed, the impurity semiconductor film 55 may be doped with phosphorus, which is a typical impurity element; for example, an impurity gas such as $PH_3$ may be added to silicon hydride. If a p-channel thin film transistor is formed, the impurity semiconductor film 55 may be doped with boron, which is a typical impurity element; for example, an impurity gas such as $B_2H_6$ may be added to silicon hydride. The impurity semiconductor film 55 can be formed using a microcrystalline semiconductor or an amorphous semiconductor. Further, the impurity semiconductor film 55 may be formed with a stacked layer of an amorphous semiconductor film to which an impurity element imparting one conductivity type is added and a microcrystalline semiconductor film to which an impurity element imparting one conductivity type is added. If the amorphous semiconductor film to which an impurity element imparting one conductivity type is added is formed on the buffer layer 54 side and the microcrystalline semiconductor film to which an impurity element imparting one conductivity type is added is formed thereon, resistance varies gradually throughout the film in a thickness direction; thus, carriers can flow smoothly and the mobility can be increased. The impurity semiconductor film 55 is formed with a thickness of from 2 to 50 nm inclusive. Reduction in the thickness of the impurity semiconductor film 55 can improve the throughput.

Figure 20:
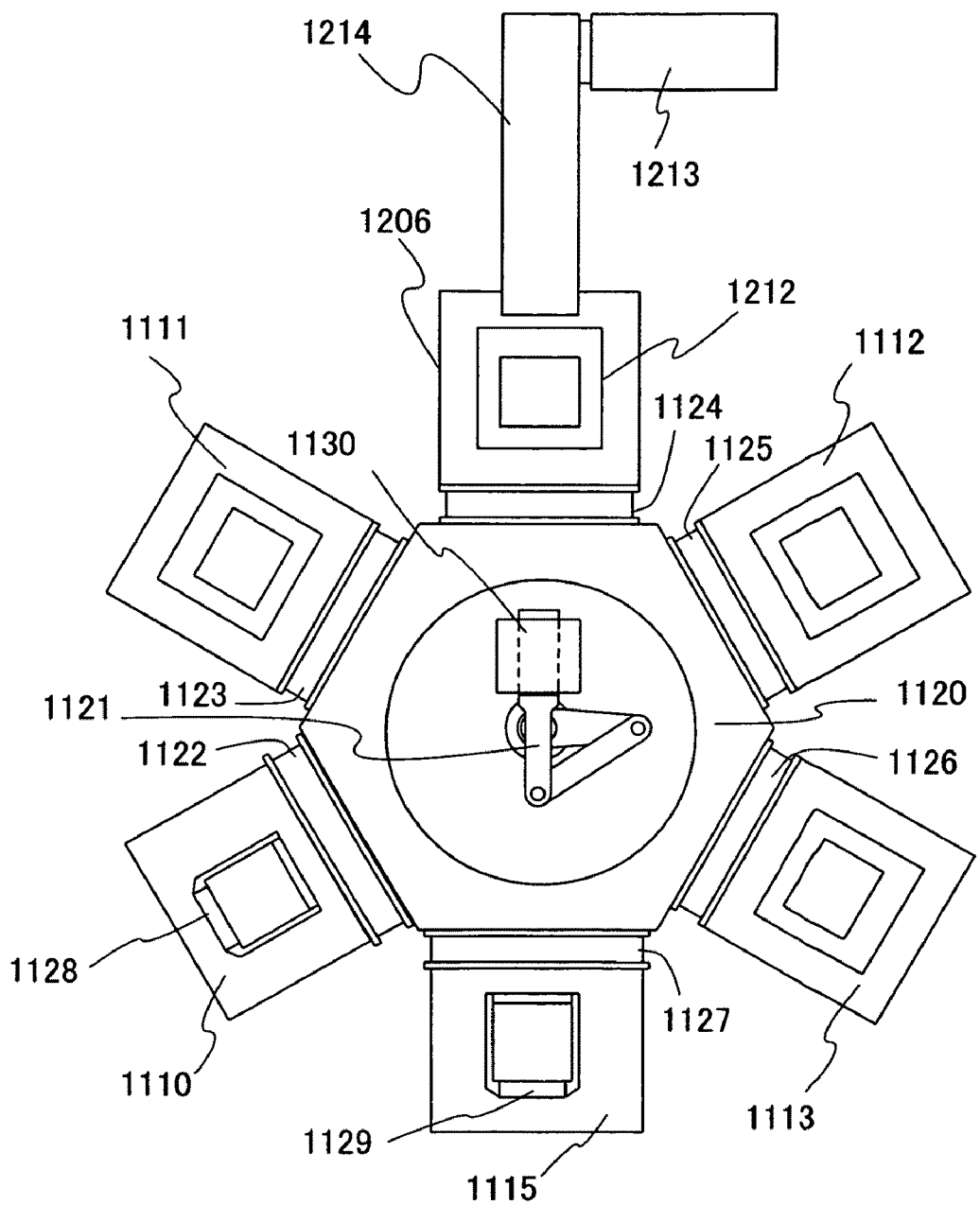
FIG. 20 is a top view illustrating a semiconductor manufacturing apparatus applicable to the present invention.

Next, a multi-chamber semiconductor manufacturing apparatus that is capable of forming the gate insulating films 52a to 52b to the impurity semiconductor film 55 without exposing the films to the atmosphere is shown with reference to FIG. 20. Preferably, at least the gate insulating films 52a and 52b and the microcrystalline semiconductor film 53a are formed successively. Further, if a step of forming the gate insulating films 52a and 52b and the microcrystalline semiconductor film 53a, a laser irradiation step of the microcrystalline semiconductor film 53a, and a formation step of the buffer layer 54 are carried out successively without exposing the films and the layer to air, the films and the layer can be formed without any contamination of the interfaces with an atmospheric component or impurity elements in the atmosphere, and thus variations in characteristics of the thin film transistors can be reduced.

FIG. 20 is a schematic top view of the multi-chamber semiconductor manufacturing apparatus. A common chamber 1120 is provided around with a load chamber 1110, an unload chamber 1115, reaction chambers (1) 1111 to (3) 1113, and a laser irradiation chamber 1206. Gate valves 1122 to 1127 are provided between the common chamber 1120 and each reaction chamber so that treatment in each reaction chamber does not have influence on treatment in other chambers. The laser irradiation chamber 1206 is provided with an optical system 1214 and a laser oscillator 1213. Substrates are set in a cassette 1128 of the load chamber 1110 and a cassette 1129 of the unload chamber 1115, respectively, and transferred to the reaction chambers (1) 1111 to (3) 1113 by a transfer unit 1121 of the common chamber 1120. This apparatus can allocate the films to be stacked to their respective reaction chambers according to the kind of the film, and a plurality of different films can be formed successively without being exposed to the atmosphere.

As an example of the laser oscillator 1213 and the optical system 1214, a mode thereof in which a linear laser beam can be emitted is shown with reference to FIGS. 21A and 21B.

The laser oscillator 1213 shown in FIG. 20 corresponds to the laser oscillator 401 in FIGS. 21A and 21B. The optical system 1214 in FIG. 20 corresponds to a beam expander 402, a beam homogenizer 403, a beam homogenizer 405, a cylindrical lens 406, a doublet cylindrical lens 407, and a slit 408 in FIGS. 21A and 21B. A substrate 50 shown in FIGS. 21A and 21B are placed on a stage 1212 of the laser irradiation chamber 1206 shown in FIG. 20. Further, a heating unit for heating the substrate 50 may be provided for the stage 1212.

FIG. 21A is a side view of the optical system that can emit a linear laser beam. FIG. 21B is an elevation view of the optical system that can emit a liner laser beam.

As shown in FIGS. 21A and 21B, a laser beam 400 that is emitted from the laser oscillator 401 is expanded in the length (the length in a direction of a major axis) and the width (the length in a direction of a minor axis) by the beam expander 402. The beam expander includes a spherical surface lens 402a whose surface on the laser oscillator 401 side is concave, and a spherical surface lens 402b whose surface on the laser oscillator 401 side is convex.

After the laser beam passes through the beam expander 402, energy in the major axis direction of the laser beam is homogenized by the beam homogenizer 403. The beam homogenizer 403 includes a cylindrical lens array 403a whose surface on the laser oscillator 401 side is convex, a cylindrical lens array 403b whose surface on the laser oscillator 401 side is convex, and a cylindrical lens 404 whose surface on the laser oscillator 401 side is convex. The laser beam is divided and homogenized in the major axis direction by the cylindrical lens arrays 403a and 403b.

After the laser beam passes through the beam homogenizer 403, energy of the laser beam in the minor axis is homogenized by the beam homogenizer 405. The beam homogenizer 405 includes a cylindrical lens array 405a whose surface on the laser oscillator 401 side is concave, a cylindrical lens array 405b whose surface on the laser oscillator 401 side is convex, and a cylindrical lens 406 whose surface on the laser oscillator 401 side is convex. The laser beam is divided in the minor axis direction by the cylindrical lens arrays 405a and 405b. Further, the energy of the laser beam is homogenized by the cylindrical lens 406.

The position of the beam homogenizer 403, which homogenizes the energy of the laser beam in the major axis direction, and the position of the beam homogenizer 405, which homogenizes the energy of the laser beam in the minor axis direction, can be exchanged.

After the laser beam passes through the beam homogenizer 405, the laser beam is condensed with the doublet cylindrical lens 407. As a result, a microcrystalline semiconductor film formed over the substrate 50 can be irradiated with a rectangular or linear laser beam. The doublet cylindrical lens 407 includes a cylindrical lens 407a whose surface on the laser oscillator 401 side is convex and that on the substrate 50 side is concave, and a cylindrical lens 407b whose surface on the laser oscillator 401 side is convex and that on the substrate 50 side is also convex.

It is preferable to provide the slit 408 between the substrate 50 and the doublet cylindrical lens 407 because end portions of the laser beam in the major axis direction have energy distribution with low uniformity. The slit enables the microcrystalline semiconductor film over the substrate 50 to be irradiated with a laser beam with highly uniform energy in which the end portions of the laser beam in the major axis direction are cut out. It is preferable to form the slit 408 in as close region as possible to the substrate 50 so that the laser beam may not enter a back side of the slit.

An optical system for changing an optical path of the laser beam emitted from the laser oscillator 401, typically a mirror, can be provided between the laser oscillator 401 and the substrate 50.

After forming the gate insulating film 52a, the gate insulating film 52b, and the microcrystalline semiconductor film 53a in each of the reaction chambers (1) to (3), the substrates are moved to the laser irradiation chamber 1206. Subsequently, in the laser irradiation chamber 1206, the microcrystalline semiconductor film 53a is irradiated with a laser beam that is emitted from the laser oscillator 1213 and is processed with the optical system 1214 to have arranged energy distribution and beam form, whereby the LPSAS film 53b is formed. Next, the substrates are moved to the reaction chambers (1) to (3), respectively, and the buffer layer 54 and the impurity semiconductor film 55 are stacked over the LPSAS film 53b. At this time, plural kinds of films can be stacked successively by changing source gases. At this time, after forming the gate insulating film, silicon hydride such as silane is introduced into the reaction chamber, whereby an oxygen residue and the silicon hydride react with each other; and then a reactant is discharged to an outside of the reaction chamber; thus, the concentration of the oxygen residue in the reaction chamber can be reduced. As a result, the concentration of oxygen in the microcrystalline semiconductor film can be reduced. Further, a crystal grain in the microcrystalline semiconductor film can be prevented from being oxidized.

Alternatively, the gate insulating films 52a and 52b and the microcrystalline semiconductor film 53a are formed successively in the reaction chamber (1) or (2), and the substrate is moved to the laser irradiation chamber 1206. Subsequently, in the laser irradiation chamber 1206, the microcrystalline semiconductor film 53a is irradiated with a laser beam, whereby the LPSAS film 53b is formed. Next, the substrate is moved to the reaction chambers (1) and (2), and the buffer layer 54 is formed over the LPSAS film 53b. Then, the substrate is moved to the reaction chamber (3), and the impurity semiconductor film 55 is formed therein. Separate formation of only the semiconductor film to which an impurity element imparting one conductivity type is added can prevent the impurity which remains in the chamber from entering another film.

In this manner, with use of the semiconductor manufacturing apparatus in which the plurality of chambers are connected, the gate insulating films 52a and 52b, the microcrystalline semiconductor film 53a, the buffer layer 54, and the impurity semiconductor film 55 can be formed at the same time, so that the mass productivity can be enhanced. Further, also when some reaction chamber is being subjected to maintenance or cleaning, the films can be formed in other reaction chambers, and the films can be formed over the substrates efficiently. In addition, the films can be formed without any contamination of the interface with atmospheric components or impurity elements included in the atmosphere; thus, variations in characteristics of the thin film transistors can be reduced.

Alternatively, it is possible to form the gate insulating films 52a and 52b in the reaction chamber (1), form the microcrystalline semiconductor film 53a in the reaction chamber (2), irradiate the microcrystalline semiconductor film 53a with a laser beam to form the LPSAS film 53b in the laser irradiation chamber 1206, form the buffer layer 54 in the reaction chamber (2), and form the impurity semiconductor film 55 in the reaction chamber (3).

Alternatively, if the gate insulating film 52a is formed using a silicon nitride film or a silicon nitride oxide film, and the gate insulating film 52b is formed using a silicon oxide film or a silicon oxynitride film, four reaction chambers may be provided; the silicon nitride film or the silicon nitride oxide film may be formed as the gate insulating film 52a in the reaction chamber (1); the silicon oxide film or the silicon oxynitride film may be formed as the gate insulating film 52b in the reaction chamber (2); the microcrystalline semiconductor film 53a may be formed in the reaction chamber (3); the microcrystalline semiconductor film 53a may be irradiated with a laser beam to form the LPSAS film 53b in the laser irradiation chamber 1206; the buffer layer 54 may be formed in the reaction chamber (3); and the impurity semiconductor film 55 may be formed in a reaction chamber (4).

Further alternatively, five reaction chambers may be provided and microcrystalline semiconductor films may be formed in the plurality of reaction chambers because deposition of a microcrystalline semiconductor film takes time. For example, the gate insulating films 52a and 52b may be formed in the reaction chamber (1); the microcrystalline semiconductor film 53a may be formed in the reaction chambers (2) and (3); the buffer layer 54 may be formed in the reaction chamber (4); and the impurity semiconductor film 55 may be formed in a reaction chamber (5).

By forming the microcrystalline semiconductor film 53a in a plurality of reaction chambers at the same time in this manner, throughput can be improved.

With use of the semiconductor manufacturing apparatus having such a structure, similar kinds of films or one kind of film can be formed in their respective reaction chambers, and the films can be formed successively without being exposed to the atmosphere. Thus, the films can be formed without any contamination of each interface with a residue of another film which has already been formed or impurity elements included in the atmosphere.

Before forming the microcrystalline semiconductor film 53a with use of the semiconductor manufacturing apparatus, the reaction chamber may be subjected to cleaning and flushing (washing) treatment (e.g., hydrogen flushing in which hydrogen is used as a flushing substance, or silane flushing in which silane is used as a flushing substance). The flushing treatment can prevent impurities such as oxygen, nitrogen, or fluorine in the reaction chamber from contaminating the film to be deposited.

The flushing treatment can remove impurities such as oxygen, nitrogen, or fluorine in the reaction chamber. For example, silane flushing treatment is performed, using monosilane as a flushing substance, by introducing a gas into the reaction chamber at a flow rate of 8 to 10 SLM for 5 to 20 minutes, preferably 10 to 15 minutes. 1 SLM is equal to 0.06 $m^3/h$.

The cleaning can be performed with fluorine radicals, for example. Fluorine radicals can clean the inside of the reaction chamber by introducing carbon fluoride, nitrogen fluoride, or fluorine into a plasma generator provided for an outside of the reaction chamber, dissociating the introduced substance, and introducing the generated fluorine radicals into the reaction chamber.

The flushing treatment may be performed before forming the gate insulating film, the buffer layer, and the semiconductor film to which an impurity element imparting one conductivity type is added. Note that the flushing treatment is effective if performed after the cleaning treatment.

Before taking a substrate into the reaction chamber and forming a film thereover, a protective film may be formed on an inner wall of each reaction chamber using the same kind of film as that to be deposited, to perform coating (also referred to as precoating treatment). In the precoating treatment, a film formation gas is fed into a reaction chamber and plasma treatment is performed, thereby coating the inside of the reaction chamber with a thin protective film. For example, before forming a microcrystalline silicon film as the microcrystalline semiconductor film, the inside of the reaction chamber may be covered with am amorphous silicon film with a thickness of from 0.2 to 0.4 μm to perform precoating treatment. Flushing treatment (e.g., hydrogen flushing or silane flushing) may be performed after the precoating treatment. If the cleaning treatment and the precoating treatment is performed, the substrate needs to be taken out of the reaction chamber. However, if only the flushing treatment (e.g., hydrogen flushing or silane flushing) is performed, the substrate may be left in the treatment chamber because plasma treatment is not performed.

If a protective film formed of an amorphous semiconductor film is formed in the reaction chamber for forming the microcrystalline semiconductor film, and hydrogen plasma treatment is performed before forming the microcrystalline semiconductor film, the protective film is etched and a slight amount of semiconductor is deposited over the substrate, thereby serving as a nucleus of crystal growth.

Further, the precoating treatment can prevent an impurity element such as oxygen, nitrogen, or fluorine remaining in the reaction chamber from entering and contaminating the film to be deposited.

The precoating treatment may also be performed before forming the gate insulating film and the semiconductor film to which an impurity element imparting one conductivity type is added.

Although the semiconductor manufacturing apparatus in FIG. 20 is provided with the load chamber and the unload chamber separately, a load chamber and an unload chamber may be combined and a load/unload chamber may be provided. In addition, the semiconductor manufacturing apparatus may be provided with a spare chamber. By pre-heating the substrate in the spare chamber, it is possible to shorten heating time before formation of the film in each reaction chamber, so that the throughput can be improved.

The resist mask 56 shown in FIG. 1C is formed by a photolithography technique or an inkjet method. Here, using a second photomask, the resist mask 56 is formed by exposing a resist that is applied over the impurity semiconductor film 55 to light and developing the resist.

Figure 2A:
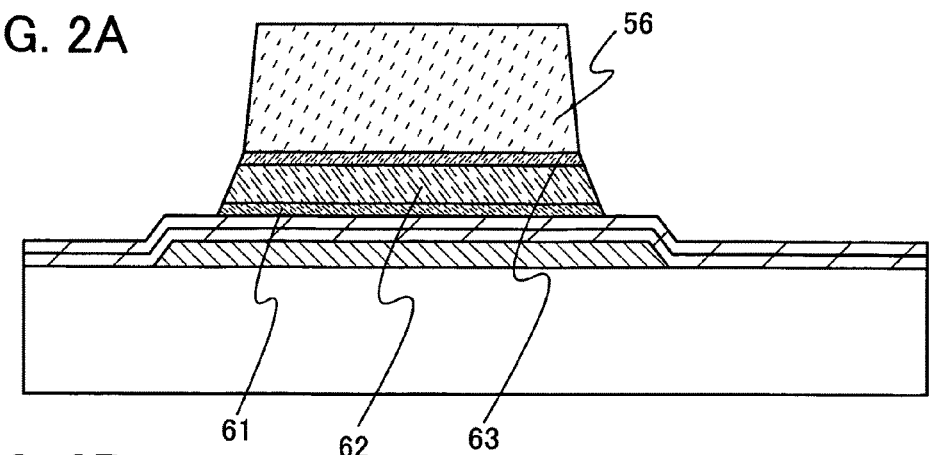
FIGS. 2A to 2C are cross-sectional views illustrating a method for manufacturing a display device of the present invention.
Figure 2B:
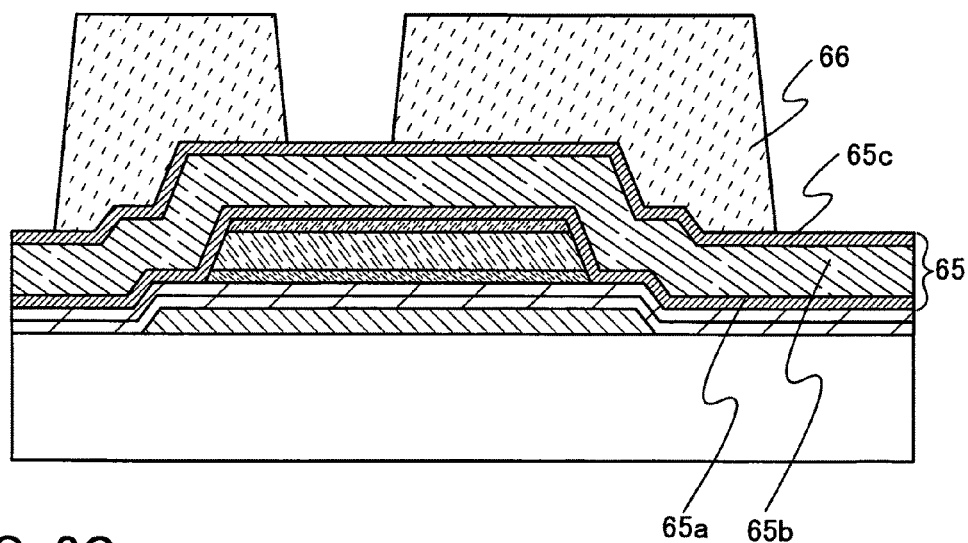

Subsequently, the LPSAS film 53b, the buffer layer 54, and the impurity semiconductor film 55 are etched to be separated using the resist mask 56, whereby an LPSAS film 61, a buffer layer 62, and a semiconductor film 63 to which an impurity element imparting one conductivity type is added (hereinafter simply referred to as an "impurity semiconductor film 63") are formed as shown in FIG. 2A. After that, the resist mask 56 is removed. FIG. 2B corresponds to a cross-sectional view taken along a line A-B in FIG. 4A.

If the LPSAS film 61 and the buffer layer 62 have inclined end side portions, source and drain regions, which are formed over the buffer layer 62, and the LPSAS film 61 can be formed with a longer distance, thereby reducing leakage current which is generated between the source and drain regions and the LPSAS film 61. Further, leakage current which is generated between source and drain electrodes and the LPSAS film 61 can be reduced. A preferred inclination angle of an end side portion of the LPSAS film 61 and the buffer layer 62 is 30° to 90°, preferably 45° to 80°. The end side portion with such an angle can prevent the source electrode or the drain electrode from being disconnected owing to a step form.

Next as shown in FIG. 2B, conductive films 65a to 65c are formed over the impurity semiconductor film 63 and the gate insulating film 52b, and then resist masks 66 are formed over the conductive films 65a to 65c. The conductive films 65a to 65c are preferably formed with a single layer or stacked layers using aluminum; copper; or an aluminum alloy to which an element which prevents hillocks or an element to improve heat-resistance property, such as silicon, titanium, neodymium, scandium, or molybdenum, is added. Alternatively, a film in contact with the semiconductor film to which an impurity element imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure. This embodiment mode shows the conductive film having a three-layer structure of the conductive films 65a to 65c; and a stacked-layer structure in which the conductive films 65a and 65c are formed using molybdenum films and the conductive film 65b is formed using an aluminum film, or a stacked-layer structure in which the conductive films 65a and 65c are formed using titanium films and the conductive film 65b is formed using an aluminum film is formed. The conductive films 65a to 65c are formed by a sputtering method or a vapor deposition method.

The resist masks 66 can be formed in a similar manner to the resist mask 56.

Figure 2C:
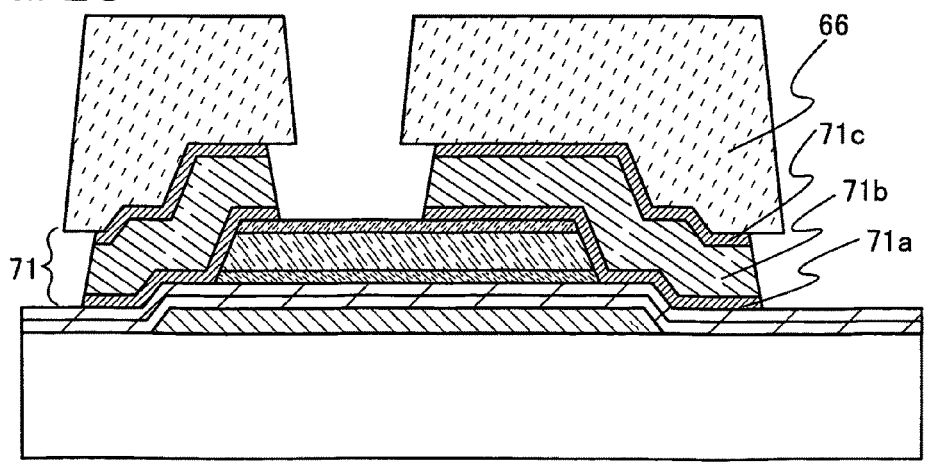

Next as shown in FIG. 2C, part of the conductive films 65a to 65c is etched to form a pair of source electrodes and drain electrodes 71a to 71c. Here, the conductive films 65a to 65c are wet-etched using the resist masks 66 that is formed by a photolithography process using a third photomask, so that the conductive films 65a to 65c are etched isotropically. Thus, the source and drain electrodes 71a to 71c with a smaller area than that of the resist masks 66 can be formed.

Figure 3A:
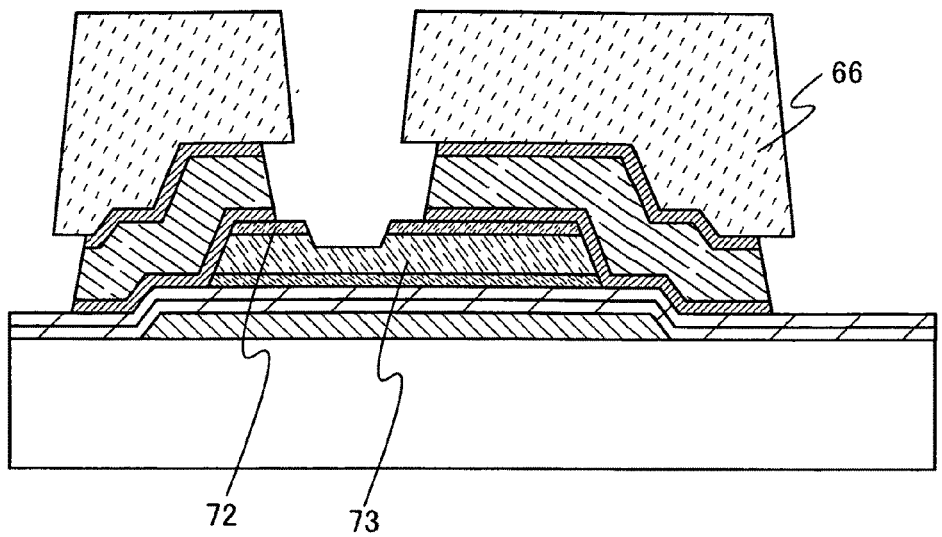
FIGS. 3A to 3C are cross-sectional views illustrating a method for manufacturing a display device of the present invention.

Next as shown in FIG. 3A, the impurity semiconductor film 63 is etched to be separated using the resist masks 66. As a result, a pair of source and drain regions 72 can be formed as shown in FIG. 3A. In this etching process, part of the buffer layer 62 is also etched. The buffer layer which is etched partly and has a recessed portion (a groove) is referred to as a buffer later 73. The source and drain regions and the recessed portion (the groove) of the buffer layer can be formed in the same process. The recessed portion (the groove) of the buffer layer is formed with a depth which is ½ to ⅓ of the largest thicknesses of the buffer layer, so that the source and drain regions can be separated from each other with a longer distance; thus, leakage current between the source and drain regions can be reduced. After that, the resist masks 66 are removed.

Figure 4A:
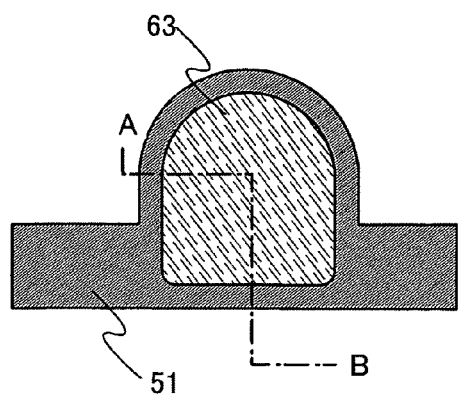
FIGS. 4A to 4C are top views illustrating a method for manufacturing a display device of the present invention.
Figure 4B:
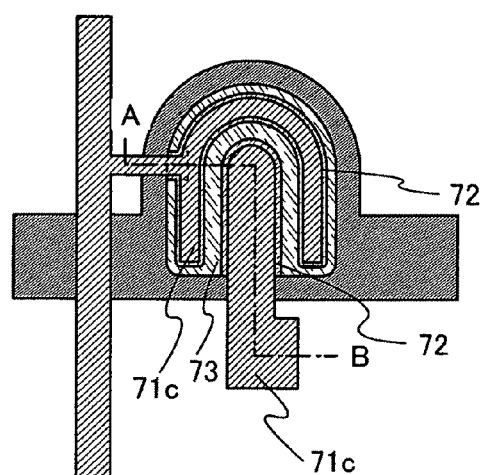
Figure 4C:
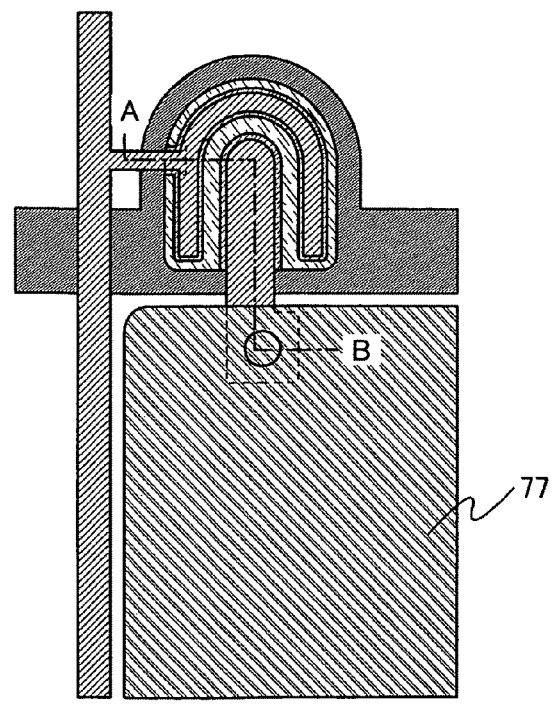

FIG. 3A corresponds to a cross-sectional view taken along a line A-B in FIG. 4B. As shown in FIG. 4B, end portions of the source and drain regions 72 are located outer side than those of the source and drain electrodes 71c. Further, end portions of the buffer layer 73 are located outer side than those of the source and drain electrodes 71c and those of the source and drain regions 72. Furthermore, one of the source and the drain electrodes surrounds the other source or drain electrode (specifically, the former electrode is in a U-shape or a C-shape). Therefore, the area of a region where carriers travel can be increased; and thus the amount of current can be increased, and the area of the thin film transistor can be reduced. Further, the coverage of the gate insulating film with the LPSAS film can be improved and generation of leakage current can be suppressed because the LPSAS film is formed with a smaller top area than that of the gate electrode, and the microcrystalline semiconductor film and the source and drain electrodes overlap with each other over the gate electrode. Either the source electrode or the drain electrode also functions as a source wiring or a drain wiring.

Figure 3B:
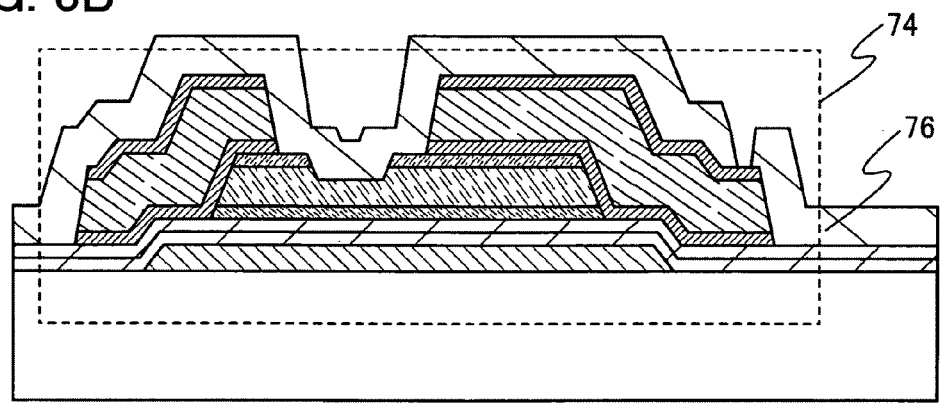

As shown in FIG. 3B, the end portions of the source and drain electrodes 71a to 71c are not aligned with those of the source and drain regions 72, whereby the distance between the end portions of the source and drain electrodes 71a to 71c can be long; thus, leakage current or short circuit between the source and drain electrodes can be prevented. Accordingly, a thin film transistor with high reliability and high resistance to voltage can be manufactured.

Through the above process, a channel-etched thin film transistor 74 can be formed.

In the thin film transistor shown in this embodiment mode, the gate insulating film, the LPSAS film, the buffer layer, the source and drain regions, and the source and drain electrodes are stacked over the gate electrode, and the surface of the LPSAS film, which functions as the channel formation region, is covered with the buffer layer. Further, part of the buffer layer is provided with the recessed portion (the groove), and other regions than the recessed portion are covered with the source region and the drain region. That is to say, the source and drain regions have a longer distance therebetween owing to the recessed portion formed in the buffer layer, and thus leakage current between the source and drain regions can be reduced. Further, part of the buffer layer is etched to form the recessed portion, whereby an etching residue generated in a process of forming the source and drain regions can be removed. Thus, generation of leakage current (parasitic channel) due to the residue between the source and drain regions can be reduced.

Further, the buffer layer is formed between the LPSAS film, which functions as the channel formation region, and the source and drain regions. Furthermore, the surface of the LPSAS film is covered with the buffer layer. The buffer layer, which is formed using a film with high resistance, is also located between the LPSAS film and the source and drain regions, and thus leakage current in the thin film transistor can be reduced, and further, deterioration of the thin film transistor due to application of high voltage can be reduced. Furthermore, the amorphous semiconductor film is formed as the buffer layer on the surface of the LPSAS film, which prevents the LPSAS film from being oxidized, and prevents an etching residue generated in a process of forming the source and drain regions from entering the LPSAS film. Thus, the thin film transistor can have excellent electric characteristics and excellent resistance to voltage.

The end portions of the source and drain electrodes are not aligned with the end portions of the source and drain regions, whereby the distance between the end portions of the source and drain electrodes can be long; thus, leakage current or short circuit between the source and drain electrodes can be prevented.

Next as shown in FIG. 3B, an insulating film 76 is formed over the source and drain electrodes 71a to 71c, the source and drain regions 72, the buffer layer 73, the LPSAS film 61, and the gate insulating film 52b. The insulating film 76 can be formed in a similar manner to the gate insulating films 52a and 52b. The insulating film 76 is provided to prevent contamination impurities such as organic substances, metals, or moisture included in the atmosphere from entering, and is preferably a dense film. By formation of the insulating film 76 using a silicon nitride film, the oxygen concentration in the buffer layer 73 can be set to be $5 \times 10^{19}$ atoms/cm$^3$ or less, preferably $1 \times 10^{19}$ atoms/cm$^3$ or less.

Figure 3C:
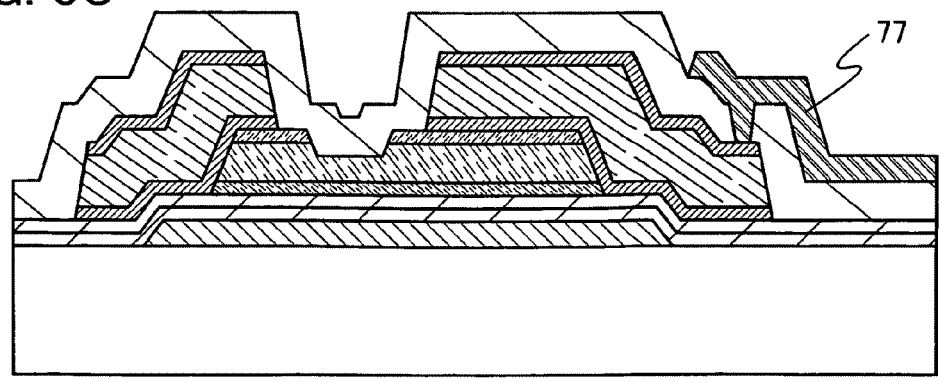

Next, a contact hole is formed in the insulating film 76 by partly etching the insulating film 76 using a resist mask formed using a fourth photomask. Then, a pixel electrode 77 that is in contact with the source or drain electrode 71c in the contact hole is formed. FIG. 3C corresponds to a cross-sectional view taken along a line A-B in FIG. 4C.

The pixel electrode 77 can be formed of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Further, the pixel electrode 77 can be formed of a conductive composition including a conductive high molecule (also referred to as a conductive polymer). It is preferable that a pixel electrode formed using a conductive composition have sheet resistance of 10000 O/square or less, and light transmittance of greater than or equal to 70% at a wavelength of 550 nm. Further, it is preferable that a conductive high molecule included in a conductive composition have resistance of less than or equal to 0.1 O·cm.

As a conductive high molecule, so-called a "π electron conjugated conductive high molecule" can be used. For example, polyaniline or a derivative thereof, polypyrrole or a derivative thereof, polythiophene or a derivative thereof, or a copolymer of two or more kinds of these materials can be given.

In this example, an ITO film is formed as the pixel electrode 77 by a sputtering method, and then a resist is applied to the ITO film. Subsequently, the resist is exposed to light and developed using a fifth photomask, thereby forming a resist mask. Then, the ITO film is etched using the resist mask to form the pixel electrode 77.

In the above manner, an element substrate which can be used for a display device can be formed.

Next, another method for forming a thin film transistor, which is different from the above mode, is described with reference to FIGS. 5A to 5C, FIGS. 6A to 6C, FIGS. 7A and 7B, and FIGS. 8A to 8D. Hereinafter, a mode in which source and drain electrodes and source and drain wirings are formed using different films is shown.

Figure 5A:
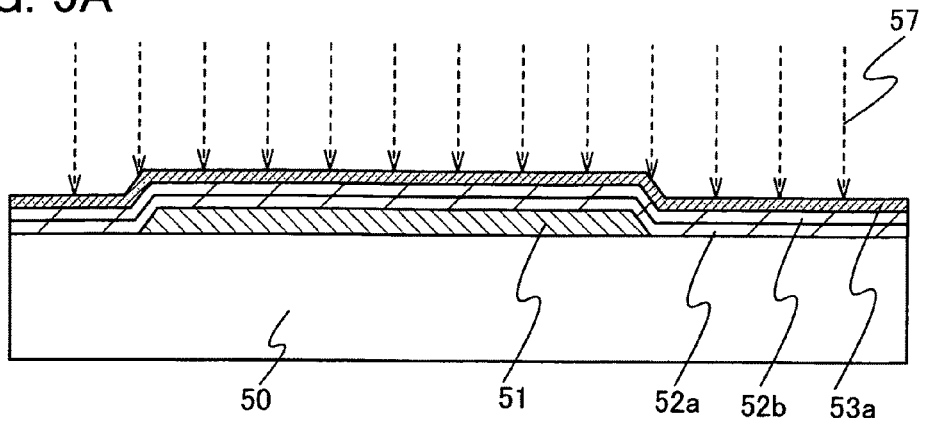
FIGS. 5A to 5C are cross-sectional views illustrating a method for manufacturing a display device of the present invention.
Figure 5B:
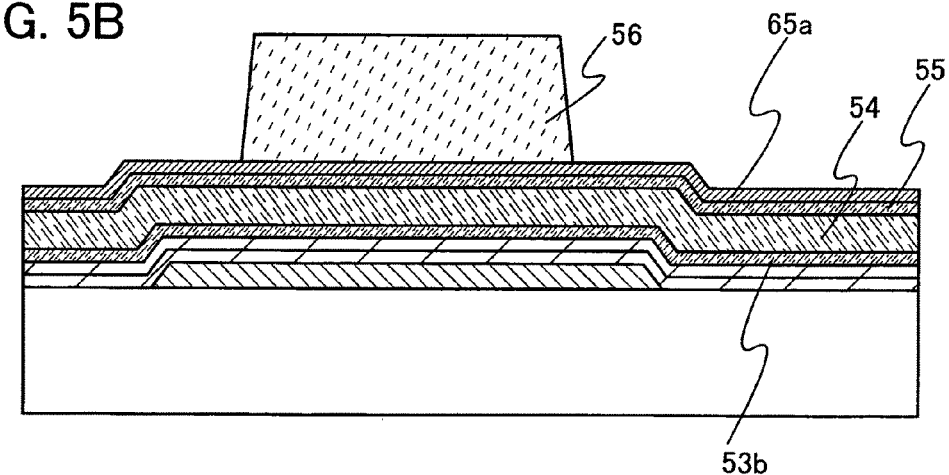

As shown in FIG. 5A, a gate electrode 51 is formed over a substrate 50. Subsequently, gate insulating films 52a and 52b and a microcrystalline semiconductor film 53a are formed in this order over the gate electrode 51. Then, the microcrystalline semiconductor film 53a is irradiated with a laser beam 57, thereby forming an LPSAS film 53b as shown in FIG. 5B. Next, a buffer layer 54, a semiconductor film 55 to which an impurity element imparting one conductivity type is added (hereinafter simply referred to as an "impurity semiconductor film 55"), and a conductive film 65a are formed in this order over the LPSAS film 53b. Then, a resist mask 56 is formed over the conductive film 65a.

Figure 5C:
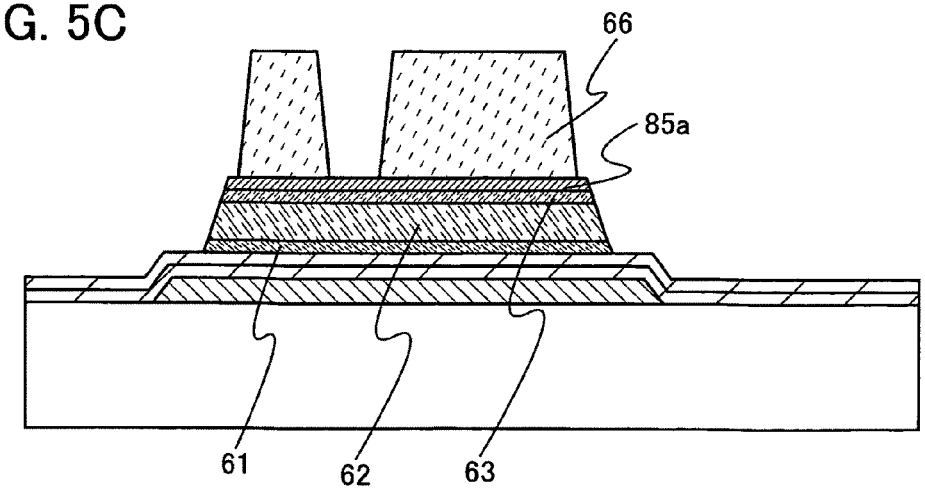

Subsequently, the LPSAS film 53b, the buffer layer 54, the impurity semiconductor film 55, and the conductive film 65a are etched to be separated using the resist mask 56, and then the resist mask 56 is ashed and removed. As a result, an LPSAS film 61, a buffer layer 62, a semiconductor film 63 to which an impurity element imparting one conductivity type is added (hereinafter simply referred to as an "impurity semiconductor film 63"), and a conductive film 85a are formed as shown in FIG. 5C. FIG. 5C corresponds to a cross-sectional view taken along a line A-B in FIG. 8A (although resist masks 66 are not illustrated in FIGS. 8A to 8D).

Figure 6A:
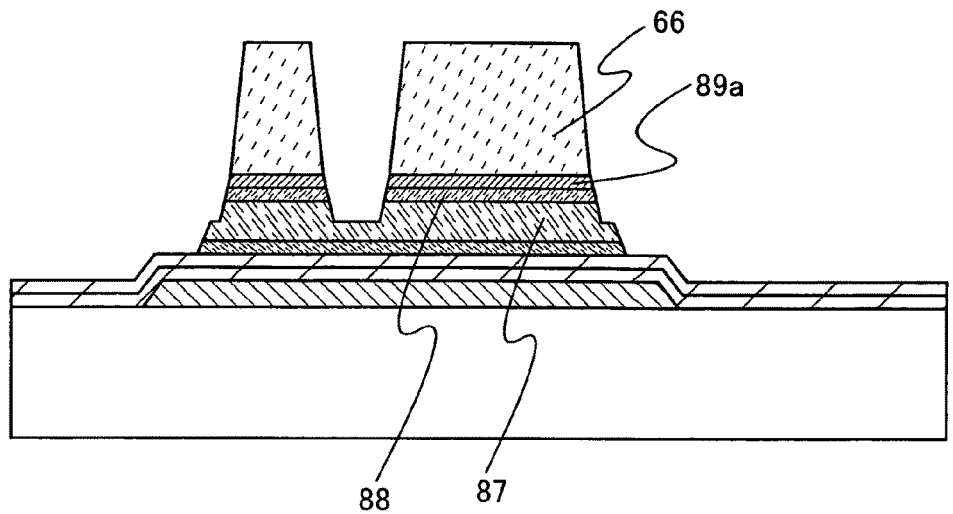
FIGS. 6A to 6C are cross-sectional views illustrating a method for manufacturing a display device of the present invention.

Next, a resist is applied over the conductive film 85a, and then is exposed to light and developed using a third photomask, thereby forming the resist masks 66. Subsequently, the impurity semiconductor film 63 and the conductive film 85a are etched to be separated using the resist masks 66. As a result, a pair of conductive films 89a and a pair of source and drain regions 88 can be formed as shown in FIG. 6A. In the etching process, part of the buffer layer 62 is also etched. The buffer layer which is etched partly is referred to as a buffer layer 87. Here, part of end portions of the buffer layer 87 is located outer side than those of the conductive film 89a.

If the impurity semiconductor film 63 and the conductive film 85a are dry-etched, part of the conductive film 89a may be etched using the resist masks 66 to form source and drain electrodes 79a. End portions of the source and drain electrodes 79a are not aligned with those of the source and drain regions 88. If the conductive film 85a is wet-etched, the end portions of the source and drain electrodes 79a are not aligned with those of the source and drain regions 88 even if the above process is not performed. As a result, the source and drain electrodes 79a with a smaller area than that of the conductive film 89a are formed.

Figure 6B:
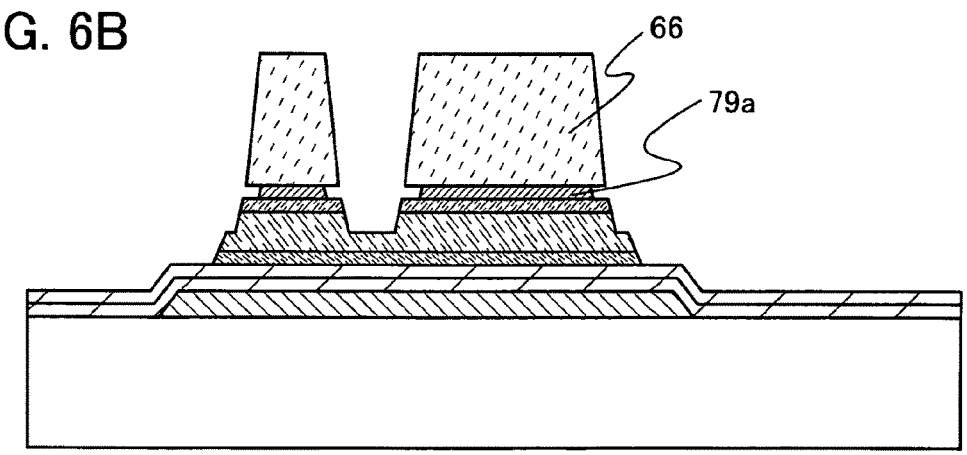
Figure 8A:
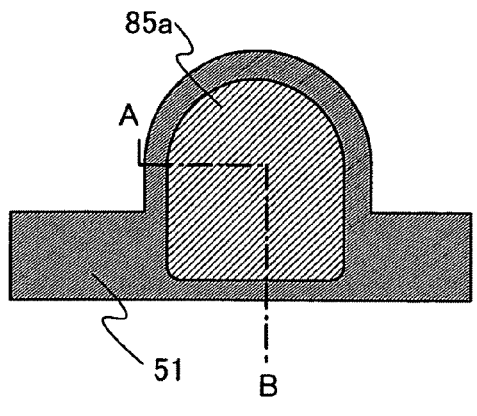
FIGS. 8A to 8D are top views illustrating a method for manufacturing a display device of the present invention.
Figure 8B:
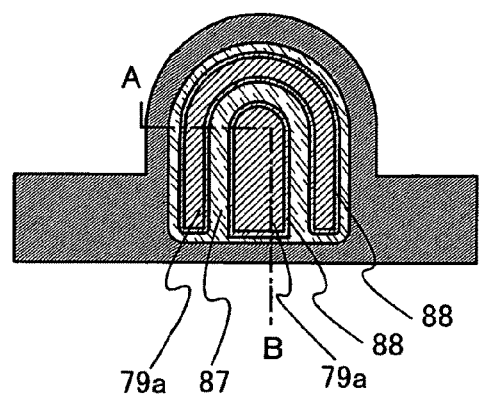
Figure 8C:
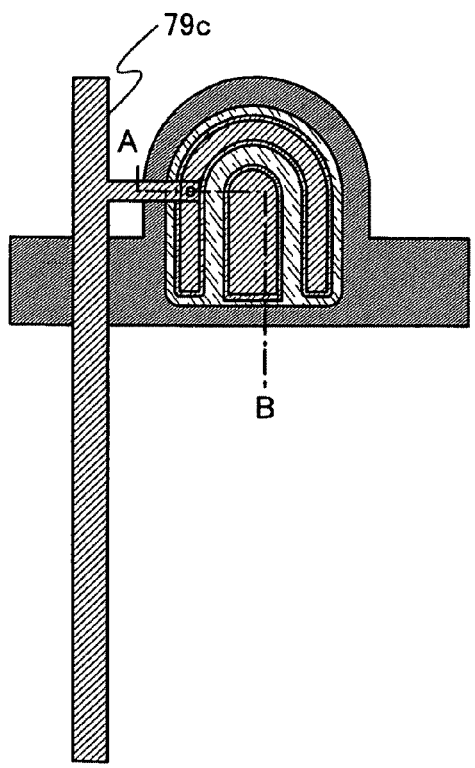
Figure 8D:
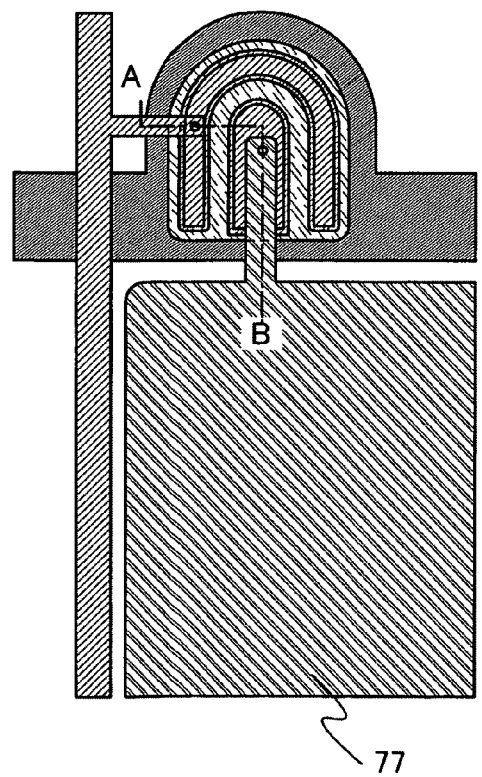

After that, the resist masks 66 are removed. FIG. 6B corresponds to a cross-sectional view taken along a line A-B in FIG. 8B. As shown in FIG. 8B, the end portions of the source and drain regions 88 are located outer side than those of the source and drain electrodes 79a. Further, the end portions of the buffer layer 87 are located outer side than those of the source and drain electrodes 79a and those of the source and drain regions 88. Furthermore, the source and drain electrodes 79a are separated from each other, and are not connected to an electrode which is formed in an adjacent pixel.

As shown in FIG. 6B, the end portions of the source and drain electrodes 79a are not aligned with those of the source and drain regions 88, whereby the distance between the end portions of the source and drain electrodes 79a can be long; thus, leakage current or short circuit between the source and drain electrodes can be prevented. Accordingly, a thin film transistor with high reliability and high resistance to voltage can be manufactured.

Figure 6C:
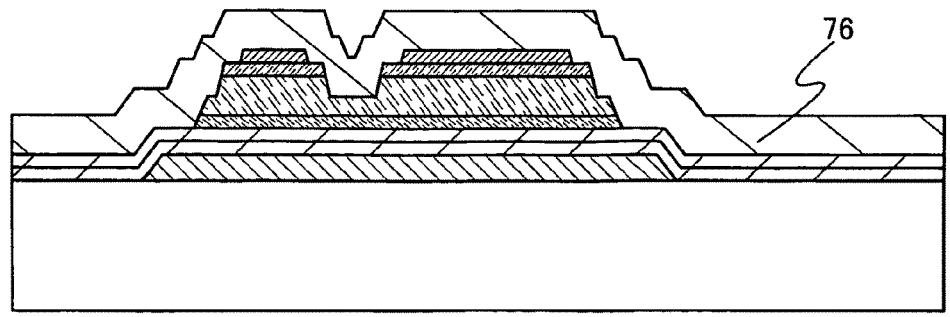

Next as shown in FIG. 6C, an insulating film 76 is formed over the source and drain electrodes 79a, the source and drain regions 88, the buffer layer 87, and the gate insulating film 52b. The insulating film 76 can be formed in a similar manner to the gate insulating films 52a and 52b.

Figure 7A:
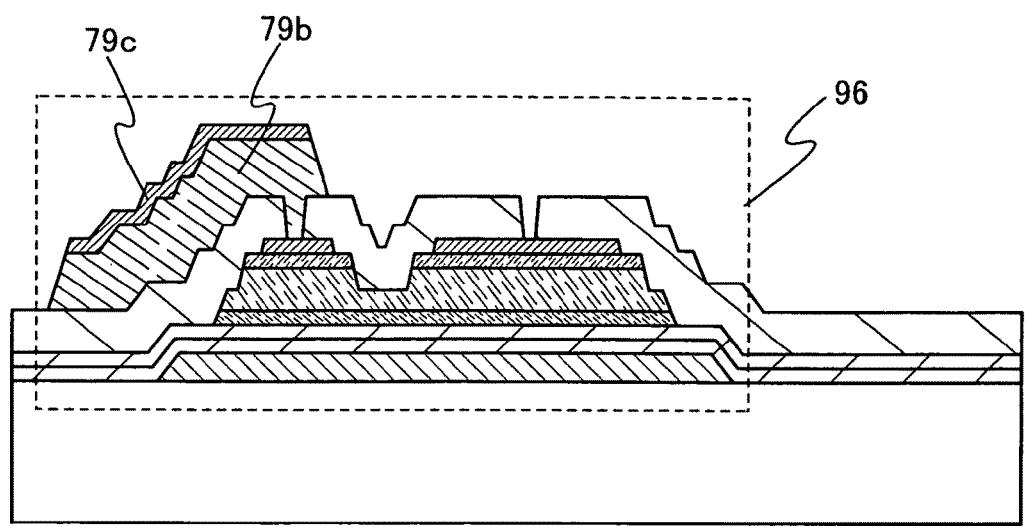
FIGS. 7A and 7B are cross-sectional views illustrating a method for manufacturing a display device of the present invention.

Next as shown in FIG. 7A, a resist is applied to the insulating film 76, and then is exposed to light and developed using a fourth photomask, thereby forming a resist mask. Part of the insulating film 76 is etched using the resist mask, so that contact holes are formed. A wiring 79b that is in contact with either the source or drain electrode 79a in the contact hole and a wiring 79c are stacked. The wirings 79b and 79c are formed in the following manner: conductive films are formed over the insulating film 76 and the source and drain electrodes 79a; a resist is applied over the conductive films and is exposed to light and developed using a fifth photomask to form a resist mask. Next, part of the conductive films is etched using the resist mask to form the wirings 79b and 79c. FIG. 7A corresponds to a cross-sectional view taken along a line A-B in FIG. 8C. The wirings 79b and 79c connect one of the source and drain electrodes 79a to a source or drain electrode formed in an adjacent pixel.

Through the above process, a channel-etched thin film transistor 96 can be formed.

Figure 7B:
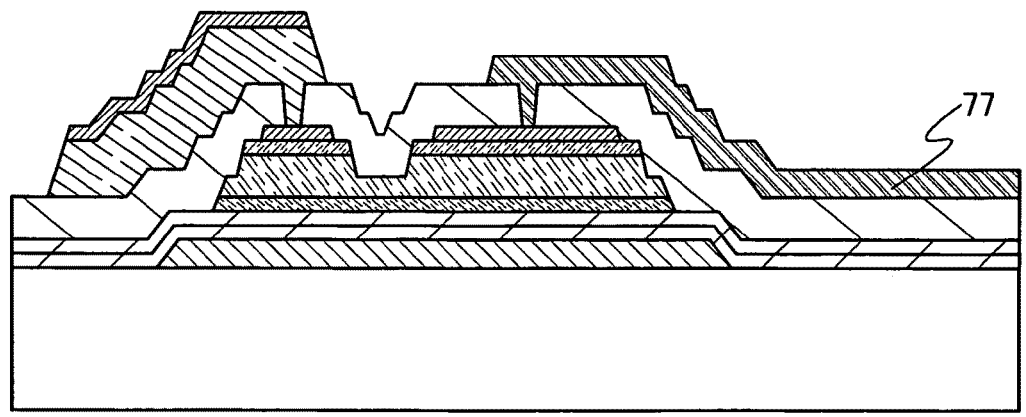

Next as shown in FIG. 7B, a pixel electrode 77 that is in contact with the other of the source and drain electrodes 79a in another contact hole is formed. FIG. 7B corresponds to a cross-sectional view taken along a line A-B in FIG. 8D.

Next, another method for manufacturing a thin film transistor, which is different from the above modes, are described with reference to FIGS. 9A and 9B, FIGS. 10A to 10C, FIGS. 11A and 11B, and FIGS. 12A to 12C. Here, a process is shown through which the number of photomasks can be smaller than that of the above modes and through which a thin film transistor can be manufactured.

Figure 9A:
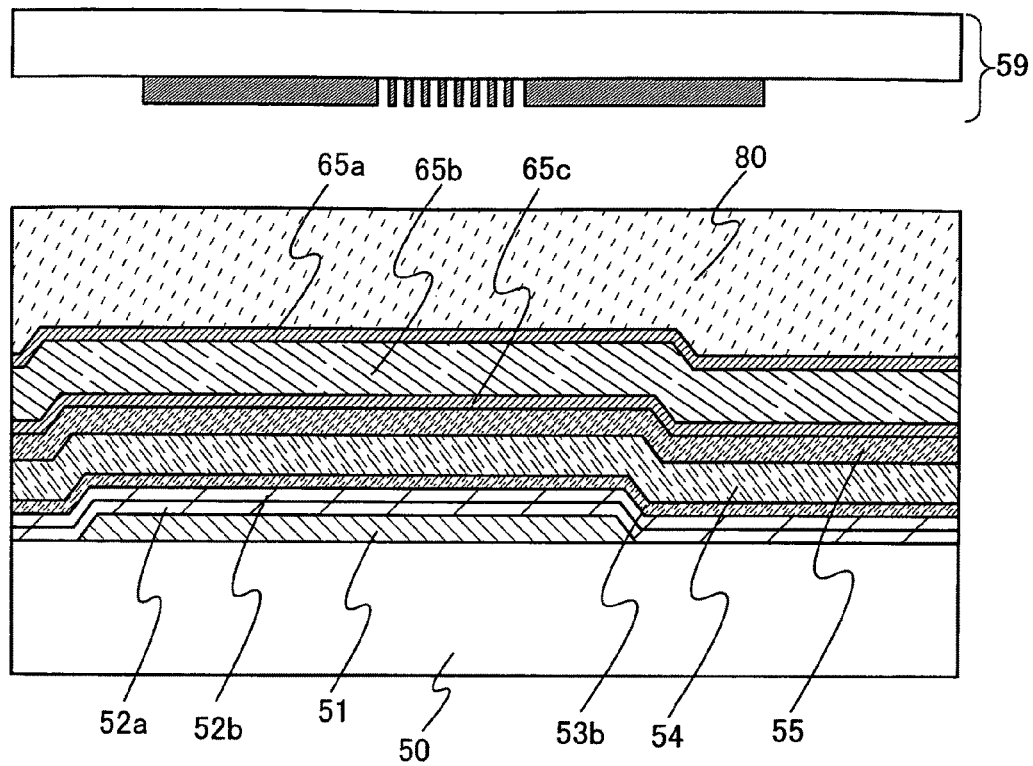
FIGS. 9A and 9B are cross-sectional views illustrating a method for manufacturing a display device of the present invention.

In a similar manner to FIGS. 1A and 1B, a conductive film is formed over a substrate 50; a resist is applied to the conductive film; and part of the conductive film is etched using a resist mask which is formed by a photolithography process using a first photomask, so that a gate electrode 51 is formed. Subsequently, gate insulating films 52a and 52b and a microcrystalline semiconductor film are formed in this order over the gate electrode 51. Then, the microcrystalline semiconductor film is irradiated with a laser beam, thereby forming an LPSAS film 53b as shown in FIG. 9A. Next, a buffer layer 54, a semiconductor film 55 to which an impurity element imparting one conductivity type is added (hereinafter simply referred to as an "impurity semiconductor film 55"), and conductive films 65a to 65c are formed in this order over the LPSAS film 53b. Then, a resist 80 is applied to the conductive film 65a.

The resist 80 can be positive or negative. In this embodiment mode, a positive resist is used as the resist 80.

Next, the resist 80 is irradiated with light using a multi-tone photomask 59 as a second photomask, to expose the resist 80 to light.

Next, light exposure using the multi-tone photomask 59 is described with reference to FIGS. 22A and 22B.

A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Thus, a multi-tone photomask can reduce the number of photomasks.

Figure 22A:
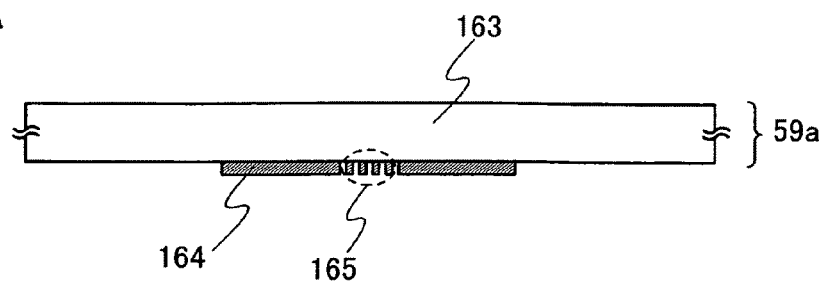
FIGS. 22A to 22D are diagrams illustrating a multi-tone photomask applicable to the present invention.
Figure 22B:
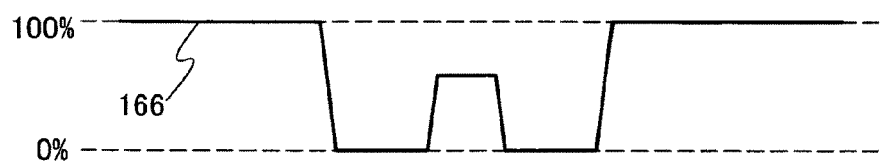
Figure 22C:
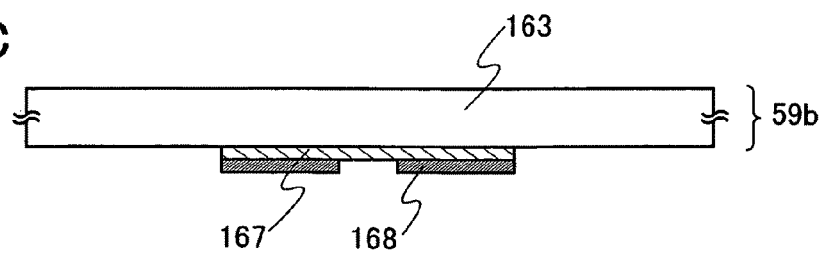

Typical examples of a multi-tone photomask include a gray-tone mask 59a as shown in FIG. 22A, and a half-tone mask 59b as shown in FIG. 22C.

As shown in FIG. 22A, the gray-tone mask 59a includes a substrate 163 that can transmit light, and a light block portion 164 and a diffraction grating 165 that are formed thereon. The light transmittance of the light block portion 164 is 0%. The diffraction grating 165 has a light transmit portion in a slit form, a dot form, a mesh form, or the like with intervals less than or equal to the resolution limit of light used for the exposure; thus, the light transmittance can be controlled. The diffraction grating 165 can be in a slit form, a dot form, or a mesh form with regular intervals; or in a slit form, a dot form, or a mesh form with irregular intervals.

For the substrate 163 that can transmit light, a substrate that can transmit light, such as a quartz substrate, can be used. The light block portion 164 and the diffraction grating 165 can be formed using a light block material such as chromium or chromium oxide, which absorbs light.

When the gray-tone mask 59a is irradiated with light for exposure, a light transmittance 166 of the light block portion 164 is 0% and that of a region where neither the light block portion 164 nor the diffraction grating 165 are provided is 100%, as shown in FIG. 22B. The light transmittance of the diffraction grating 165 can be controlled in a range of from 10 to 70%. The light transmittance of the diffraction grating 165 can be controlled with an interval or a pitch of slits, dots, or meshes of the diffraction grating 165.

As shown in FIG. 22C, the half-tone mask 59b includes a substrate 163 that can transmit light, and a semi-transmissive portion 167 and a light block portion 168 that are formed thereon. The semi-transmissive portion 167 can be formed using MoSiN, MoSi, MoSiO, MoSiON, CrSi, or the like. The light block portion 168 can be formed using a light block material such as chromium or chromium oxide, which absorbs light.

Figure 22D:
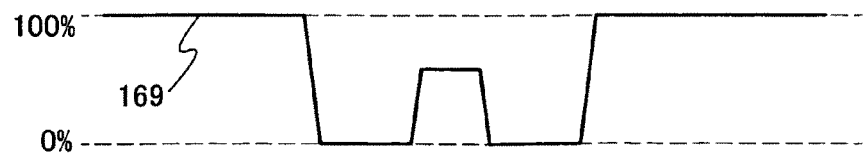

When the half-tone mask 59b is irradiated with light for exposure, a light transmittance 169 of the light block portion 168 is 0% and that of a region where neither the light block portion 168 nor the semi-transmissive portion 167 is provided is 100%, as shown in FIG. 22D. The light transmittance of the semi-transmissive portion 167 can be controlled in a range of from 10 to 70%. The light transmittance of the semi-transmissive portion 167 can be controlled with the material of the semi-transmissive portion 167.

Figure 9B:
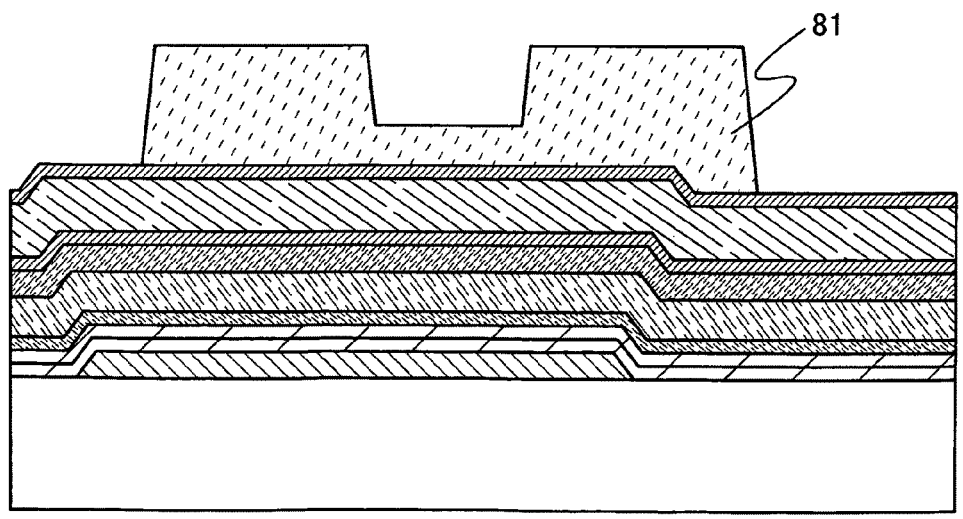

After the light exposure using the multi-tone photomask, development is carried out, whereby a resist mask 81 with regions having different thicknesses can be formed, as shown in FIG. 9B.

Figure 10A:
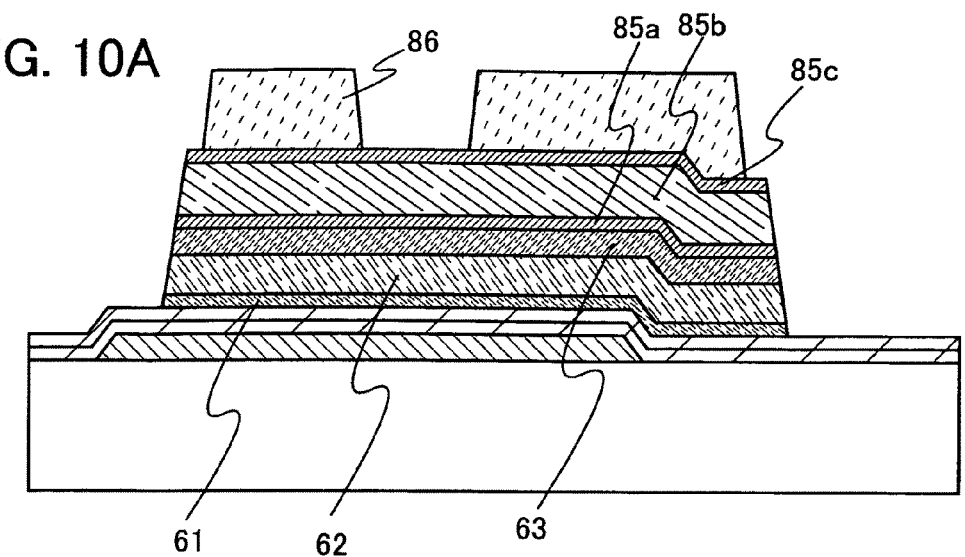
FIGS. 10A to 10C are cross-sectional views illustrating a method for manufacturing a display device of the present invention.

Next, with the resist mask 81, the LPSAS film 53b, the buffer layer 54, the impurity semiconductor film 55, and the conductive films 65a to 65c are etched to be separated. As a result, an LPSAS film 61, a buffer layer 62, a semiconductor film 63 to which the impurity element imparting one conductivity type is added (hereinafter simply referred to as an "impurity semiconductor film 63"), and conductive films 85a to 85c can be formed, as shown in FIG. 10A. FIG. 10A corresponds to a cross-sectional view taken along a line A-B in FIG. 12A (although resist masks 86 are not illustrated in FIGS. 12A to 12C).

Next, the resist mask 81 is ashed. As a result, the area and the thickness of the resist mask is reduced. At this time, the resist mask in a region with a small thickness (a region overlapping with part of the gate electrode 51) is removed to form the separated resist masks 86, as shown in FIG. 10A.

Figure 10B:
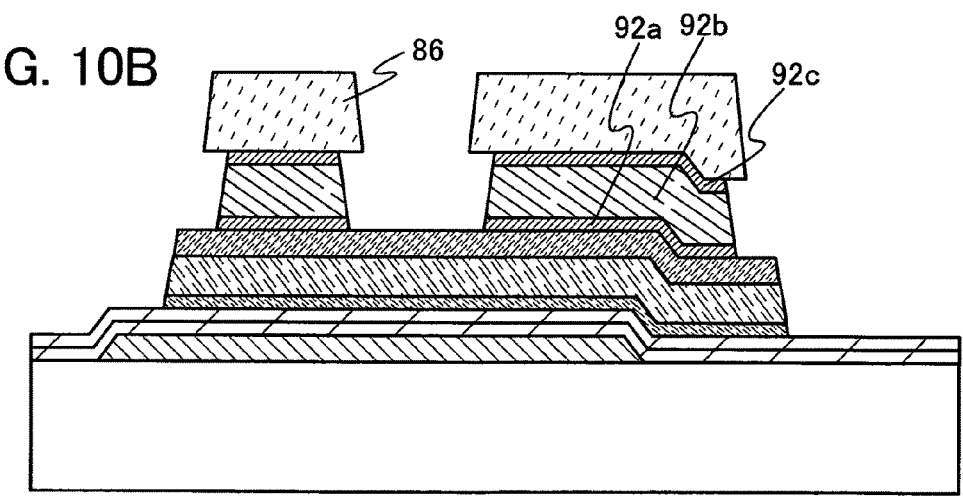

Next, the conductive films 85a to 85c are etched to be separated using the resist masks 86. As a result, a pair of source and drain electrodes 92a, a pair of source and drain electrodes 92b, and a pair of source and drain electrodes 92c can be formed as shown in FIG. 10B. When the conductive films 85a to 85c are wet-etched using the resist masks 86, the conductive films 85a to 85c are etched isotropically. Thus, source and drain electrodes 92a to 92c with smaller areas than those of the resist masks 86 can be formed.

Next, the impurity semiconductor film 63 is etched using the resist masks 86 to form a pair of source and drain regions 88. In the etching process, part of the buffer layer 62 is also etched. The buffer layer which is etched partly is referred to as a buffer later 87. In the buffer layer 87, a recessed portion is formed. The source and drain regions and the recessed portion (groove) of the buffer layer can be formed in the same process. Here, the buffer layer 87 is partly etched with use of the resist masks 86 having smaller areas than that of the resist mask 81, so that end portions of the buffer layer 87 are located outer side than those of the source and drain regions 88. After that, the resist masks 86 are removed. End portions of the source and drain electrodes 92a to 92c are not aligned with those of the source and drain regions 88, and the end portions of the source and drain regions 88 are located outer side than those of the source and drain electrodes 92a to 92c.

Figure 10C:
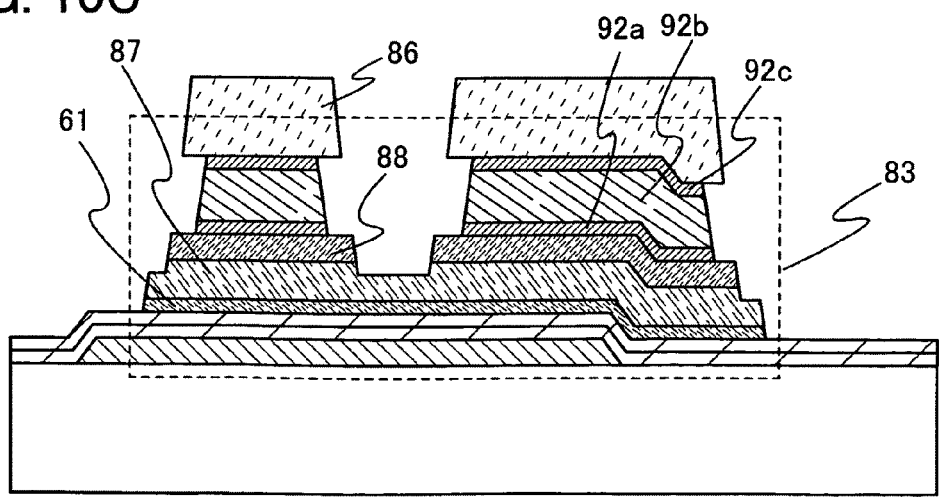
Figure 12A:
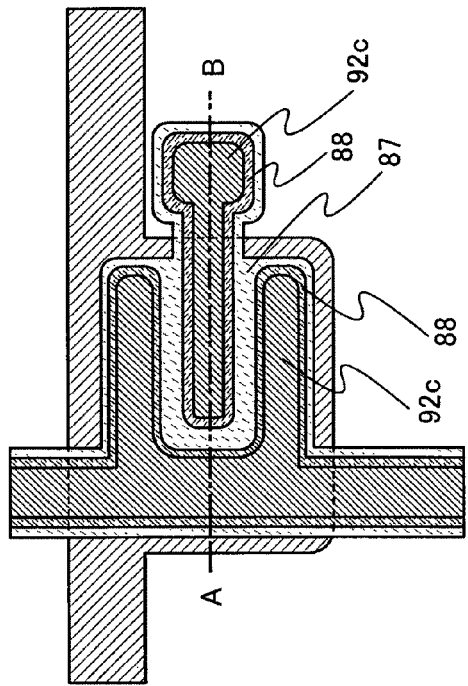
FIGS. 12A to 12C are top views illustrating a method for manufacturing a display device of the present invention.
Figure 12B:
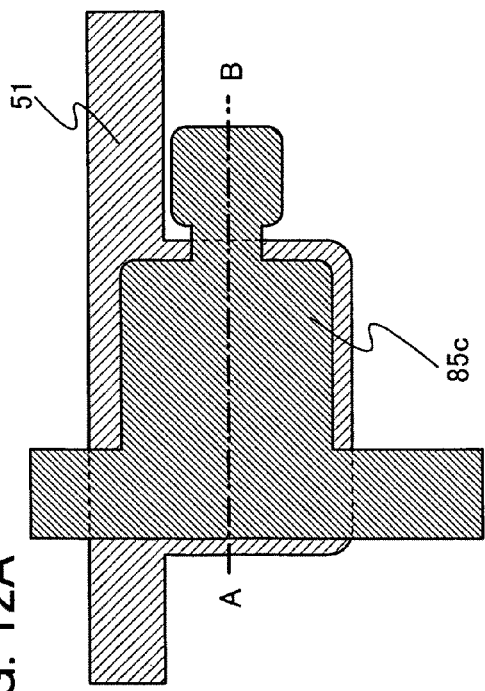
Figure 12C:
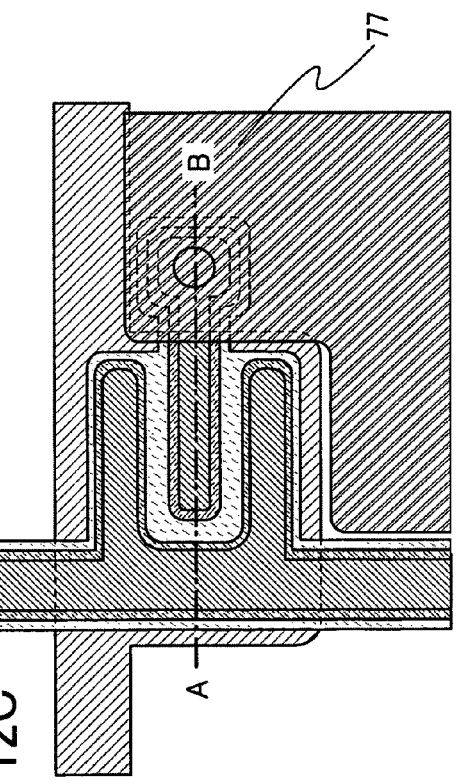

FIG. 10C corresponds to a cross-sectional view taken along a line A-B in FIG. 12B. As shown in FIG. 12B, the end portions of the source and drain regions 88 are located outer side than those of the source and drain electrodes 92c. Further, end portions of the buffer layer 87 are located outer side than those of the source and drain electrodes 92c and those of the source and drain regions 88. Furthermore, one of the source and the drain electrodes surrounds the other source or drain electrode (specifically, the former electrode is in a U-shape or a C-shape). Therefore, the area of a region where carriers travel can be increased; and thus the amount of current can be increased, and the area of the thin film transistor can be reduced. Further, unevenness of the gate electrode has little influence on the films and layers thereover because the microcrystalline semiconductor film and the source and drain electrodes overlap with each other over the gate electrode, thereby curbing reduction in coverage and generation of leakage current. Either the source electrode or the drain electrode also functions as a source wiring or a drain wiring.

As shown in FIG. 10C, the end portions of the source and drain electrodes 92a to 92c are not aligned with those of the source and drain regions 88, whereby the distance between the end portions of the source and drain electrodes 92a to 92c can be long; thus, leakage current or short circuit between the source and drain electrodes can be prevented. Accordingly, a thin film transistor with high reliability and high resistance to voltage can be manufactured.

Through the above process, a channel-etched thin film transistor 83 can be formed. The thin film transistor can be formed with use of the two photomasks.

Figure 11A:
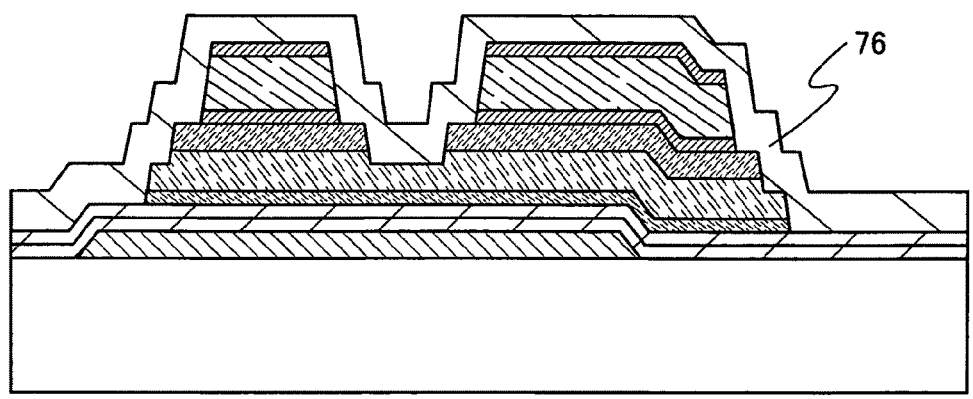
FIGS. 11A and 11B are cross-sectional views illustrating a method for manufacturing a display device of the present invention.

Next as shown in FIG. 11A, an insulating film 76 is formed over the source and drain electrodes 92a to 92c, the source and drain regions 88, the buffer layer 87, the LPSAS film 61, and the gate insulating film 52b. The insulating film 76 can be formed in a similar manner to the gate insulating films 52a and 52b.

Figure 11B:
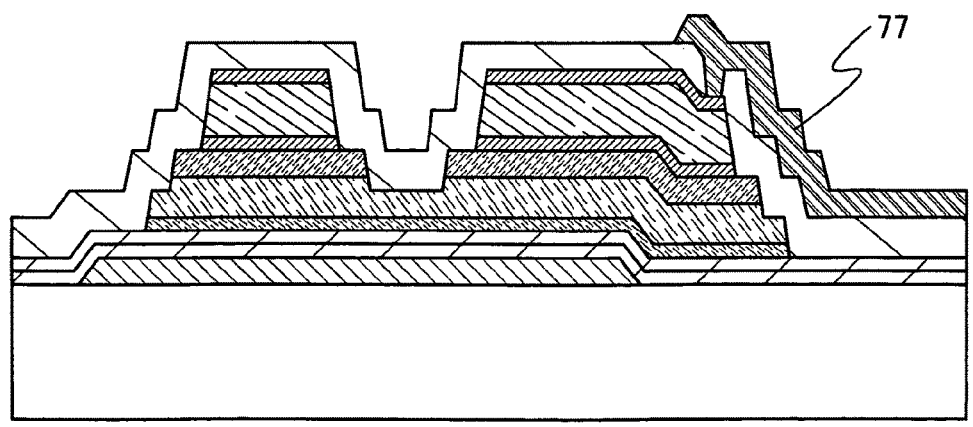

Next, a contact hole is formed in the insulating film 76 by partly etching the insulating film 76 using a resist mask formed using a third photomask. Then, a pixel electrode 77 that is in contact with the source or drain electrode 92c in the contact hole is formed. In this example, an ITO film is formed as the pixel electrode 77 by a sputtering method, and then a resist is applied to the ITO film. Subsequently, the resist is exposed to light and developed using a fourth photomask, thereby forming a resist mask. Then, the ITO film is etched using the resist mask to form the pixel electrode 77. FIG. 11B corresponds to a cross-sectional view taken along a line A-B in FIG. 12C.

In the above manner, an element substrate which can be used for a display device can be formed.

Next, another method for forming a thin film transistor, which is different from the above modes, is described with reference to FIGS. 13A to 13C, FIGS. 14A to 14C, FIG. 15, and FIGS. 16A to 16D. Hereinafter, a mode is shown in which source and drain electrodes and source and drain wirings are formed using different films, which is different from the process shown in FIGS. 10A to 10C, FIGS. 11A and 11B, and FIGS. 12A to 12C.

Figure 13A:
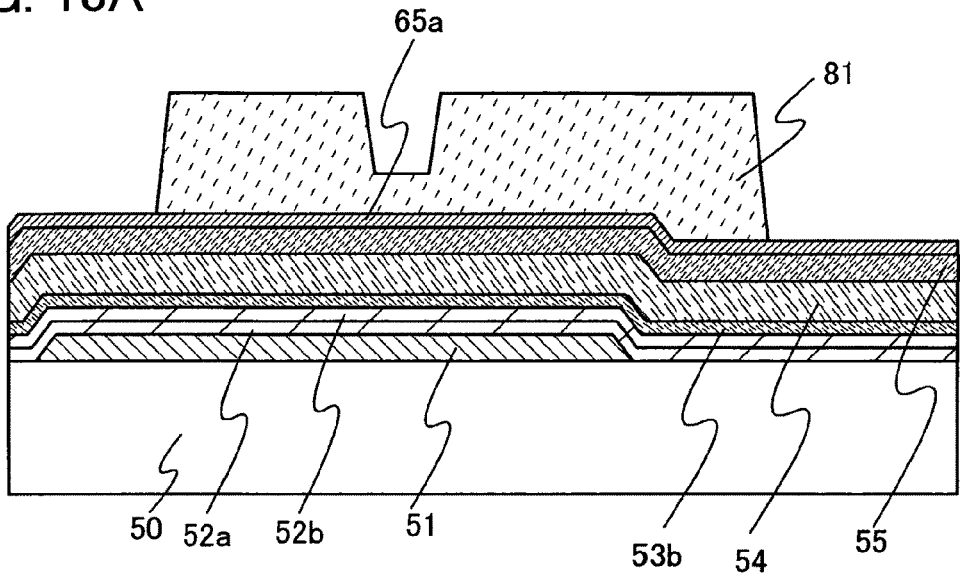
FIGS. 13A to 13C are cross-sectional views illustrating a method for manufacturing a display device of the present invention.

In a similar manner to FIGS. 1A and 1B, a conductive film is formed over a substrate 50; a resist is applied to the conductive film; and part of the conductive film is etched using a resist mask which is formed by a photolithography process using a first photomask, so that a gate electrode 51 is formed. Subsequently, gate insulating films 52a and 52b and a microcrystalline semiconductor film are formed in this order over the gate electrode 51. Then, the microcrystalline semiconductor film is irradiated with a laser beam, thereby forming an LPSAS film 53b as shown in FIG. 13A. Next, a buffer layer 54, a semiconductor film 55 to which an impurity element imparting one conductivity type is added (hereinafter simply referred to as an "impurity semiconductor film 55"), and a conductive film 65a are formed in this order over the LPSAS film 53b. Then, a resist is applied to the conductive film 65a, and a resist mask with regions having different thicknesses is formed using the multi-tone photomask shown in FIG. 9A (see FIG. 13A).

Figure 13B:
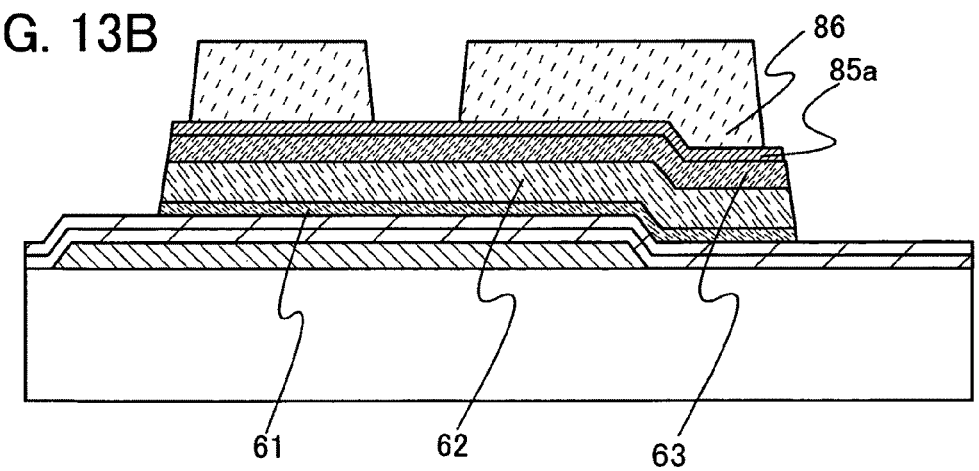

Next, the LPSAS film 53b, the buffer layer 54, the impurity semiconductor film 55, and the conductive film 65a are etched to be separated with the resist mask 81. As a result, an LPSAS film 61, a buffer layer 62, a semiconductor film 63 to which the impurity element imparting one conductivity type is added (hereinafter simply referred to as an "impurity semiconductor film 63"), and a conductive film 85a can be formed, as shown in FIG. 13B. FIG. 13B corresponds to a cross-sectional view taken along a line A-B in FIG. 16A (although resist masks 86 are not illustrated in FIGS. 16A to 16D).

Figure 13C:
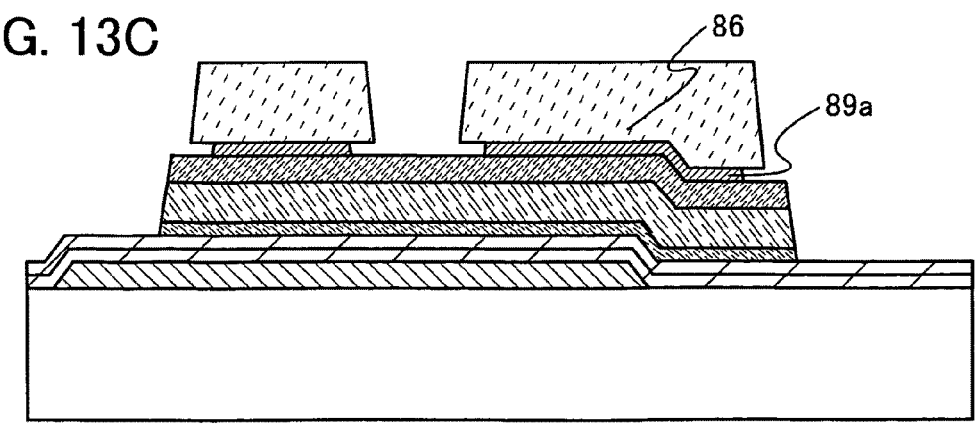

Next, the resist mask 81 is ashed to be separated, thereby forming a pair of resist masks 86. Subsequently, the conductive film 85a is etched to be separated using the resist masks 86. As a result, a pair of source and drain electrodes 89a can be formed as shown in FIG. 13C. Here, the conductive film 85a is wet-etched to form the source and drain electrodes 89a with smaller areas than those of the resist masks 86.

Figure 14A:
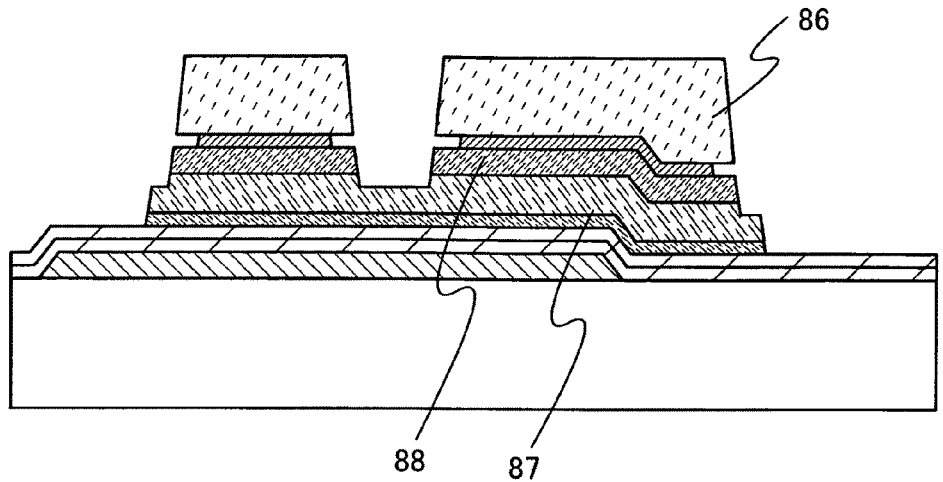
FIGS. 14A to 14C are cross-sectional views illustrating a method for manufacturing a display device of the present invention.
Figure 14B:
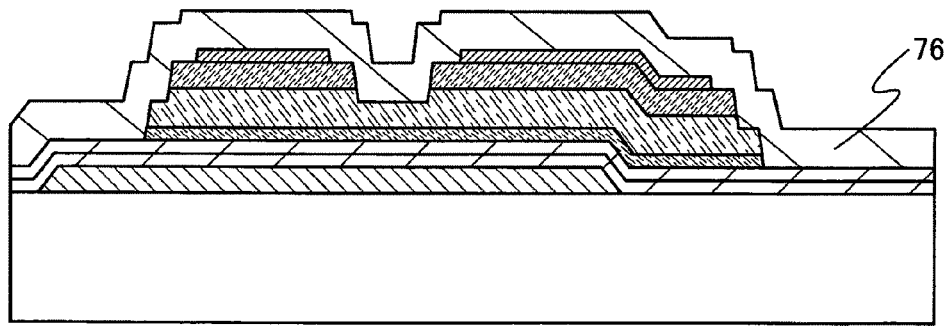
Figure 14C:
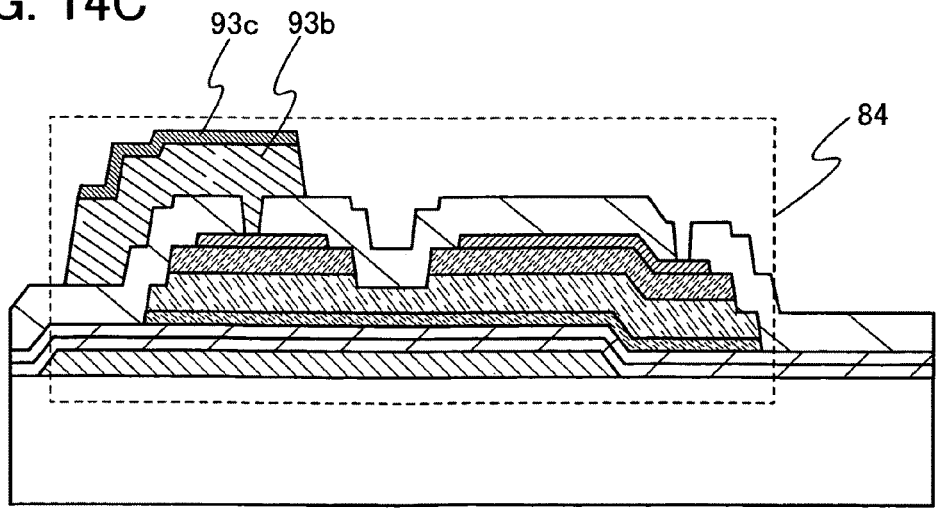

Next as shown in FIG. 14A, the impurity semiconductor film 63 is etched using the resist masks 86, thereby forming source and drain regions 88. Here, exposed portions of the impurity semiconductor film 63 are isotropically etched away by dry etching using the resist masks 86. After that, the resist masks 86 are removed. In the etching process, part of the buffer layer 62 is also etched. The buffer layer which is etched partly is referred to as a buffer layer 87. Here, end portions of the buffer layer 87 are located outer side than those of the source and drain regions 88 because part of the buffer layer 87 is etched with the resist masks 86 having reduced areas. FIG. 14B corresponds to a cross-sectional view taken along a line A-B in FIG. 16B. As shown in FIG. 14B, the end portions of the source and drain regions 88 are located outer side than those of the source and drain electrodes 89a. Further, the end portions of the buffer layer 87 are located outer side than those of the source and drain electrodes 89a and those of the source and drain electrodes 88. Furthermore, the source and drain electrodes 89a are separated from each other, and are not connected to an electrode which is formed in an adjacent pixel.

As shown in FIG. 14B, the end portions of the source and drain electrodes 89a are not aligned with those of the source and drain regions 88, whereby the distance between the end portions of the source and drain electrodes 89a can be long; thus, leakage current or short circuit between the source and drain electrodes can be prevented. Accordingly, a thin film transistor with high reliability and high resistance to voltage can be manufactured.

Next as shown in FIG. 14B, an insulating film 76 is formed over the source and drain electrodes 89a, the source and drain regions 88, the buffer layer 87, the LPSAS film 61, and the gate insulating film 52b. The insulating film 76 can be formed in a similar manner to the gate insulating films 52a and 52b.

Next, part of the insulating film 76 is etched using a resist mask formed using a third photomask, so that contact holes are formed. After forming the contact holes, a wiring 93b that is in contact with either the source or drain electrode 89a in the contact hole and a wiring 93c are stacked. FIG. 14A corresponds to a cross-sectional view taken along a line A-B in FIG. 16C. The wirings 93b and 93c connect one of the source and drain electrodes 89a to a source or drain electrode formed in an adjacent pixel.

Figure 15:
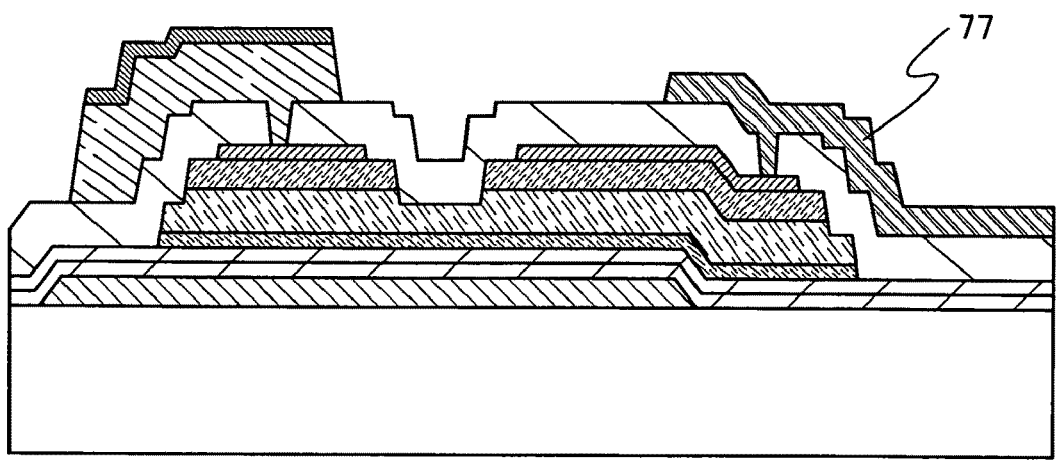
FIG. 15 is a cross-sectional view illustrating a method for manufacturing a display device of the present invention.
Figure 16A:
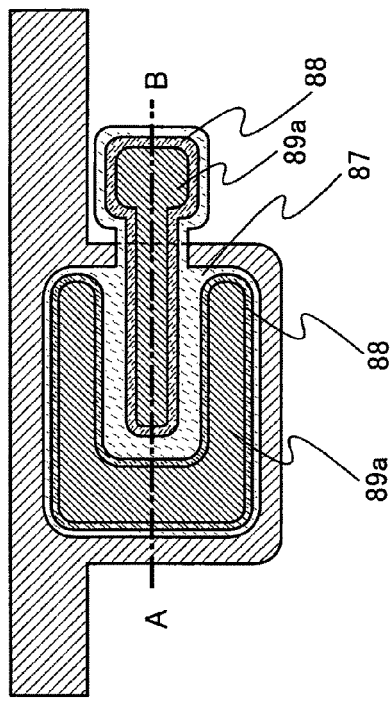
FIGS. 16A to 16D are top views illustrating a method for manufacturing a display device of the present invention.
Figure 16B:
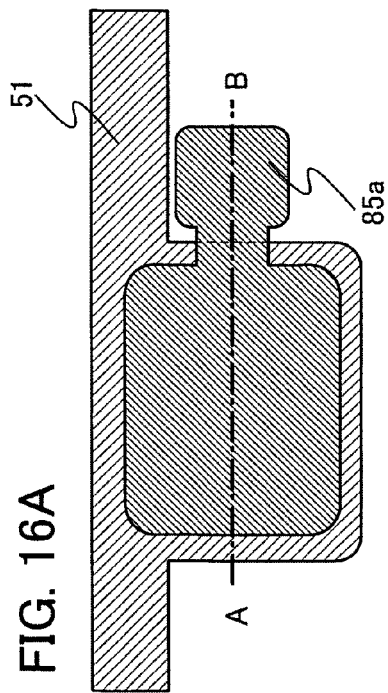
Figure 16C:
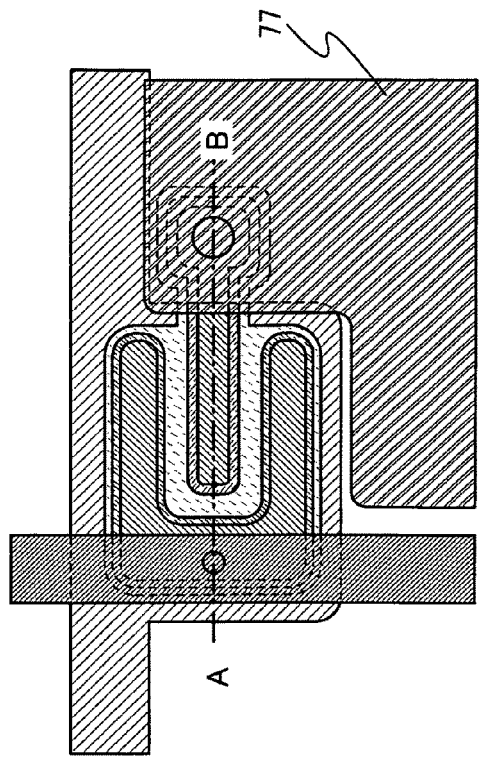
Figure 16D:
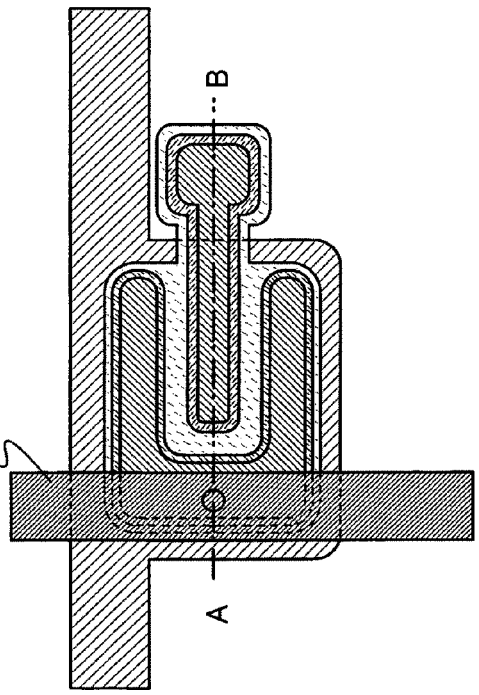

Then, as shown in FIG. 15, a pixel electrode 77 that is in contact with the other of the source and drain electrodes 89a in the contact hole is formed. In this example, an ITO film is formed as the pixel electrode 77 by a sputtering method, and then a resist is applied to the ITO film. Subsequently, the resist is exposed to light and developed using a fourth photomask, thereby forming a resist mask. Then, the ITO film is etched using the resist mask to form the pixel electrode 77. FIG. 15 corresponds to a cross-sectional view taken along a line A-B in FIG. 16D.

Through the above process, a channel-etched thin film transistor can be formed. A channel-etched thin film transistor can be formed with fewer production steps and less cost. In addition, a field effect mobility of from 1 to 20 cm$^2$/V·sec can be achieved by forming a channel formation region using a microcrystalline semiconductor film. Therefore, the thin film transistor can be used as a switching element of a pixel in a pixel portion, and further as an element included in a driver circuit on a scanning line (or a gate line) side.

Although FIGS. 1A to 1C, FIGS. 2A to 2C, FIGS. 3A to 3C, FIGS. 4A to 4C, FIGS. 5A to 5C, FIGS. 6A to 6C, FIGS. 7A and 7B, FIGS. 8A to 8D, FIGS. 9A and 9B, FIGS. 10A to 10C, FIGS. 11A and 11B, FIGS. 12A to 12C, FIGS. 13A to 13C, FIGS. 14A to 14C, FIG. 15, and FIGS. 16A to 16D show thin film transistors in which the end portions of the source and drain electrodes are not aligned with those of the source and drain regions, the structure is not limited thereto.

Figure 17:
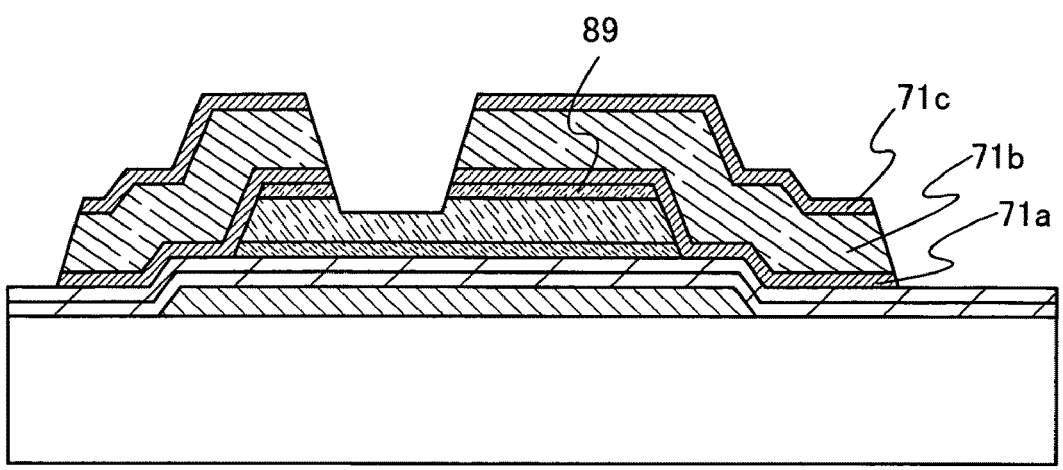
FIG. 17 is a cross-sectional view illustrating a method for manufacturing a display device of the present invention.

Further, in FIG. 2C, after forming the source and drain electrodes 71a to 71c, the resist masks 66 may be removed, and the impurity semiconductor film 63 may be etched using the source and drain electrodes 71a to 71c as masks. As a result, a thin film transistor in which end portions of source and drain electrodes 71a to 71c are aligned with those of source and drain regions 89 can be formed as shown in FIG. 17.

Through the above process, a channel-etched thin film transistor can be formed. A channel-etched thin film transistor can be formed with fewer production steps and less cost. In addition, a field effect mobility of from 1 to 20 $cm^2/V \cdot sec$ can be achieved by forming a channel formation region using a microcrystalline semiconductor film. Therefore, the thin film transistor can be used as a switching element of a pixel in a pixel portion, and further as an element included in a driver circuit on a scanning line (or a gate line) side.

Next, another method for forming a thin film transistor, which is different from the above modes, is described with reference to FIGS. 18A to 18C and FIG. 19. Here, a mode of a channel protective thin film transistor that can be used instead of the channel etched thin film transistors in FIGS. 1A to 1C, FIGS. 2A to 2C, FIGS. 3A to 3C, FIGS. 4A to 4C, FIGS. 5A to 5C, FIGS. 6A to 6C, FIGS. 7A and 7B, FIGS. 8A to 8D, FIGS. 9A and 9B, FIGS. 10A to 10C, FIGS. 11A and 11B, FIGS. 12A to 12C, FIGS. 13A to 13C, FIGS. 14A to 14C, FIG. 15, FIGS. 16A to 16D, and FIG. 17 is shown.

In a similar manner to FIGS. 1A and 1B, a conductive film is formed over a substrate 50; a resist is applied to the conductive film; and part of the conductive film is etched using a resist mask which is formed by a photolithography process using a first photomask, so that a gate electrode 51 is formed. Subsequently, gate insulating films 52a and 52b and a microcrystalline semiconductor film are formed in this order over the gate electrode 51. Then, the microcrystalline semiconductor film is irradiated with a laser beam, thereby forming an LPSAS film 53b. Next, a buffer layer 54 is formed over the LPSAS film 53b (see FIG. 18A).

Next, an insulating film 94 is formed over the buffer layer 54. Subsequently, a resist is applied to the insulating film 94, and then a resist mask 95 is formed by a photolithography process using a second photomask. As the insulating film 94, a silicon nitride film, a silicon nitride oxide film, a silicon oxide film, or a silicon oxynitride film is formed by a sputtering method, a CVD method, or the like.

Figure 18A:
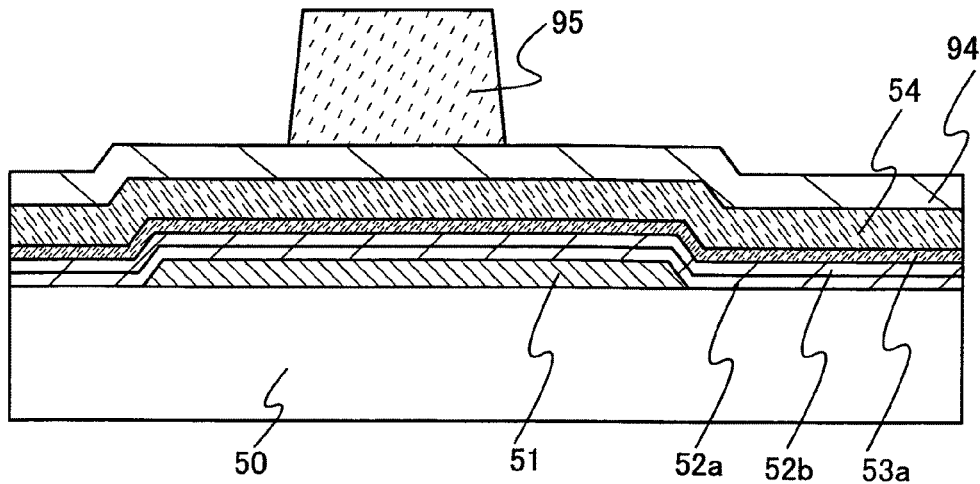
FIGS. 18A to 18C are cross-sectional views illustrating a method for manufacturing a display device of the present invention.
Figure 18B:
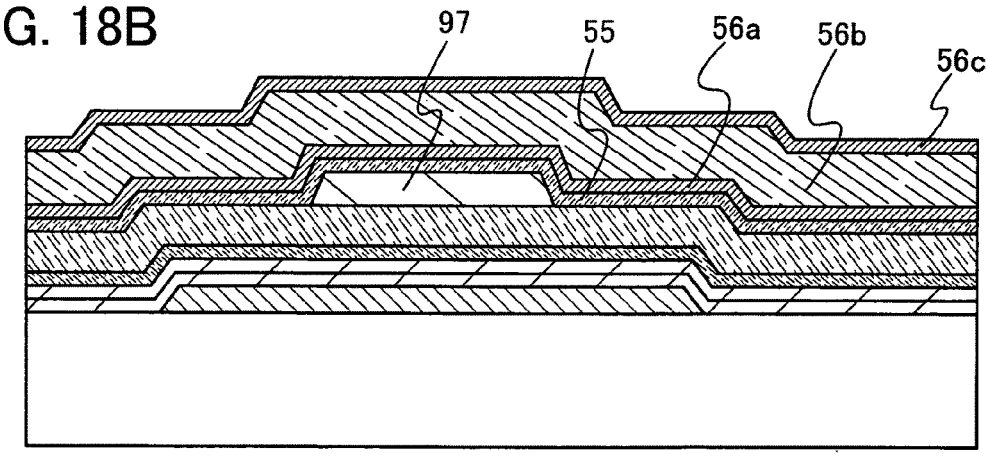

Then, the insulating film 94 is etched using the resist mask 95, thereby forming a channel protective film 97 as shown in FIG. 18B. Instead of utilizing the photolithography process for forming the channel protective film 97, polyimide, acrylic, or a composition including siloxane may be discharged and baked to form the channel protective film 97.

Next, a semiconductor film 55 to which an impurity element imparting one conductivity type is added (hereinafter simply referred to as an "impurity semiconductor film 55") and conductive films 56a to 56c are formed in this order. Subsequently, a resist is applied to the conductive film 56c, and resist masks 98 are formed by a photolithography process using a third photomask.

Figure 18C:
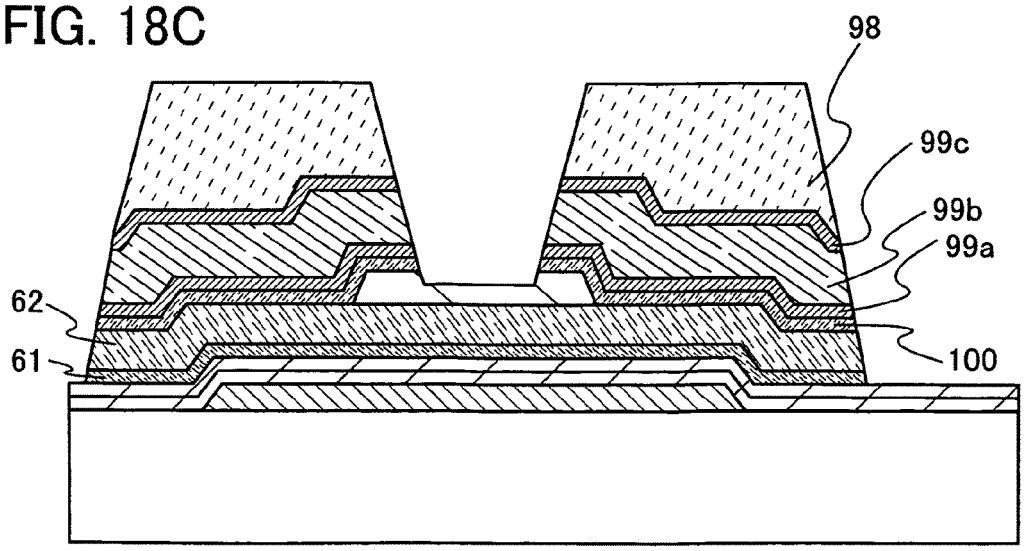

Then, the conductive films 56a to 56c, the impurity semiconductor film 55, the buffer layer 54, and the LPSAS film 53b are etched to be separated with the resist masks 98. As a result, an LPSAS film 61, a buffer layer 62, source and drain regions 100, and source and drain electrodes 99a to 99c are formed as shown in FIG. 18C.

Through the above process, a channel protective film thin transistor can be formed. In FIGS. 18A to 18C, the conductive films 56a to 56c and the impurity semiconductor film 55 are dry-etched. Thus, end portions of the source and drain electrodes 99a to 99c are aligned with those of the source and drain electrodes 100.

Figure 19:
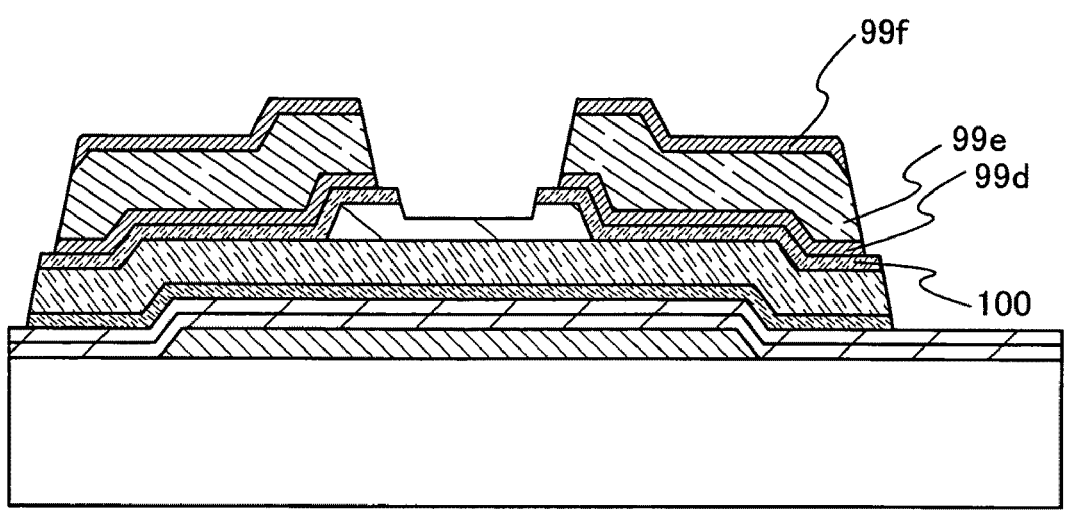
FIG. 19 is a cross-sectional view illustrating a method for manufacturing a display device of the present invention.

Alternatively, as shown in FIG. 19, the conductive films 56a to 56c may be wet-etched isotropically to form source and drain electrodes 99d to 99f. In this case, end portions of the source and drain electrodes 99d to 99f are not aligned with those of the source and drain regions 100, and the end portions of the source and drain regions 100 are located outer side than those of the source and drain electrodes 99d to 99f.

According to this embodiment mode, a thin film transistor with high reliability in electric characteristics can be manufactured. Further, an element substrate having a thin film transistor with excellent electric characteristics and high reliability can be manufactured.

Embodiment Mode 2

Hereinafter, this embodiment mode shows a liquid crystal display device including a thin film transistor shown in Embodiment Mode 1 as one mode of a display device.

First, a vertical alignment (VA) liquid crystal display device is shown. The VA liquid crystal display device employs a method of controlling alignment of liquid crystal molecules of a liquid crystal panel. In the VA liquid crystal display device, liquid crystal molecules are aligned in a vertical direction with respect to a panel surface when no voltage is applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 23:
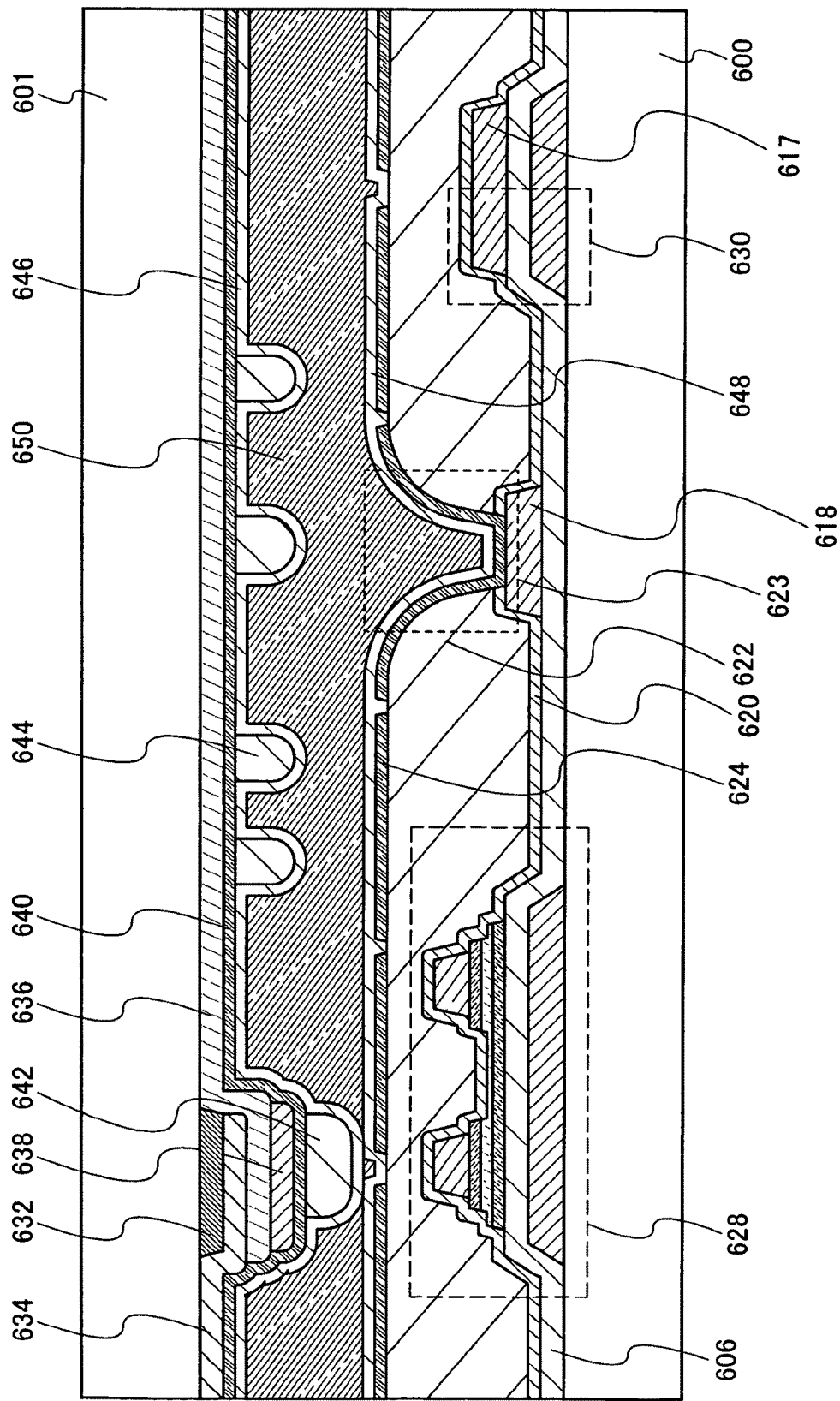
FIG. 23 is a diagram illustrating a liquid crystal display device of the present invention.
Figure 24:
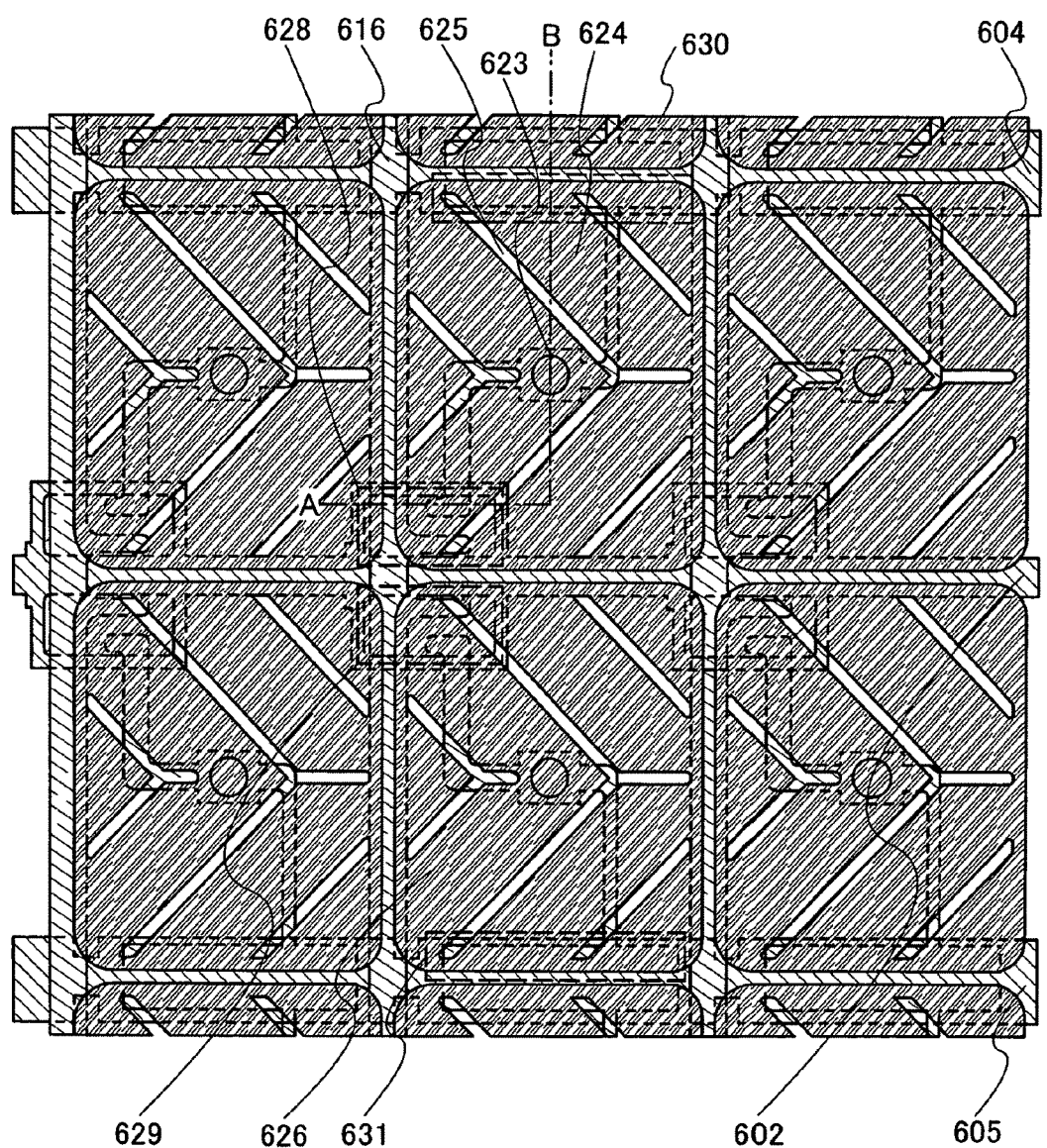
FIG. 24 is a diagram illustrating a liquid crystal display device of the present invention.
Figure 25:
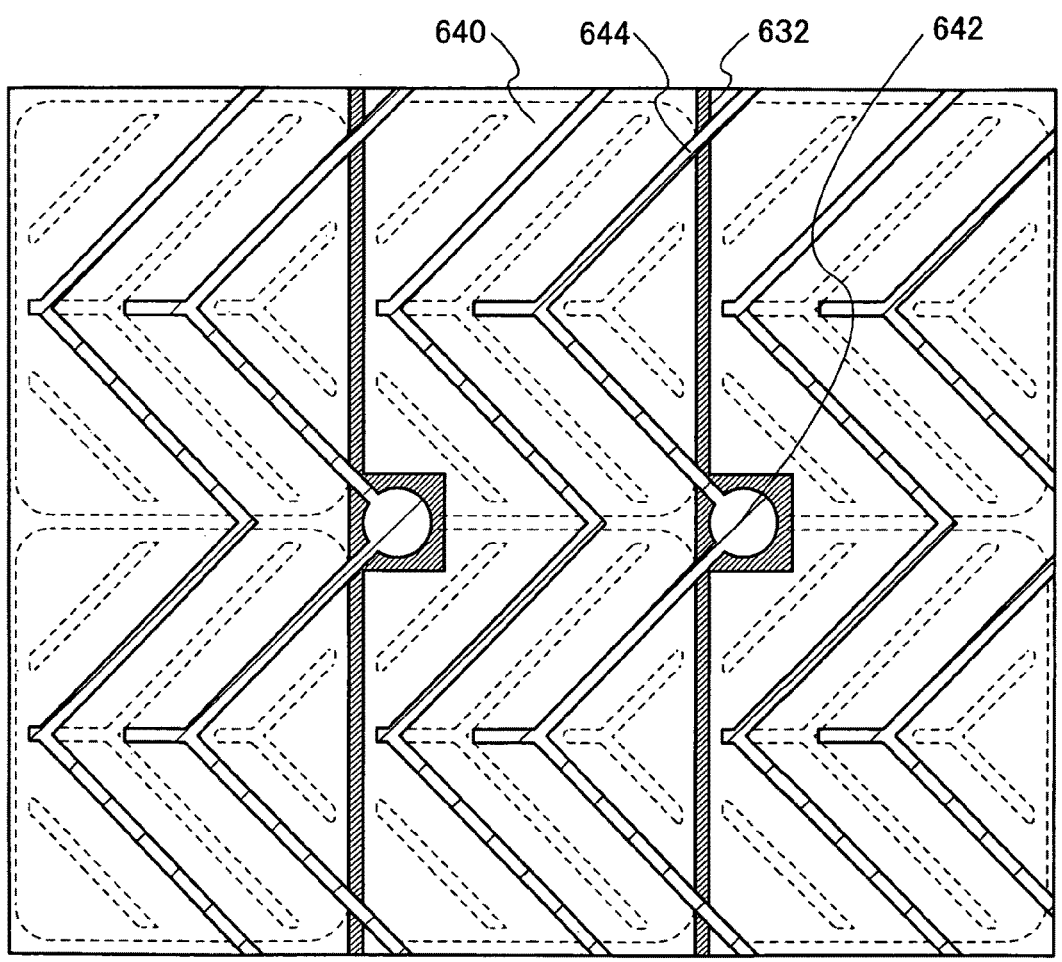
FIG. 25 is a diagram illustrating a liquid crystal display device of the present invention.

FIGS. 24 and 25 show a pixel electrode and a counter electrode, respectively. FIG. 24 is a plan view on a substrate side over which the pixel electrode is formed. FIG. 23 shows a cross-sectional structure taken along a line A-B in FIG. 24. FIG. 25 is a plan view on a substrate side over which the counter electrode is formed. Hereinafter, description is made with reference to these drawings.

In FIG. 23, a substrate 600 over which a TFT 628, a pixel electrode 624 connected to the TFT 628, and a holding capacitor portion 630 are formed and a counter substrate 601 for which a counter electrode 640 and the like are provided are overlapped with each other, and liquid crystals are injected between the substrate 600 and the counter substrate 601.

A light blocking film 632, a first colored film 634, a second colored film 636, a third colored film 638, and the counter electrode 640 are formed in a position where a spacer 642 is formed on the counter substrate 601. This configuration makes the height of projections 644 for controlling alignment of liquid crystals different from that of the spacer 642. An alignment film 648 is formed over the pixel electrode 624, and the counter electrode 640 is similarly provided with an alignment film 646. A liquid crystal layer 650 is formed between the alignment films 646 and 648.

Although columnar spacers are used as the spacer 642 here, bead spacers may be dispersed instead. Further, the spacer 642 may be formed over the pixel electrode 624 formed over the substrate 600.

The TFT 628, the pixel electrode 624 connected to the TFT 628, and the holding capacitor portion 630 are formed over the substrate 600. The pixel electrode 624 is connected to a wiring 618 in a contact hole 623 that passes through an insulating film 620 covering the TFT 628, the wiring 618, and the holding capacitor portion 630, and a third insulating film 622 covering the insulating film 620. The thin film transistor shown in Embodiment Mode 1 can be used as appropriate for the TFT 628. Further, the holding capacitor portion 630 includes a first capacitor wiring 604 that is formed at the same time as a gate wiring 602 of the TFT 628; a gate insulating film 606; and a second capacitor wiring 617 that is formed at the same time as a wiring 616 and the wiring 618.

The pixel electrode 624, the liquid crystal layer 650, and the counter electrode 640 overlap with each other, so that a liquid crystal element is formed.

FIG. 24 illustrates a structure over the substrate 600. The pixel electrode 624 is formed using a material shown in Embodiment Mode 1. Slits 625 are formed in the pixel electrode 624. The slits 625 are formed to control alignment of the liquid crystals.

A TFT 629, a pixel electrode 626 connected to the TFT 629, and a holding capacitor portion 631, which are shown in FIG. 24, can be formed in a similar manner to the TFT 628, the pixel electrode 624, and the holding capacitor portion 630, respectively. Both the TFTs 628 and 629 are connected to the wiring 616. A pixel of this liquid crystal panel includes the pixel electrodes 624 and 626. The pixel electrodes 624 and 626 are subpixels.

FIG. 25 illustrates a structure on the counter substrate side. The counter electrode 640 is formed over the light blocking film 632. It is preferable to use the same material as that of the pixel electrode 624 to form the counter electrode 640. The projections 644 that control alignment of liquid crystals are formed over the counter electrode 640. Moreover, the spacer 642 is formed in accordance with the position of the light blocking film 632.

Figure 26:
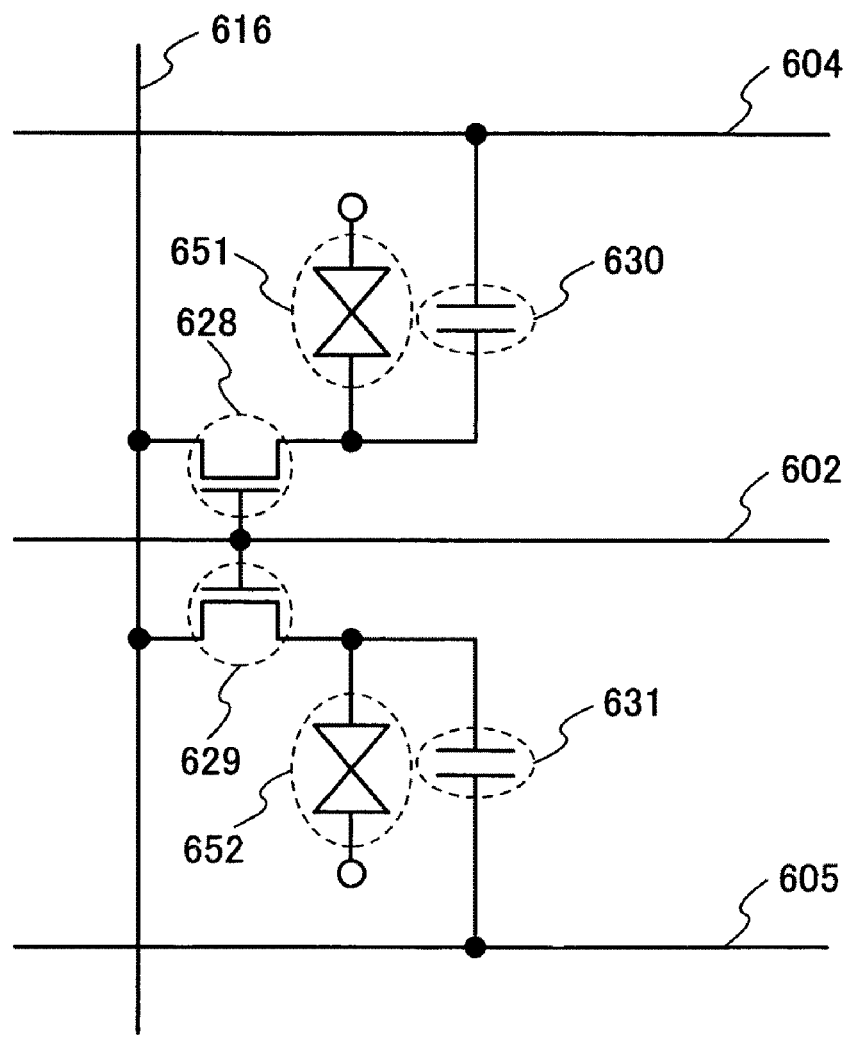
FIG. 26 is a diagram illustrating a liquid crystal display device of the present invention.

FIG. 26 illustrates an equivalent circuit of this pixel configuration. Both the TFTs 628 and 629 are connected to the gate wiring 602 and the wiring 616. In this case, by making the potential of the first capacitor wiring 604 different from that of a capacitor wiring 605, operation of a liquid crystal element 651 can be different from that of a liquid crystal element 652. Specifically, potentials of the first capacitor wirings 604 and 605 are controlled individually, thereby precisely controlling alignment of liquid crystals to increase a viewing angle.

When a voltage is applied to the pixel electrode 624 provided with the slits 625, a distorted electric field (an oblique electric field) is generated in the vicinity of the slits 625. The slits 625 and the projections 644 on the counter substrate 601 side are disposed so as not to overlap with each other, thereby effectively generating the oblique electric field to control alignment of the liquid crystals, and thus the direction in which liquid crystals are aligned is different depending on the location. Specifically, the viewing angle of a liquid crystal panel is increased by employing multi-domain.

Next, a different VA liquid crystal display device from the above is described with reference to FIGS. 27 to 30.

Figure 27:
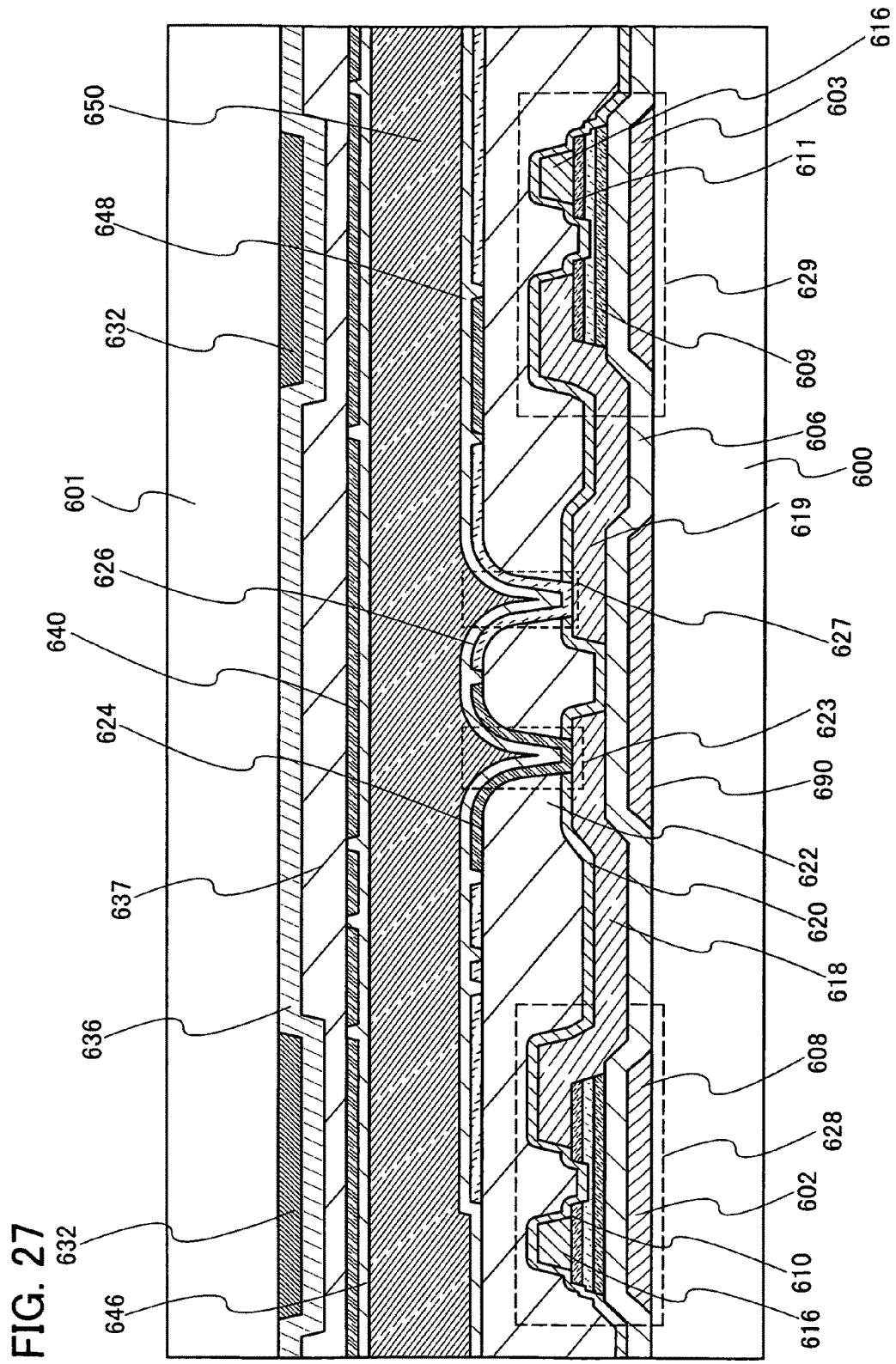
FIG. 27 is a diagram illustrating a liquid crystal display device of the present invention.
Figure 28:
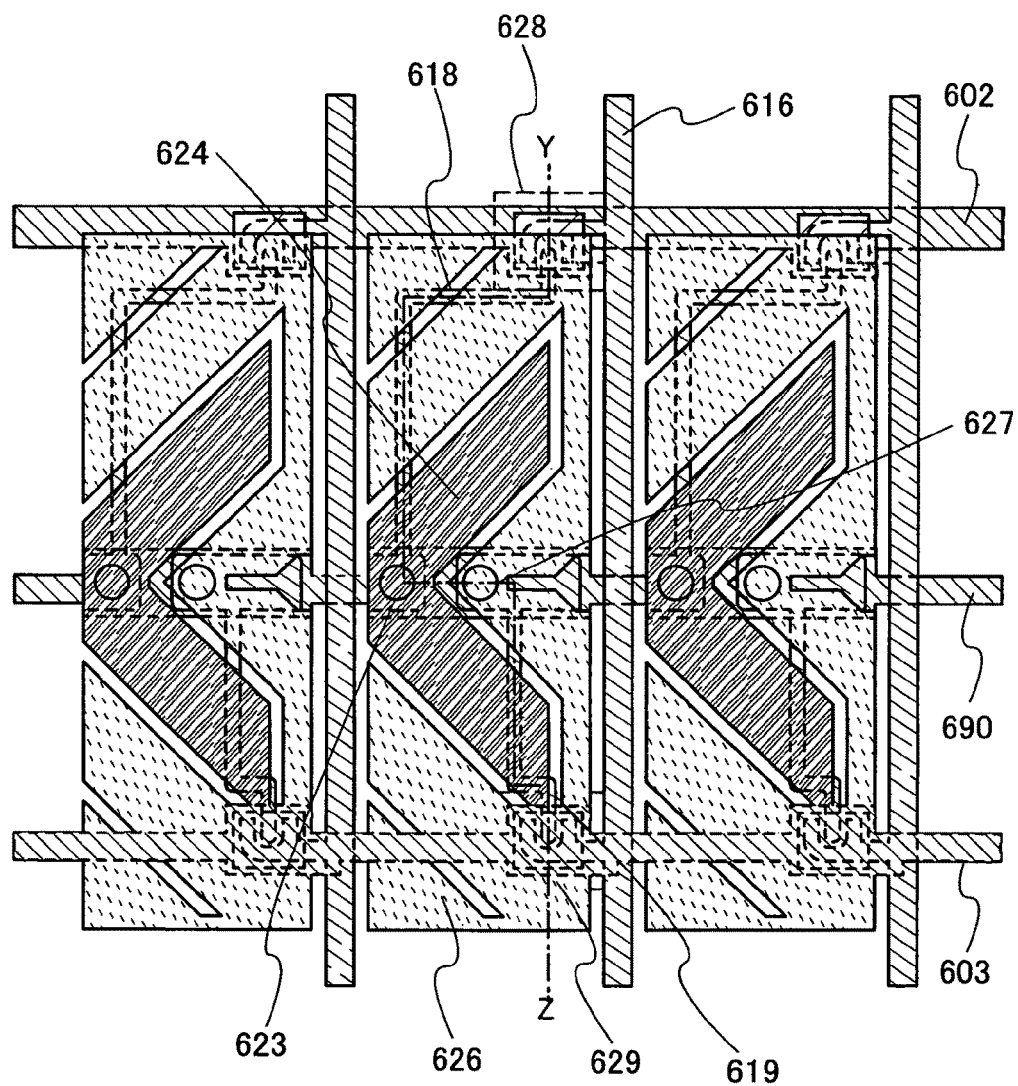
FIG. 28 is a diagram illustrating a liquid crystal display device of the present invention.

FIGS. 27 and 28 show a pixel structure of a VA liquid crystal panel. FIG. 28 is a plane view over a substrate 600. FIG. 27 shows a cross-sectional structure taken along a line Z-Y in FIG. 28. The following description is made with reference to both the drawings.

In this pixel structure, one pixel has a plurality of pixel electrodes, and a TFT is connected to each pixel electrode. Each TFT is driven with a different gate signal from each other. Specifically, in the pixel of multi-domain design, a signal applied to each pixel electrode is controlled independently.

A pixel electrode 624 is connected to a TFT 628 through a wiring 618 in a contact hole 623. In addition, a pixel electrode 626 is connected to a TFT 629 through a wiring 619 in a contact hole 627. A gate wiring 602 of the TFT 628 is separated from a gate wiring 603 of the TFT 629 so that different gate signals can be supplied. On the other hand, a wiring 616 serving as a data line is shared by the TFTs 628 and 629. The thin film transistors shown in Embodiment Mode 1 can be used as appropriate for the TFTs 628 and 629.

Figure 30:
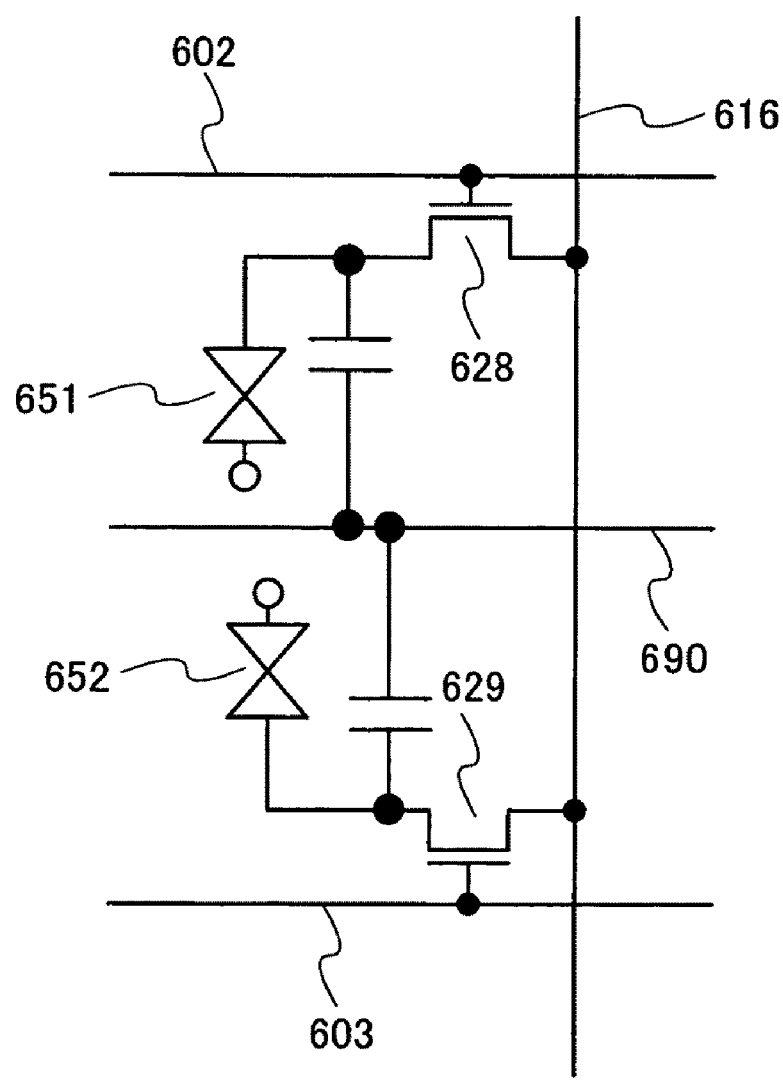
FIG. 30 is a diagram illustrating a liquid crystal display device of the present invention.

The shape of the pixel electrode 624 is different from that of the pixel electrode 626, and the pixel electrodes are separated by slits 625. The pixel electrode 626 surrounds the pixel electrode 624, which has a V-shape. The TFTs 628 and 629 make the timing of applying voltages to the pixel electrodes 624 and 626 different from each other, thereby controlling alignment of liquid crystals. FIG. 30 shows an equivalent circuit of this pixel structure. The TFT 628 is connected to the gate wiring 602, and the TFT 629 is connected to the gate wiring 603. If different gate signals are supplied to the gate wirings 602 and 603, operation timing of the TFTs 628 and 629 can be different.

Figure 29:
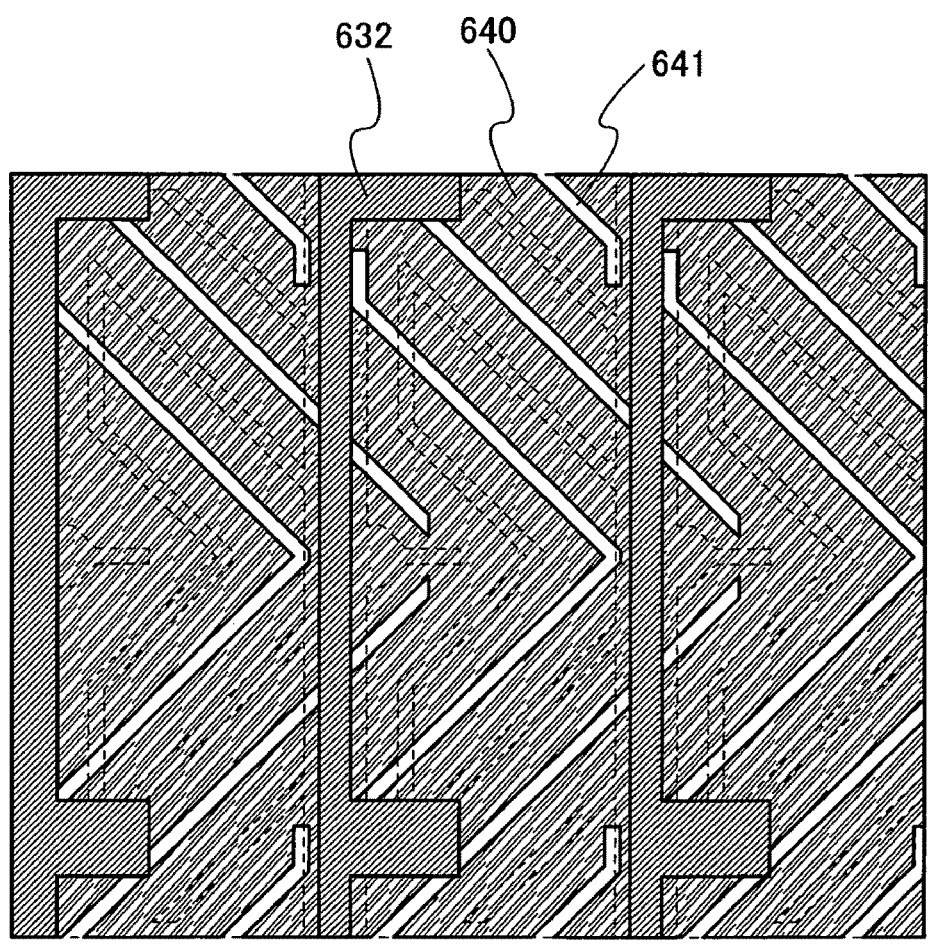
FIG. 29 is a diagram illustrating a liquid crystal display device of the present invention.

A counter substrate 601 is provided with a light blocking film 632, a second coloring layer 636, and a counter electrode 640. In addition, a planarizing film 637 is formed between the second colored film 636 and the counter electrode 640, thereby preventing alignment disorder of liquid crystals. FIG. 29 shows a structure of the counter substrate side. The counter electrode 640 is shared by plural pixels, and slits 641 are formed in the counter electrode 640. The slits 641 and the slits 625 on the pixel electrodes 624 and 625 side are disposed so as to engage, thereby effectively generating an oblique electric field to control alignment of liquid crystals. Accordingly, the direction in which liquid crystals are aligned is different depending on the location, and thus a viewing angle of the liquid crystal panel is increased.

The pixel electrode 624, the liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. Furthermore, the multi-domain structure is employed in which the first liquid crystal element and the second liquid crystal element are provided for one pixel.

Next, a liquid crystal display device in a horizontal electric field mode is shown. In a horizontal field effect mode, an electric field is applied in a horizontal direction with respect to liquid crystal molecules in a cell, whereby liquid crystals are driven to express gray scales. In accordance with this method, a viewing angle can be expanded to about 180°. Hereinafter, a liquid crystal display device in the horizontal electric field mode is described.

Figure 31:
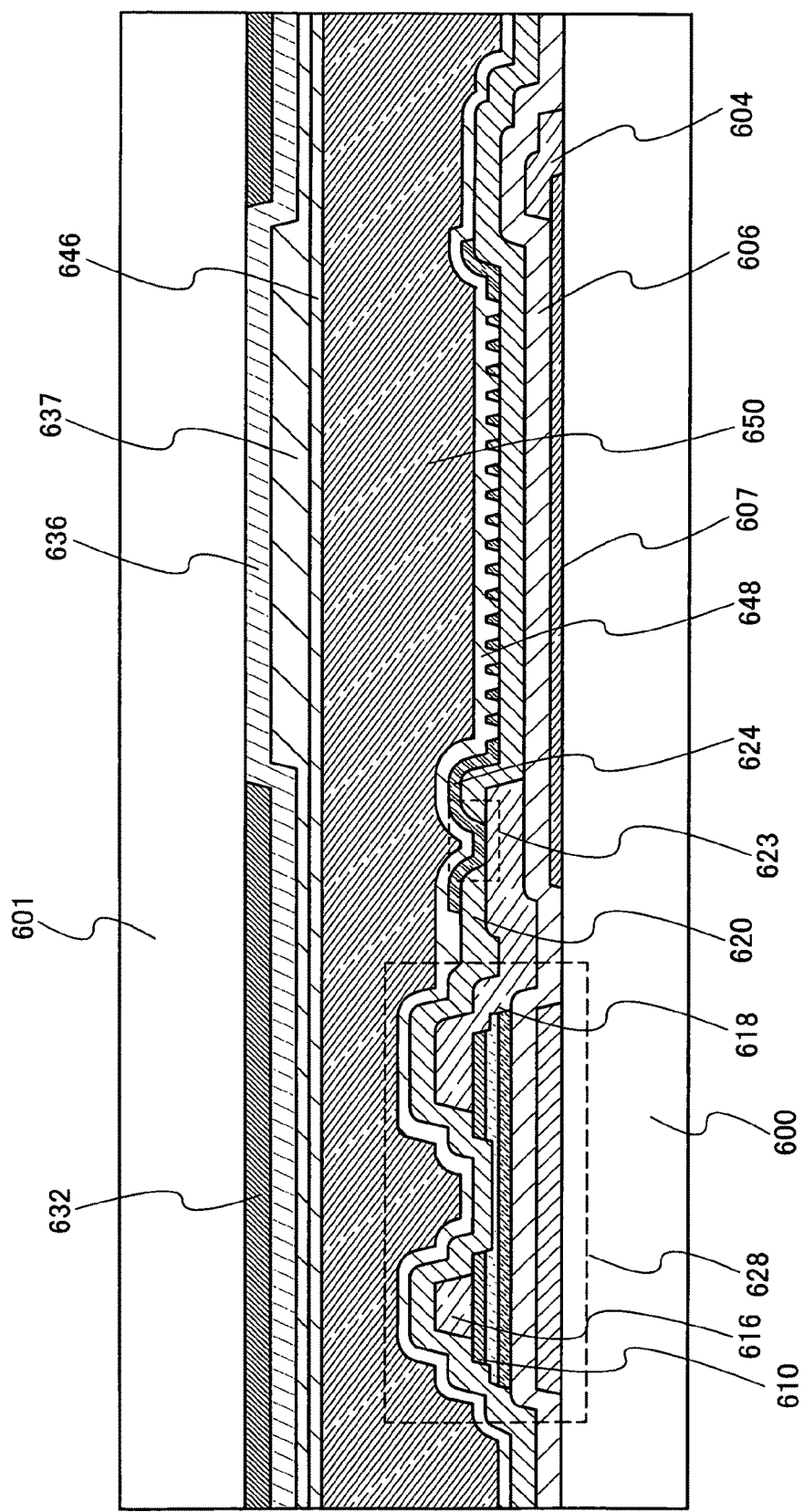
FIG. 31 is a diagram illustrating a liquid crystal display device of the present invention.

In FIG. 31, a counter substrate 601 is superposed on a substrate 600, over which a TFT 628 and a pixel electrode 624 connected to the TFT 628 are formed, and liquid crystals are injected therebetween. The counter substrate 601 is provided with a light blocking film 632, a second colored film 636, a planarizing film 637, and the like. The pixel electrode is provided for the substrate 600, and not for the counter substrate 601. A liquid crystal layer 650 is formed between the substrate 600 and the counter substrate 601.

A first pixel electrode 607, a capacitor wiring 604 connected to the first pixel electrode 607, and the TFT 628 shown in Embodiment Mode 1 are formed over the substrate 600. The first pixel electrode 607 can be formed using a similar material to the pixel electrode 77 shown in Embodiment Mode 1. The first pixel electrode 607 is compartmentalized almost in a pixel form. A gate insulating film 606 is formed over the first pixel electrode 607 and the capacitor wiring 604.

Wirings 616 and 618 of the TFT 628 are formed over the gate insulating film 606. The wiring 616 is a data line through which a video signal travels, extends in one direction in a liquid crystal panel, is connected to a source or drain regions 610, and functions as one of source and drain electrodes. The wiring 618 functions as the other of source and drain electrodes and is connected to the second pixel electrode 624.

A second insulating film 620 is formed over the wirings 616 and 618. Further, the second pixel electrode 624 that is connected to the wiring 618 in a contact hole formed in the insulating film 620 is formed over the insulating film 620. The pixel electrode 624 is formed in a similar material to the pixel electrode 77 shown in Embodiment Mode 1.

In the above manner, the TFT 628 and the first pixel electrode 624 connected to the TFT 628 are formed over the substrate 600. A holding capacitor is formed between the first pixel electrode 607 and the second pixel electrode 624.

Figure 32:
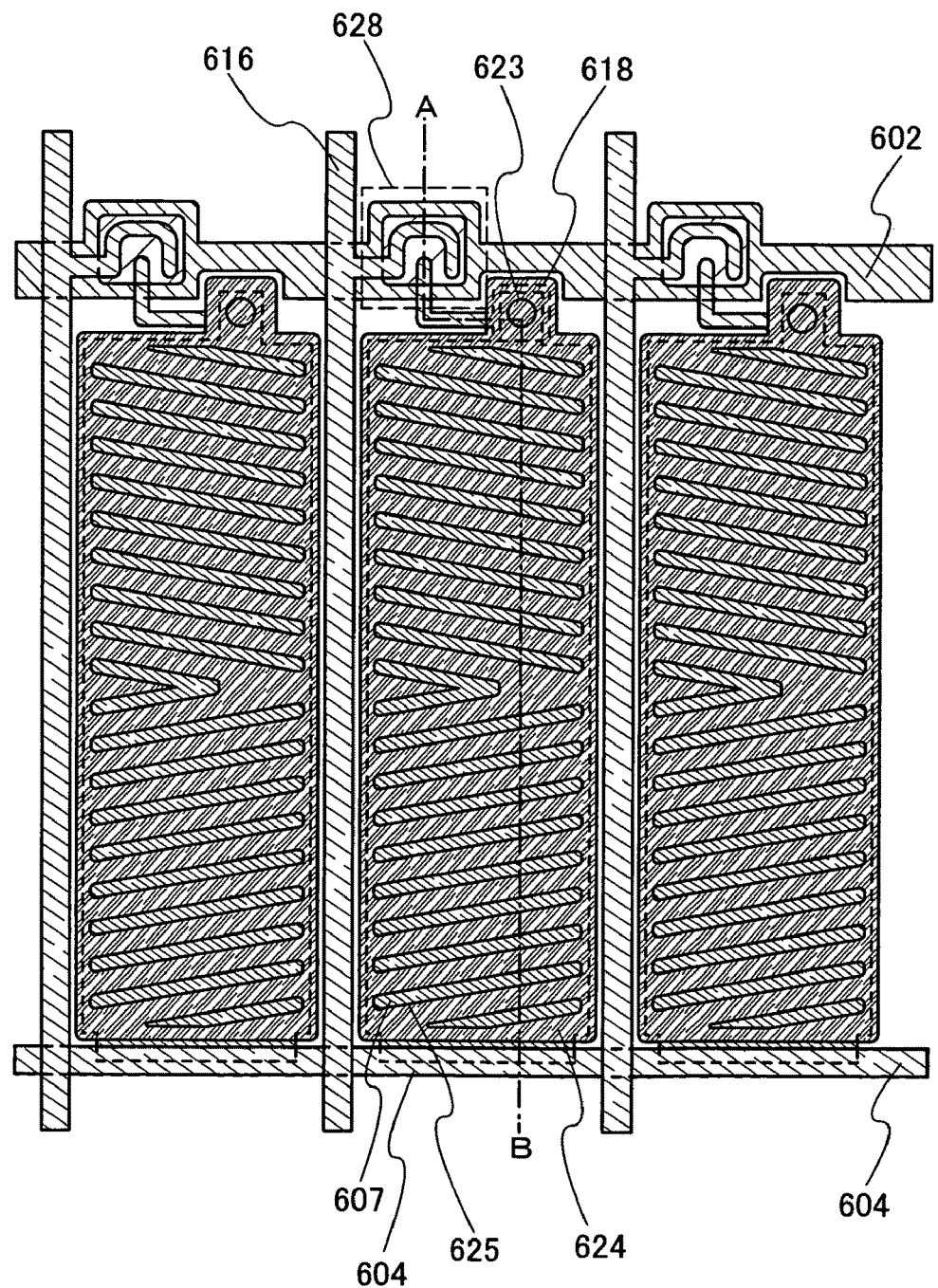
FIG. 32 is a diagram illustrating a liquid crystal display device of the present invention.

FIG. 32 is a plan view illustrating a structure of the pixel electrode. The pixel electrode 624 is provided with slits 625. The slits 625 are provided to control alignment of liquid crystals. In this case, an electric field is generated between the first pixel electrode 607 and the second pixel electrode 624. The gate insulating film 606 is formed between the first pixel electrode 607 and the second pixel electrode 624; however, the gate insulating film 606 is formed with a thickness of from 50 to 200 nm, which is thin enough as compared with that of a liquid crystal layer with a thickness of 2 to 10 μm. Therefore, an electric field is generated in a direction which is substantially parallel to the substrate 600 (a horizontal direction). The alignment of the liquid crystals is controlled with this electric field. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased. In addition, the aperture ratio can be improved since both the first pixel electrode 607 and the second pixel electrode 624 are light-transmitting electrodes.

Next, a different example of a liquid crystal display device in a horizontal electric field mode is shown.

Figure 33:
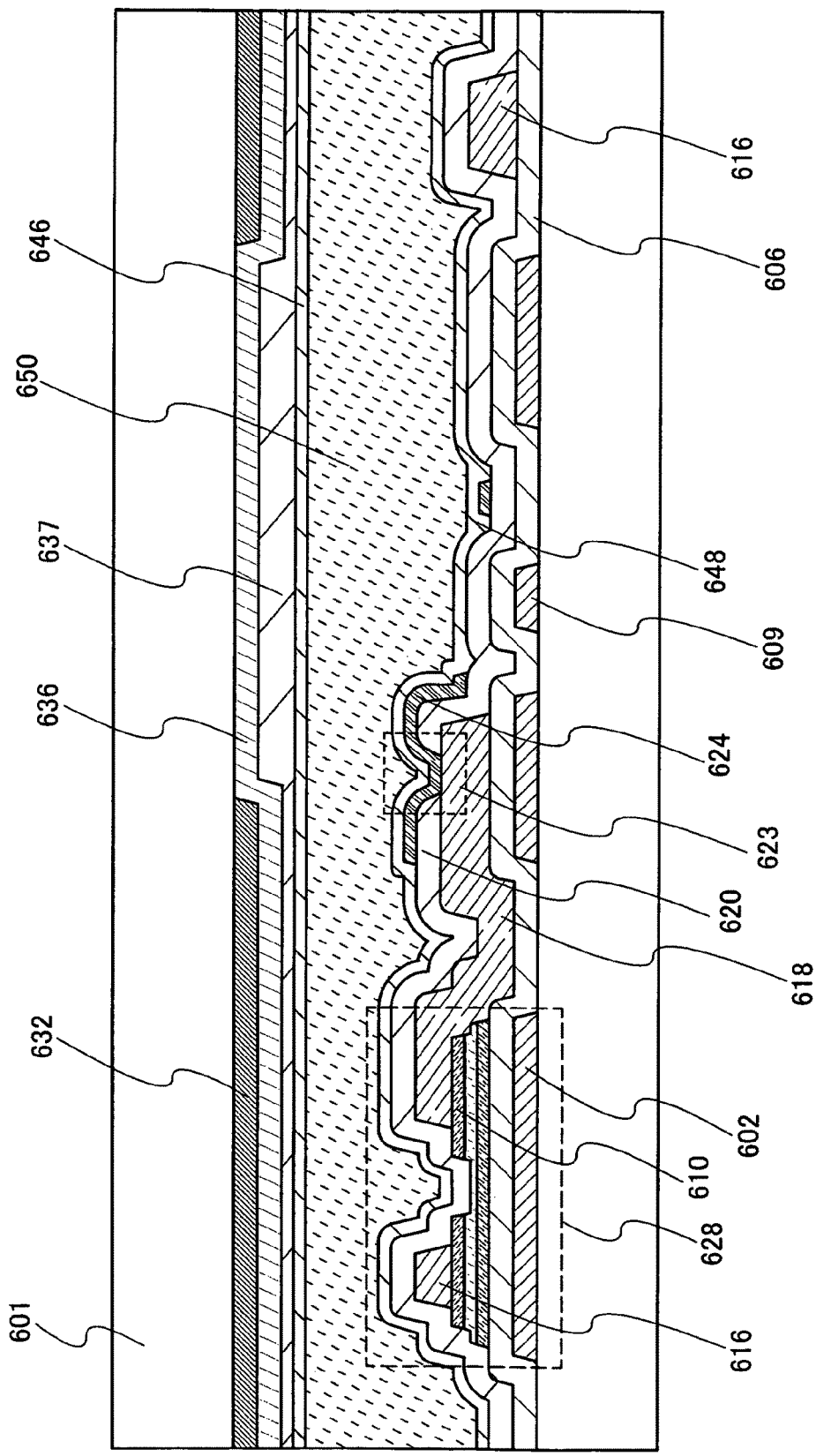
FIG. 33 is a diagram illustrating a liquid crystal display device of the present invention.
Figure 34:
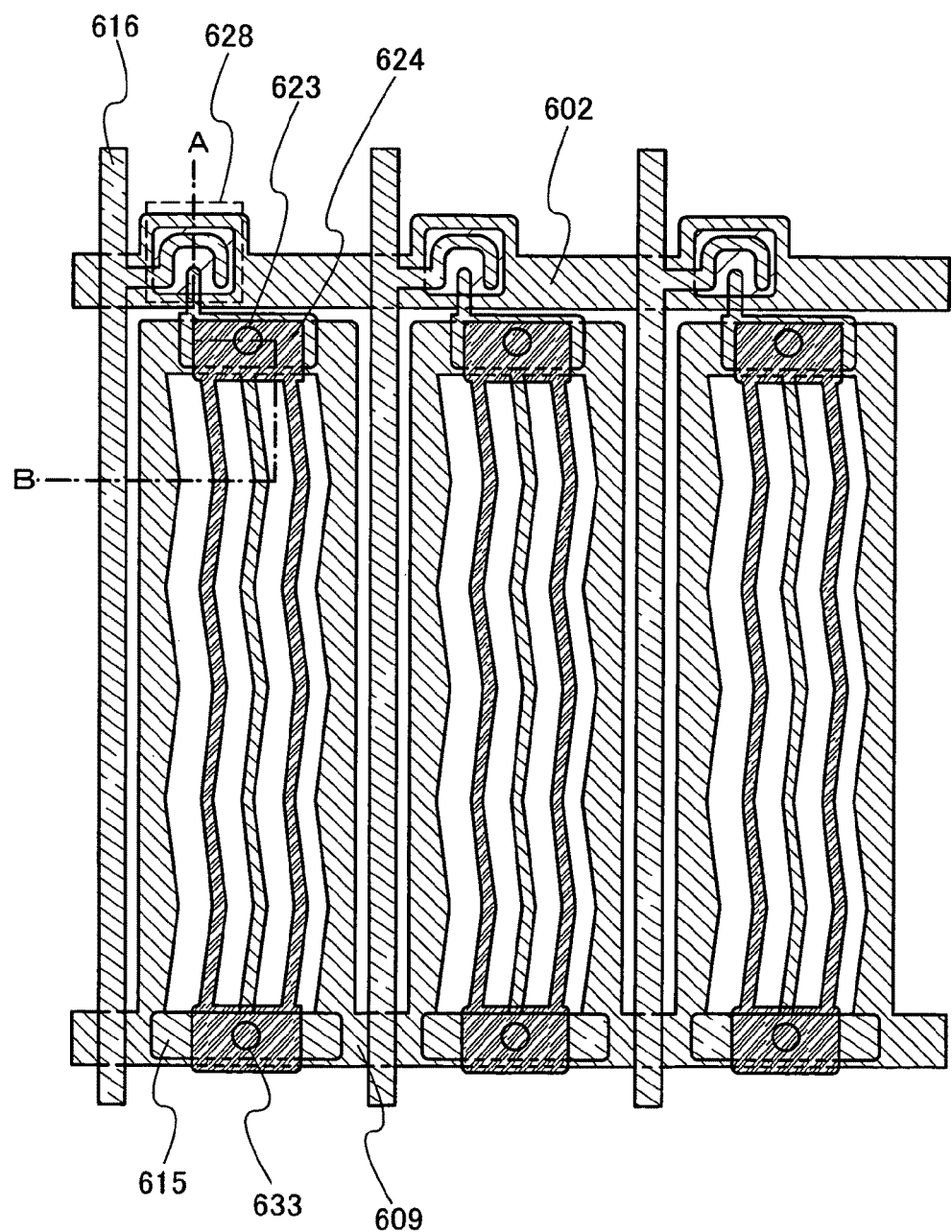
FIG. 34 is a diagram illustrating a liquid crystal display device of the present invention.

FIGS. 33 and 34 illustrate a pixel structure of a liquid crystal display device in an IPS mode. FIG. 34 is a plan view, and FIG. 33 shows a cross-sectional structure taken along a line A-B in FIG. 34. Hereinafter, description is made with reference to both the diagrams.

In FIG. 33, a counter substrate 601 is superposed on a substrate 600, over which a TFT 628 and a pixel electrode 624 connected to the TFT 628 are formed, and liquid crystals are injected between the substrate 600 and the counter substrate 601. The counter substrate 601 is provided with a light blocking film 632, a second colored film 636, a planarizing film 637, and the like. The pixel electrode is provided for the substrate 600, and not for the counter substrate 601. A liquid crystal layer 650 is formed between the substrate 600 and the counter substrate 601.

A common potential line 609 and the TFT 628 shown in Embodiment Mode 1 are formed over the substrate 600. The common potential line 609 can be formed at the same time as forming a gate wiring 602 of the TFT 628. The second pixel electrode 624 is compartmentalized almost in a pixel form.

Wirings 616 and 618 of the TFT 628 are formed over a gate insulating film 606. The wiring 616 is a data line through which a video signal travels, extends in one direction in a liquid crystal panel, is connected to a source or drain region 610, and functions as one of source and drain electrodes. The wiring 618 functions as the other of source and drain electrodes and is connected to the second pixel electrode 624.

A second insulating film 620 is formed over the wirings 616 and 618. Further, the second pixel electrode 624 that is connected to the wiring 618 in a contact hole 623 formed in the insulating film 620 is formed over the insulating film 620. The pixel electrode 624 is formed in a similar material to the pixel electrode 77 shown in Embodiment Mode 1. As shown in FIG. 34, the pixel electrode 624 is formed such that the pixel electrode 624 and a comb-like electrode that is formed at the same time as the common potential line 609 can generate a horizontal electric field. Further, a comb-like portion of the pixel electrode 624 and the comb-like electrode that is formed at the same time as the common potential line 609 correspond to each other.

When an electric field is generated between the potential applied to the pixel electrode 624 and that of the common potential line 609, the alignment of liquid crystals is controlled with this electric field. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased.

In the above manner, the TFT 628 and the pixel electrode 624 connected to the TFT 628 are formed over the substrate 600. A holding capacitor is formed by providing the gate insulating film 606 between the common potential line 609 and a capacitor electrode 615. The capacitor electrode 615 is connected to the pixel electrode 624 through a contact hole 633.

Next, a mode of a liquid crystal display device in a TN mode is shown.

Figure 35:
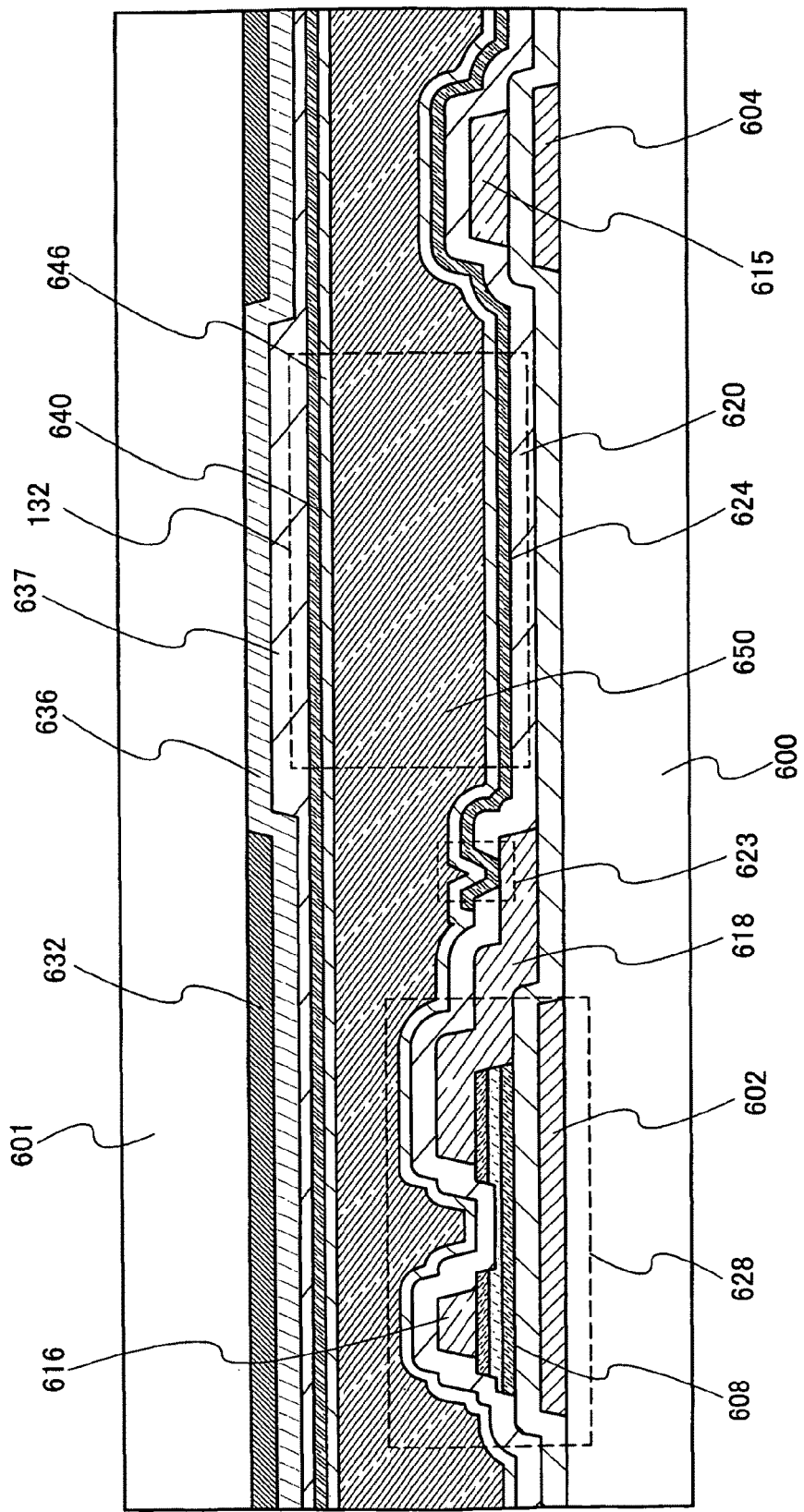
FIG. 35 is a diagram illustrating a liquid crystal display device of the present invention.
Figure 36:
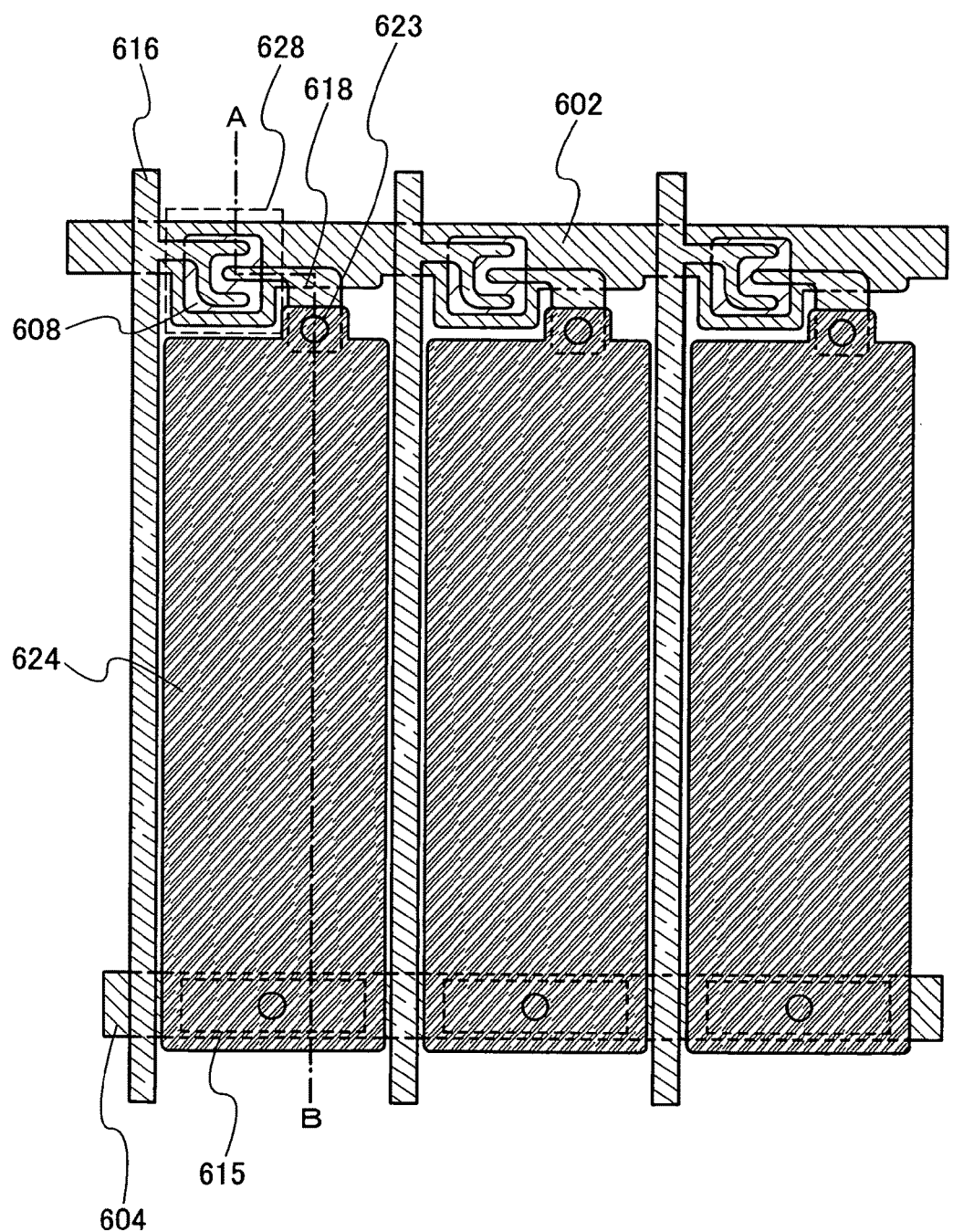
FIG. 36 is a diagram illustrating a liquid crystal display device of the present invention.

FIGS. 35 and 36 illustrate a pixel structure of a liquid crystal display device in a TN mode. FIG. 36 is a plan view, and FIG. 35 shows a cross-sectional structure taken along a line A-B in FIG. 36. Hereinafter, description is made with reference to both the diagrams.

A pixel electrode 624 is connected to a TFT 628 through a wiring 618 in a contact hole 623. A wiring 616 functioning as a data line is also connected to the TFT 628. Any TFT shown in Embodiment Mode 1 can be used for the TFT 628.

The pixel electrode 624 is formed using the pixel electrode 77 shown in Embodiment Mode 1.

A counter substrate 601 is provided with a light blocking film 632, a second colored film 636, and a counter electrode 640. In addition, a planarizing film 637 is formed between the second colored film 636 and the counter electrode 640 to prevent alignment disorder of liquid crystals. A liquid crystal layer 650 is formed between the pixel electrode 624 and the counter electrode 640.

The pixel electrode 624, the liquid crystal layer 650, and the counter electrode 640 overlap with each other, so that a liquid crystal element is formed.

The counter electrode 640 can be formed using a similar material to the pixel electrode 77 as appropriate. A liquid crystal element 132 corresponds to a region where the pixel electrode 624 and the counter electrode 640 sandwich the liquid crystal layer 650.

A color filter, a blocking film for preventing disclination (a black matrix), or the like may also be provided for a substrate 600 or the counter substrate 601. Further, a polarizing plate is attached to a surface of the substrate 600 which is opposite to the surface provided with the thin film transistor, and another polarizing plate is attached to a surface of the counter substrate 601 which is opposite to the surface provided with the counter electrode 640.

Through the above process, a liquid crystal display device can be manufactured. The liquid crystal display device in this embodiment mode has high contrast and high visibility because a thin film transistor with little off current, excellent electric characteristics, and high reliability is used in the liquid crystal display device.

Embodiment Mode 3

Next, a light-emitting device, which is one mode of a display device, is described with reference to FIGS. 9A and 9B, FIGS. 10A to 10C, FIGS. 11A and 11B, and 37A and 37B. Here, a light-emitting element utilizing electroluminescence is shown as a light-emitting device. Light-emitting element utilizing electroluminescence are classified into two types according to whether the light-emitting material is an organic compound or an inorganic compound. In general, the former is referred to as an organic EL element and the latter is referred to as an inorganic EL element. Although FIGS. 9A and 9B, FIGS. 10A to 10C, and FIGS. 11A and 11B are presented as a process for manufacturing a thin film transistor here, 1A to 1C, FIGS. 2A to 2C, FIGS. 3A to 3C, FIGS. 4A to 4C, FIGS. 5A to 5C, FIGS. 6A to 6C, FIGS. 7A and 7B, and FIGS. 8A to 8D or FIGS. 12A to 12C, FIGS. 13A to 13C, FIGS. 14A to 14C, FIG. 15, FIGS. 16A to 16D, FIG. 17, FIGS. 18A to 18C, and FIG. 19 can be referred to as appropriate.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. These carriers (electrons and holes) are recombined, so that the light-emitting organic compound is placed in an excited state. The light-emitting organic compound emits light in returning to a ground state from the excited state. Because of such mechanism, such a light-emitting element is called a light-emitting element of a current excitation type.

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission, in which inner-shell electron transition of a metal ion is utilized. Here, an organic EL element is described as a light-emitting element. Further, the channel-etched thin film transistor in FIGS. 10A to 10C is shown as a thin film transistor for controlling the drive of the light-emitting element. However, a channel protective thin film transistor can also be used as appropriate.

Figure 37A:
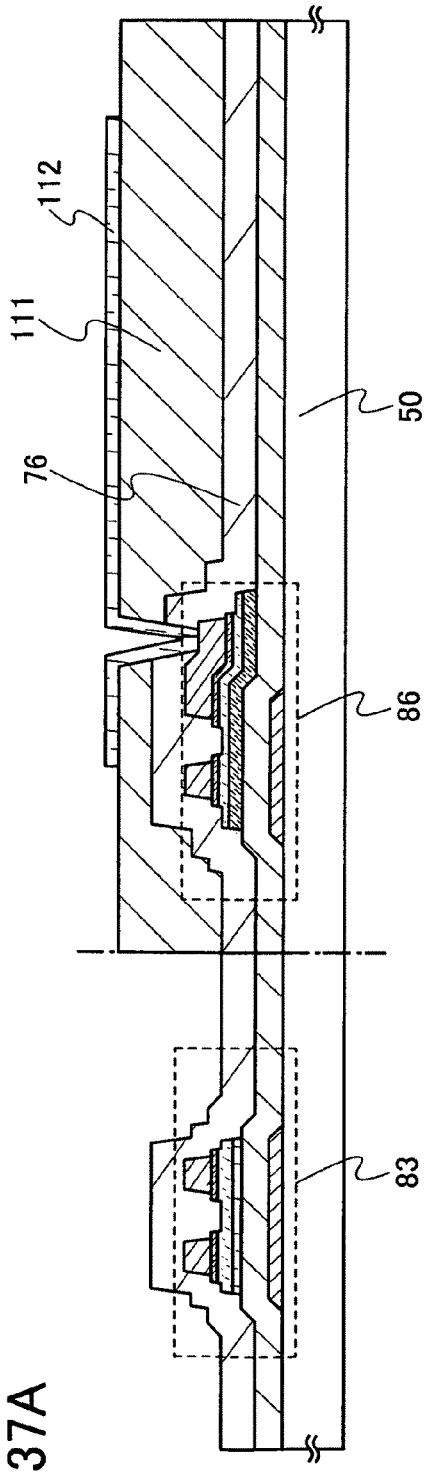
FIGS. 37A and 37B are cross-sectional views illustrating a method for manufacturing a light-emitting device of the present invention.
Figure 37B:
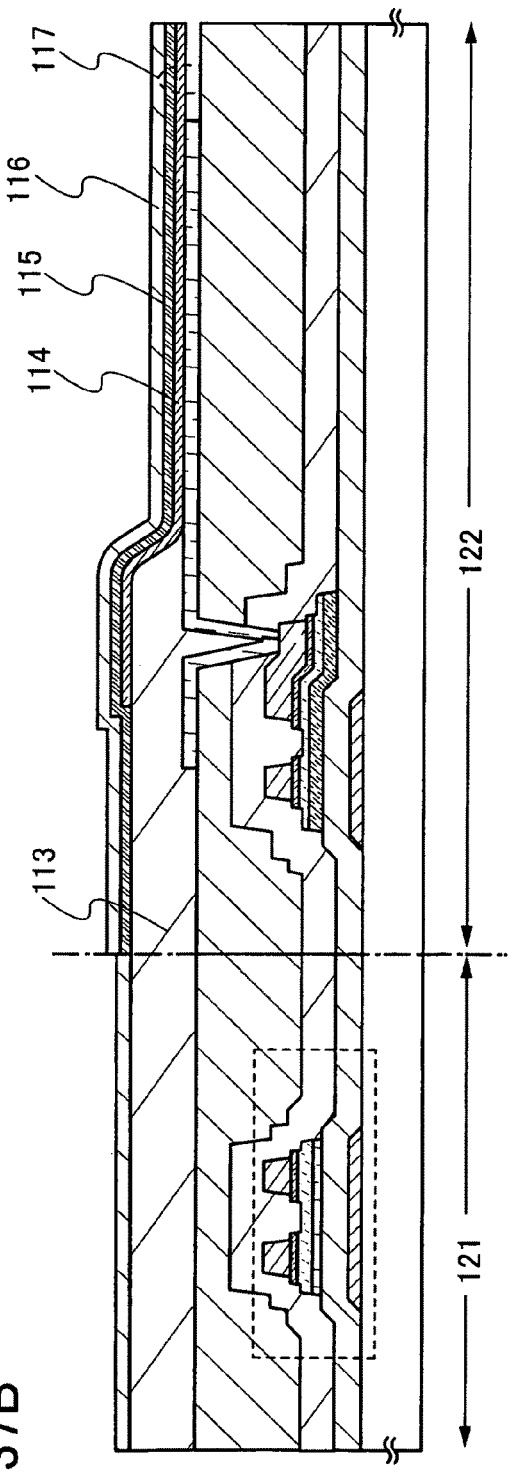

Through the steps shown in FIGS. 9A and 9B, FIGS. 10A to 10C, and FIGS. 11A and 11B, thin film transistors 83 and 86 are formed over a substrate 50, and an insulating film 76 serving as a protective film is formed over the thin film transistors 83 and 86, as shown in FIGS. 37A and 37B. Subsequently, a planarizing film 111 is formed over the insulating film 76, and a pixel electrode 112 that is connected to a source or drain electrode of the thin film transistor 86 is formed over the planarizing film 111.

It is preferable to form the planarizing film 111 using an organic resin such as acrylic, polyimide, or polyamide, or siloxane.

In FIG. 37A, it is preferable to use a cathode as the pixel electrode 112 because the thin film transistor of a pixel is an n-channel TFT; if the thin film transistor of the pixel is a p-channel TFT, it is preferable to use an anode as the pixel electrode 112. Specifically, for the cathode, a known material with a low work function, such as Ca, Al, CaF, MgAg, or AlLi can be used.

Subsequently, as shown in FIG. 37B, a partition wall 113 is formed over the planarizing film 111 and an end portion of the pixel electrode 112. The partition wall 113 has an opening portion, and the pixel electrode 112 is exposed in the opening portion. The partition wall 113 is formed using an organic resin film, an inorganic insulating film, or an organic polysiloxane film. In particular, it is preferable that the partition wall 113 be formed of a photosensitive material, and the opening portion be formed over the pixel electrode, and a side wall of the opening portion form an inclined surface with a continuous curvature.

Then, a light-emitting layer 114 is formed so as to be in contact with the pixel electrode 112 in the opening portion of the partition wall 113. The light-emitting layer 114 may be formed using a single layer or by stacking a plurality of layers.

Subsequently, a common electrode 115 is formed using an anode material so as to cover the light-emitting layer 114. The common electrode 115 can be formed using a light-transmitting conductive film which is formed using a light-transmitting conductive material and is given as the pixel electrode 77 in Embodiment Mode 1. The common electrode 115 may also be formed using a titanium nitride film or a titanium film instead of the above light-transmitting conductive film. In FIG. 37B, the common electrode 115 is formed using ITO. In the opening portion of the partition wall 113, the pixel electrode 112, the light-emitting layer 114, and the common electrode 115 overlap with each other, so that a light-emitting element 117 is formed. After that, a protective film 116 is preferably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Further, in a practical case, it is preferable that a display device completed to the state illustrated in FIG. 37B be packaged (sealed) with a protective film (such as a laminated film or an ultraviolet curable resin film) or a cover material with high air-tightness and little degasification so that the display device is not exposed to outside air.

Next, a structure of a light-emitting element is described with reference to FIGS. 38A to 38C. A cross-sectional structure of a pixel is described by taking an n-channel driving TFT as an example.

In order to extract light emission of the light-emitting element, at least one of an anode and a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element having the top emission structure is described with reference to FIG. 38A.

Figure 38A:
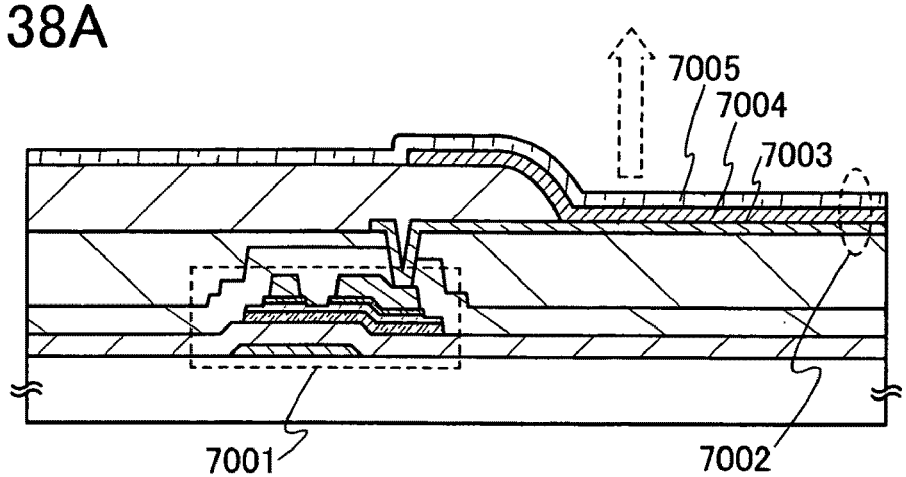
FIGS. 38A to 38C are cross-sectional views which each illustrate a pixel applicable to a light-emitting device of the present invention.

FIG. 38A is a cross-sectional view of a pixel in a case where a driving TFT 7001 is an n-channel TFT, and light generated in a light-emitting element 7002 is emitted to pass through an anode 7005. In FIG. 38A, a cathode 7003 of the light-emitting element 7002 and the driving TFT 7001 are electrically connected to each other. An electroluminescence layer 7004 and the anode 7005 are stacked in order over the cathode 7003. As the cathode 7003, a known conductive film can be used as long as it has a low work function and reflects light. For example, Ca, Al, CaF, MgAg, AlLi, or the like is preferably used. The electroluminescence layer 7004 may be formed using a single layer or by stacking a plurality of layers. If the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The light-emitting element 7002 corresponds to a region where the cathode 7003 and the anode 7005 sandwich the electroluminescence layer 7004. In the pixel illustrated in FIG. 38A, light generated in the light-emitting element 7002 is emitted to pass through the anode 7005 as shown with an outline arrow.

Then, a light-emitting element having the bottom emission structure is described with reference to FIG. 38B. FIG. 38B is a cross-sectional view of a pixel in a case where a driving TFT 7011 is an n-channel TFT, and light generated in a light-emitting element 7012 is emitted to pass through a cathode 7013. In FIG. 38B, the cathode 7013 of the light-emitting element 7012 is formed over a light-transmitting conductive film 7017 that is electrically connected to the driving TFT 7011, and an electroluminescence layer 7014 and an anode 7015 are stacked in order over the cathode 7013. A blocking film 7016 for reflecting or blocking light may be formed so as to cover the anode 7015 when the anode 7015 has a light-transmitting property. As the cathode 7013, a known conductive film can be used as in the case of FIG. 38A as long as it has a low work function. The cathode 7013 has a thickness that can transmit light (preferably, about 5 to 30 nm). For example, an Al film having a thickness of 20 nm can be used as the cathode 7013. The electroluminescence layer 7014 may be formed of a single layer or by stacking a plurality of layers as in the case of FIG. 38A. The anode 7015 is not required to transmit light, but can be formed using a light-transmitting conductive film as in the case of FIG. 38A. For the blocking film 7016, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the electroluminescence layer 7014. In the pixel illustrated in FIG. 38B, light generated in the light-emitting element 7012 is emitted to pass through the cathode 7013 as shown with an outline arrow.

Next, a light-emitting element having the dual emission structure is described with reference to FIG. 38C. In FIG. 38C, a cathode 7023 of a light-emitting element 7022 is formed over a light-transmitting conductive film 7027 that is electrically connected to a driving TFT 7021, and a electroluminescence layer 7024 and an anode 7025 are stacked in order over the cathode 7023. As the cathode 7023, a known conductive film can be used as long as it has a low work function as in the case of FIG. 38A. The cathode 7023 has a thickness that can transmit light. For example, an Al film having a thickness of 20 nm can be used as the cathode 7023. The electroluminescence layer 7024 may be formed using a single layer or by stacking a plurality of layers as in the case of FIG. 38A. The anode 7025 can be formed using a light-transmitting conductive film as in the case of FIG. 38A.

The light-emitting element 7022 corresponds to a region where the cathode 7023 and the anode 7025 sandwich the electroluminescence layer 7024. In the pixel illustrated in FIG. 38C, light generated in the light-emitting element 7022 is emitted to pass through both the anode 7025 and the cathode 7023 as shown with outline arrows.

Although an organic EL element is described as a light-emitting element, it is also possible to provide an inorganic EL element as a light-emitting element.

This embodiment mode describes an example in which a thin film transistor for controlling the drive of a light-emitting element (the driving TFT) is electrically connected to the light-emitting element. However, a current control TFT may be formed between the driving TFT and the light-emitting element to be connected to them.

Figure 38B:
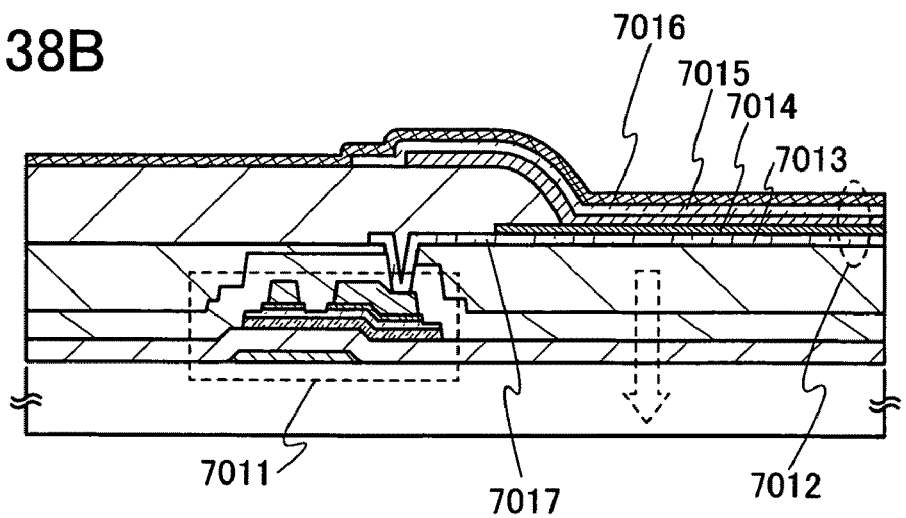
Figure 38C:
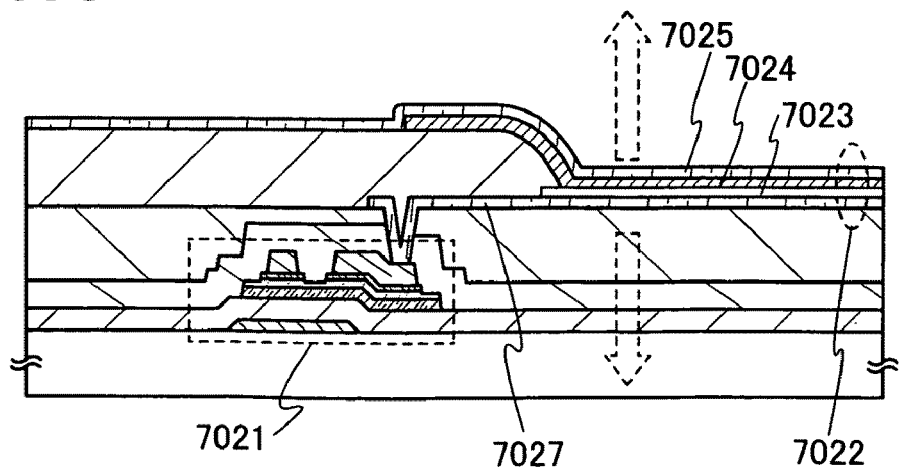

A light-emitting device described in this embodiment mode is not limited to the structures illustrated in FIGS. 38A to 38C, and can be modified in various ways based on the spirit of techniques according to the present invention.

Through the above process, a display device can be manufactured. The light-emitting device in this embodiment mode has high contrast and high visibility because a thin film transistor with little off current, excellent electric characteristics, and high reliability is used in the light-emitting device.

Embodiment Mode 4

This embodiment mode describes a structure of a display panel, which is one mode of a display device of the present invention.

Figure 39A:
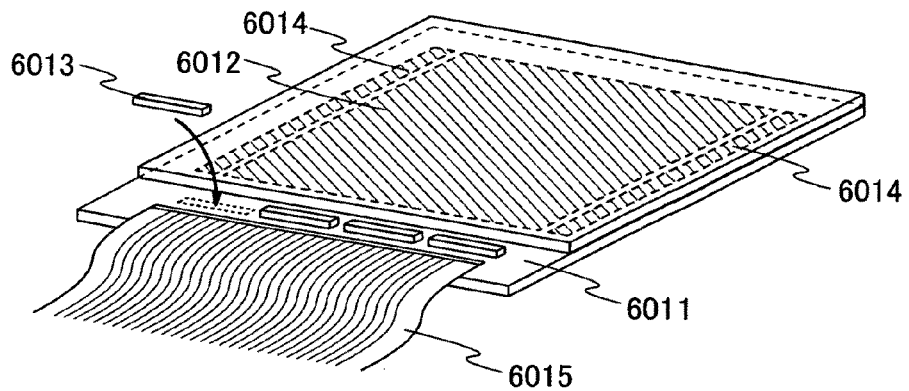
FIGS. 39A to 39C are perspective views illustrating display panels of the present invention.

FIG. 39A illustrates a mode of a display panel in which a pixel portion 6012 formed over a substrate 6011 is connected to a signal line driver circuit 6013 that is formed separately. The pixel portion 6012 and a scanning line driver circuit 6014 are formed using thin film transistors in which microcrystalline semiconductor films are used for channel formation regions. By forming the signal line driver circuit with a thin film transistor by which higher mobility can be obtained compared to the thin film transistor in which the microcrystalline semiconductor film is used for the channel formation region, operation of the signal line driver circuit, which demands a higher driving frequency than that of the scanning line driver circuit, can be stabilized. The signal line driver circuit 6013 may be formed using a thin film transistor including a single-crystalline semiconductor, a thin film transistor including a polycrystalline semiconductor, or a thin film transistor including an SOI. The pixel portion 6012, the signal line driver circuit 6013, and the scanning line driver circuit 6014 are each supplied with potential of a power source, a variety of signals, and the like through an FPC 6015.

Both the signal driver circuit and the scanning line driver circuit may be formed over the same substrate as that of the pixel portion.

Figure 39B:
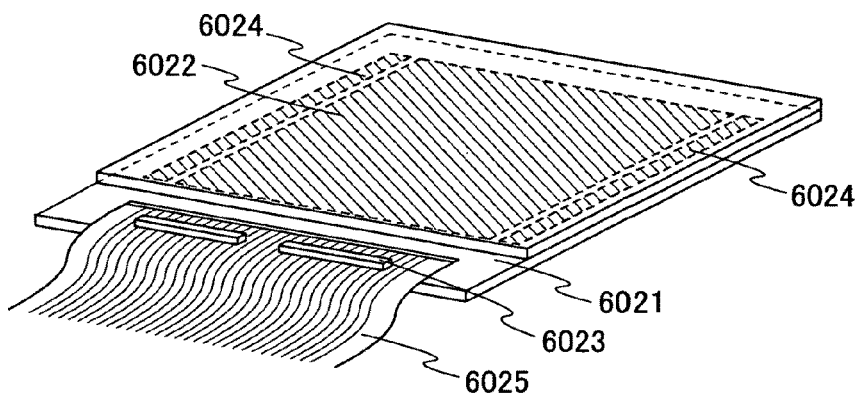

Further, when the driver circuit is formed separately, a substrate provided with the driver circuit is not always required to be attached to a substrate provided with the pixel portion, and may be attached to, for example, the FPC. FIG. 39B illustrates a mode of a panel of a display device in which a signal line driver circuit 6023 is formed separately and is connected to a pixel portion 6022 and a scanning line driver circuit 6024 that are formed over a substrate 6021. The pixel portion 6022 and the scanning line driver circuit 6024 are formed using thin film transistors in which microcrystalline semiconductor films are used for channel formation regions. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025.

Figure 39C:
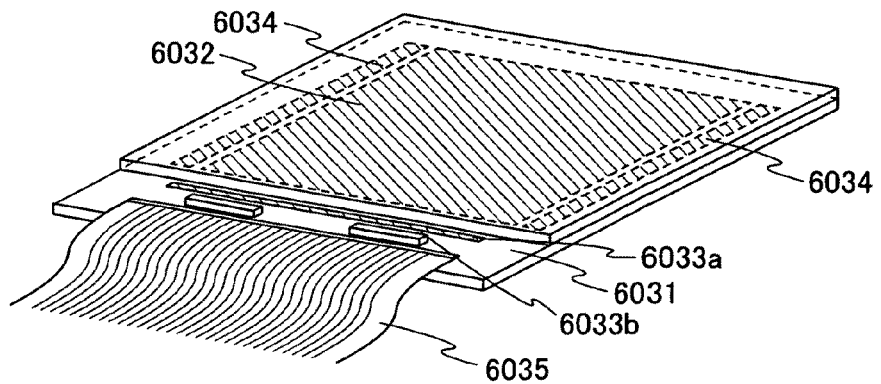

Furthermore, only a part of the signal line driver circuit or only a part of the scanning line driver circuit may be formed over the same substrate as that of the pixel portion with use of a thin film transistor in which a microcrystalline semiconductor film is used for a channel formation region, and the rest may be formed separately and electrically connected to the pixel portion. FIG. 39C illustrates a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are formed using thin film transistors in which microcrystalline semiconductor films are used for channel formation regions. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035.

As illustrated in FIGS. 39A to 39C, in the display device of the present invention, an entire driver circuit or a part thereof can be formed over the same substrate as that of a pixel portion, using a thin film transistor in which an microcrystalline semiconductor films is used for a channel formation region.

Note that there are no particular limitations on a connection method of a substrate formed separately, and a known method such as a COG method, a wire bonding method, or a TAB method can be used. Further, a connection position is not limited to the position illustrated in FIGS. 39A to 39C as long as electrical connection is possible. Further, a controller, a CPU, a memory, or the like may be formed separately and connected.

The signal line driver circuit used in the present invention is not limited to a mode having only a shift register and an analog switch. In addition to the shift register and the analog switch, another circuit such as a buffer, a level shifter, or a source follower may be included. Further, the shift register and the analog switch are not always required to be provided, and for example, a different circuit such as a decoder circuit by which selection of signal lines is possible may be used instead of the shift register, or a latch or the like may be used instead of the analog switch.

Figure 42:
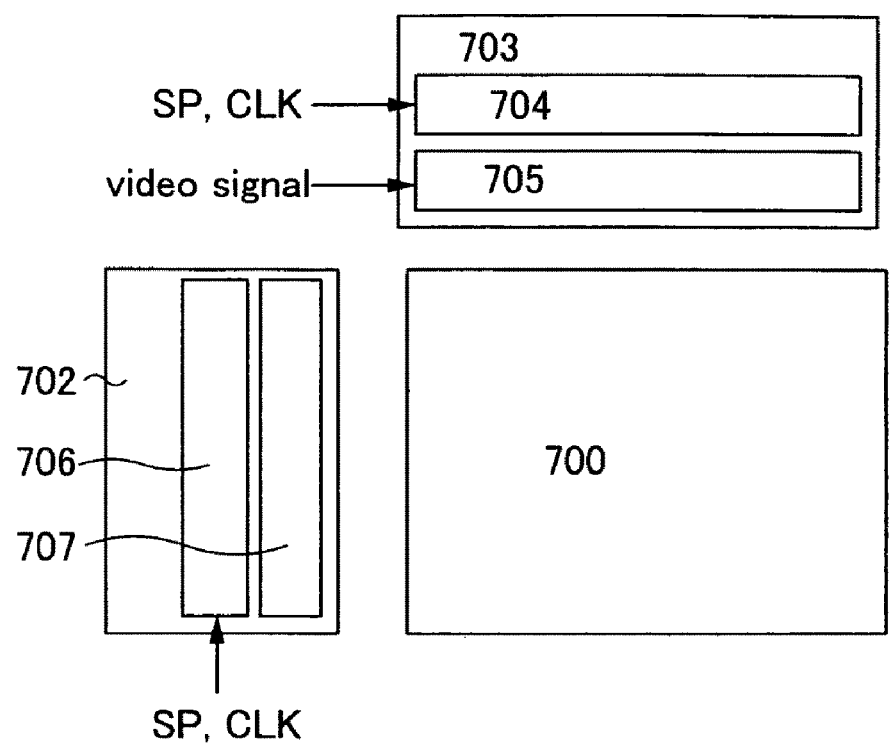
FIG. 42 is a block diagram illustrating a structure of a display device of present invention.

FIG. 42 is a block diagram of a liquid crystal display device of the present invention. The display device illustrated in FIG. 42 includes a pixel portion 700 including a plurality of pixels that is each provided with a display element; a scanning line driver circuit 702 that selects each pixel; and a signal line driver circuit 703 that controls a video signal input to a selected pixel.

In FIG. 42, the signal line driver circuit 703 includes a shift register 704 and an analog switch 705. A clock signal (CLK) and a start pulse signal (SP) are input to the shift register 704. When the clock signal (CLK) and the start pulse signal (SP) are input, a timing signal is generated in the shift register 704, and input to the analog switch 705.

Further, a video signal is input to the analog switch 705. The analog switch 705 samples the video signal according to the input timing signal and distributes the video signal to signal lines of latter stages.

Next, a configuration of the scanning line driver circuit 702 is described. The scanning line driver circuit 702 includes a shift register 706 and a buffer 707. Further, a level shifter may be included. In the scanning line driver circuit 702, a selection signal is generated by inputting a clock signal (CLK) and a start pulse signal (SP) to the shift register 706. The generated selection signal is buffer-amplified in the buffer 707, and then supplied to a corresponding scanning line. Gates of transistors in pixels of one line are connected to the scanning line. Further, since the transistors in the pixels of one line have to be turned on at the same time, a buffer to which a large current can be fed is used for the buffer 707.

In a full color liquid crystal display device, when video signals corresponding to R (red), G (green), and B (blue) are sampled in sequence and are each supplied to a corresponding signal line, the number of terminals for connecting the shift register 704 and the analog switch 705 corresponds to about ⅓ of that of terminals for connecting the analog switch 705 to the signal lines of the pixel portion 700. Consequently, by forming the analog switch 705 and the pixel portion 700 over the same substrate, the number of terminals used for connecting a substrate over which a pixel portion is formed to a substrate which is formed separately can be suppressed compared to a case of forming the analog switch 705 and the pixel portion 700 over different substrates, and occurrence probability of poor connection can be suppressed, and the yield can be increased.

Although the scanning line driver circuit 702 in FIG. 42 includes the shift register 706 and the buffer 707, the scanning line driver circuit 702 may be constituted of only the shift register 706.

Note that the configuration illustrated in FIG. 42 is merely a mode of a display device of the present invention, and the configurations of a signal line driver circuit and a scanning line driver circuit are not limited thereto.

Figure 43:
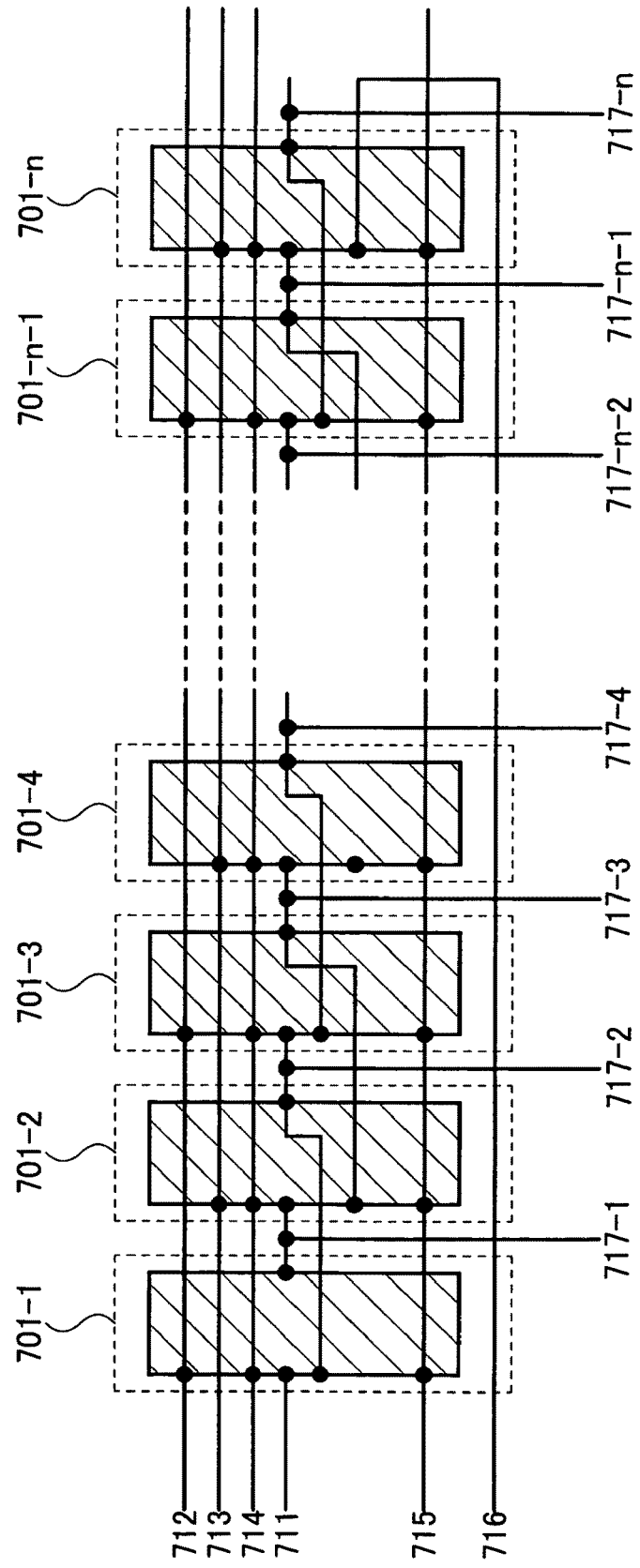
FIG. 43 is an equivalent circuit view illustrating a structure of a driver circuit of a display device of the present invention.

Next, a mode of a shift register including thin film transistors with the same polarity in which LPSAS films are used for channel formation regions is described with reference to FIGS. 43 and 44. FIG. 43 illustrates a structure of the shift register of this embodiment mode. The shift register shown in FIG. 43 includes a plurality of flip-flops 701-$i$ (any one of flip-flops 701-1 to 701-$n$). Further, the shift register operates by inputting a first clock signal, a second clock signal, a start pulse signal, and a reset signal.

Next, a connection relation of the shift register in FIG. 43 is described. In the flip-flop 701-$i$ in an i-th stage (any one of the flip-flops 701-1 to 701-$n$) of the shift register in FIG. 43, a first wiring 501 shown in FIG. 44 is connected to a seventh wiring 717-$i$−1; a second wiring 502 shown in FIG. 44 is connected to a seventh wiring 717-$i$+1; a third wiring 503 shown in FIG. 44 is connected to a seventh wiring 717-$i$; and a sixth wiring 506 shown in FIG. 44 is connected to a fifth wiring 715.

Figure 44:
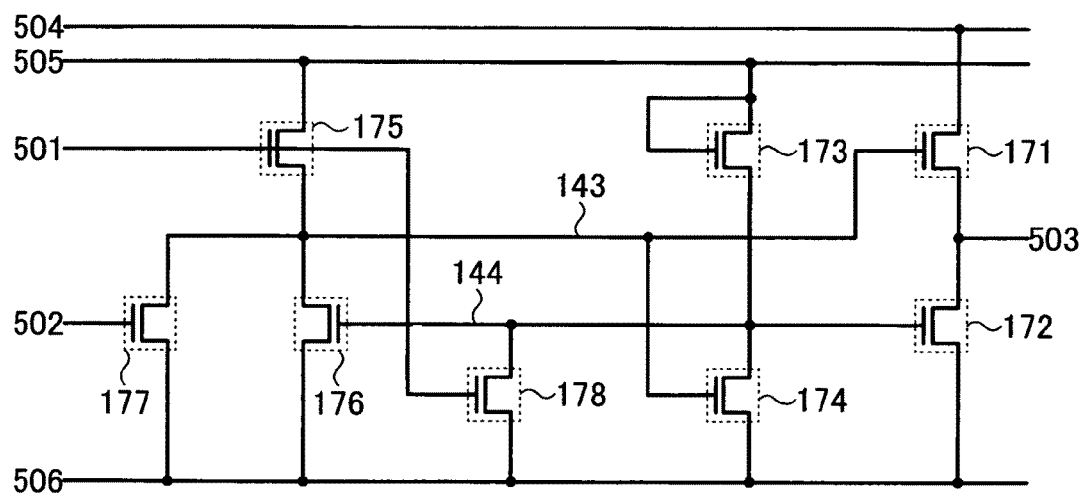
FIG. 44 is an equivalent circuit view illustrating a structure of a driver circuit of a display device of the present invention.

A fourth wiring 504 shown in FIG. 44 is connected to a second wiring 712 in a flip-flop in an odd-numbered stage, and is connected to a third wiring 713 in a flip-flop in an even-numbered stage. A fifth wiring 505 shown in FIG. 44 is connected to a fourth wiring 714.

The first wiring 501 shown in FIG. 44 of the flip-flop 701-1 in a first stage is connected to a first wiring 711, and the second wiring 502 shown in FIG. 44 of the flip-flop 701-$n$ in an n-th stage is connected to the sixth wiring 716.

The first wiring 711, the second wiring 712, the third wiring 713, and the sixth wiring 716 can be called a first signal line, a second signal line, a third signal line, and a fourth signal line, respectively. Further, the fourth wiring 714 and the fifth wiring 715 can be called a first power supply line and a second power supply line, respectively.

FIG. 44 illustrates the flip-flop shown in FIG. 43 in detail. The flip-flop shown in FIG. 44 includes a first thin film transistor 171, a second thin film transistor 172, a third thin film transistor 173, a fourth thin film transistor 174, a fifth thin film transistor 175, a sixth thin film transistor 176, a seventh thin film transistor 177, and an eighth thin film transistor 178. In this embodiment mode, the first thin film transistor 171, the second thin film transistor 172, the third thin film transistor 173, the fourth thin film transistor 174, the fifth thin film transistor 175, the sixth thin film transistor 176, the seventh thin film transistor 177, and the eighth thin film transistor 178 are n-channel transistors, and are brought into conduction when a voltage between a gate and a source ($V_{gs}$) exceeds a threshold voltage ($V_{th}$).

Next, a connection structure of the flip-flop shown in FIG. 43 is described below.

A first electrode (either a source electrode or a drain electrode) of the first thin film transistor 171 is connected to the fourth wiring 504, and a second electrode (either the source electrode or the drain electrode) of the first thin film transistor 171 is connected to the third wiring 503.

A first electrode of the second thin film transistor 172 is connected to the sixth wiring 506, and a second electrode of the second thin film transistor 172 is connected to the third wiring 503.

A first electrode of the third thin film transistor 173 is connected to the fifth wiring 505. A second electrode of the third thin film transistor 173 is connected to a gate electrode of the second thin film transistor 172. A gate electrode of the third thin film transistor 173 is connected to the fifth wiring 505.

A first electrode of the fourth thin film transistor 174 is connected to the sixth wiring 506. A second electrode of the fourth thin film transistor 174 is connected to the gate electrode of the second thin film transistor 172. A gate electrode of the fourth thin film transistor 174 is connected to a gate electrode of the first thin film transistor 171.

A first electrode of the fifth thin film transistor 175 is connected to the fifth wiring 505. A second electrode of the fifth thin film transistor 175 is connected to the gate electrode of the first thin film transistor 171. A gate electrode of the fifth thin film transistor 175 is connected to the first wiring 501.

A first electrode of the sixth thin film transistor 176 is connected to the sixth wiring 506. A second electrode of the sixth thin film transistor 176 is connected to the gate electrode of the first thin film transistor 171. A gate electrode of the sixth thin film transistor 176 is connected to the gate electrode of the second thin film transistor 172.

A first electrode of the seventh thin film transistor 177 is connected to the sixth wiring 506. A second electrode of the seventh thin film transistor 177 is connected to the gate electrode of the first thin film transistor 171. A gate electrode of the seventh thin film transistor 177 is connected to the second wiring 502. A first electrode of the eighth thin film transistor 178 is connected to the sixth wiring 506. A second electrode of the eighth thin film transistor 178 is connected to the gate electrode of the second thin film transistor 172. A gate electrode of the eighth thin film transistor 178 is connected to the first wiring 501.

A part where the gate electrode of the first thin film transistor 171, the gate electrode of the fourth thin film transistor 174, the second electrode of the fifth thin film transistor 175, the second electrode of the sixth thin film transistor 176, and the second electrode of the seventh thin film transistor 177 are connected to each other is a node 143. Further, a part where the gate electrode of the second thin film transistor 172, the second electrode of the third thin film transistor 173, the second electrode of the fourth thin film transistor 174, the gate electrode of the sixth thin film transistor 176, and the second electrode of the eighth thin film transistor 178 are connected to each other is a node 144.

The first wiring 501, the second wiring 502, the third wiring 503, and the fourth wiring 504 can be called the first signal line, the second signal line, the third signal line, and the fourth signal line, respectively. Further, the fifth wiring 505 and the sixth wiring 506 can be called the first power supply line and the second power supply line, respectively.

Figure 45:
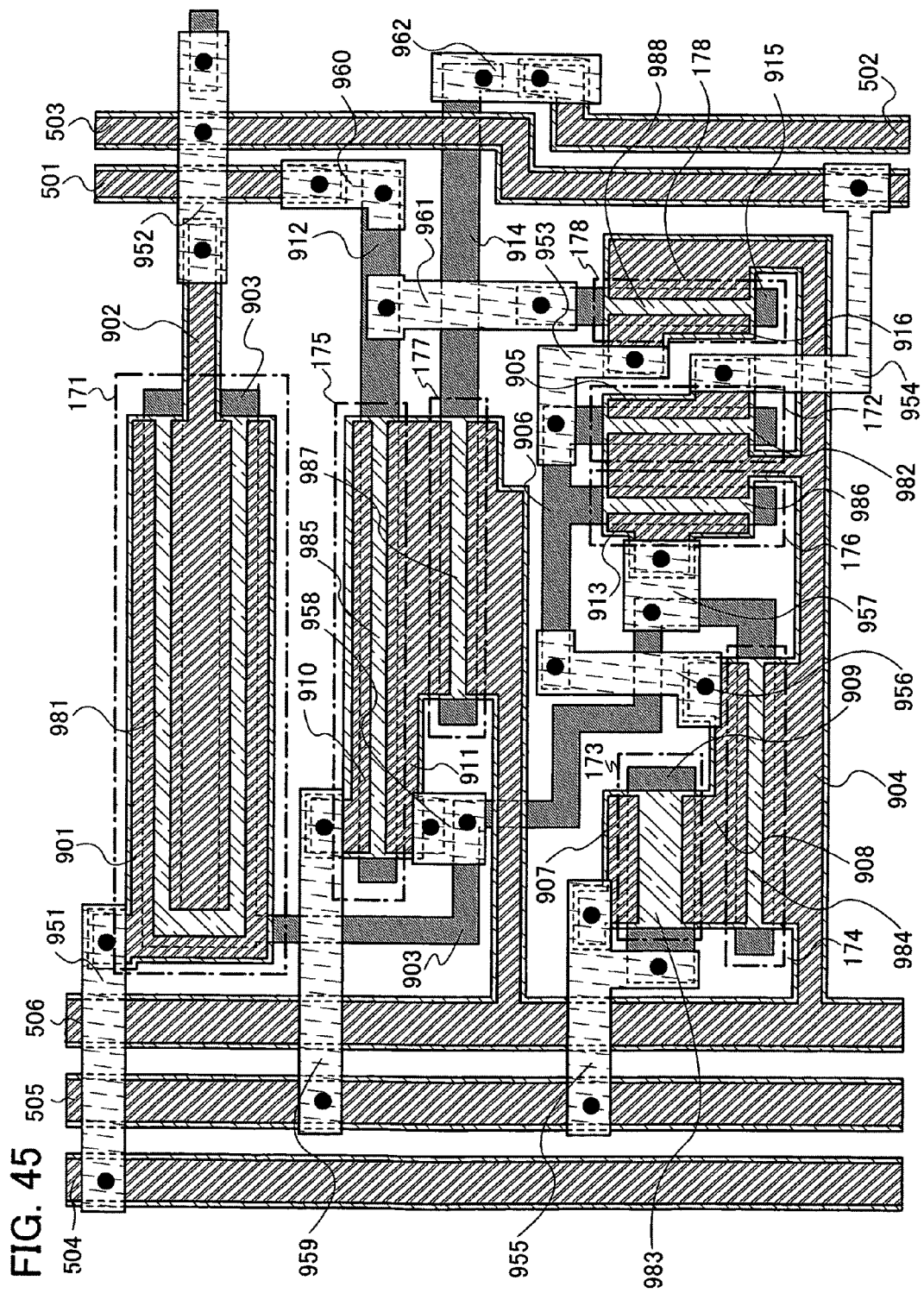
FIG. 45 is a top view illustrating a layout of a driver circuit of a display device of the present invention.

FIG. 45 illustrates an example of a top view of the flip-flop shown in FIG. 44.

A conductive film 901 includes a part which functions as the first electrode of the first thin film transistor 171. The conductive film 901 is connected to the fourth wiring 504 through a wiring 951 that is formed at the same time as a pixel electrode.

A conductive film 902 includes a part which functions as the second electrode of the first thin film transistor 171. The conductive film 902 is connected to the third wiring 503 through a wiring 952 that is formed at the same time as the pixel electrode.

A conductive film 903 includes a part which functions as the gate electrode of the first thin film transistor 171 and a part which functions as the gate electrode of the fourth thin film transistor 174.

A conductive film 904 includes a part which functions as the first electrode of the second thin film transistor 172, a part which functions as the first electrode of the sixth thin film transistor 176, a part which functions as the first electrode of the fourth thin film transistor 174, and a part which functions as the first electrode of the eighth thin film transistor 178. The conductive film 904 is connected to the sixth wiring 506.

A conductive film 905 includes a part which functions as the second electrode of the second thin film transistor 172. The conductive film 905 is connected to the third wiring 503 through a wiring 954 that is formed at the same time as the pixel electrode.

A conductive film 906 includes a part which functions as the gate electrode of the second thin film transistor 172 and a part which functions as the gate electrode of the sixth thin film transistor 176.

A conductive film 907 includes a part which functions as the first electrode of the third thin film transistor 173. The conductive film 907 is connected to the fifth wiring 505 through a wiring 955.

A conductive film 908 includes a part which functions as the second electrode of the third thin film transistor 173 and a part which functions as the second electrode of the fourth thin film transistor 174. The conductive film 908 is connected to the conductive film 906 through a wiring 956 that is formed at the same time as the pixel electrode.

A conductive film 909 includes a part which functions as the gate electrode of the third thin film transistor 173. The conductive film 909 is connected to the fifth wiring 505 through the wiring 955.

A conductive film 910 includes a part which functions as the first electrode of the fifth thin film transistor 175. The conductive film 910 is connected to the fifth wiring 505 through a wiring 959 that is formed at the same time as the pixel electrode.

A conductive film 911 includes a part which functions as the second electrode of the fifth thin film transistor 175 and a part which functions as the second electrode of the seventh thin film transistor 177. The conductive film 911 is connected to the conductive film 903 through a wiring 958 that is formed at the same time as the pixel electrode.

A conductive film 912 includes a part which functions as the gate electrode of the fifth thin film transistor 175. The conductive film 912 is connected to the first wiring 501 through a wiring 960 that is formed at the same time as the pixel electrode.

A conductive film 913 includes a part which functions as the second electrode of the sixth thin film transistor 176. The conductive film 913 is connected to the conductive film 903 through a wiring 957 that is formed at the same time as the pixel electrode.

A conductive film 914 includes a part which functions as the gate electrode of the seventh thin film transistor 177. The conductive film 914 is connected to the second wiring 502 through a wiring 962 that is formed at the same time as the pixel electrode.

A conductive film 915 includes a part which functions as the gate electrode of the eighth thin film transistor 178. The conductive film 915 is connected to the conductive film 912 through a wiring 961 that is formed at the same time as the pixel electrode.

A conductive film 916 includes a part which functions as the second electrode of the eighth thin film transistor 178. The conductive film 916 is connected to the conductive film 906 through a wiring 953 that is formed at the same time as the pixel electrode.

Parts of microcrystalline semiconductor films 981 to 988 function as channel formation regions of the first to eighth thin film transistors, respectively.

In a liquid crystal display device including a circuit as shown in FIGS. 42 to 44 including a thin film transistor in which LPSAS film is used for a channel formation region, the circuit can operate at high speed. For example, when a transistor in which an LPSAS film is used for a channel formation region is compared to a transistor in which an amorphous semiconductor film is used for a channel formation region, the former has higher mobility, and thus can have a higher driving frequency in a driver circuit (e.g., the shift register 706 in the scanning line driver circuit 702). The scanning line driver circuit 702 can operate at high speed, and thus increase in the frame frequency, black frame insertion, or the like can be realized.

When the frame frequency is increased, data for a screen is preferably generated in accordance with a direction of movement of an image. That is, motion compensation is preferably performed to interpolate data. When the frame frequency is increased and image data is interpolated in such a manner, display characteristics of moving images are improved, and smooth display can be performed. For example, when frame frequency is doubled (e.g., 120 Hz or 100 Hz) or more, and preferably quadrupled (e.g., 480 Hz or 400 Hz) or more, blurring and afterimages of moving images can be reduced. In this case, the scanning line driver circuit 702 is also operated with the driving frequency increased; thus, the frame frequency can be increased.

When black frame insertion is performed, such a structure is formed that image data or data for black display can be supplied to the pixel portion 700. Thus, display is performed in a method similar to impulse driving, and afterimages can be reduced. In this case, the scanning line driver circuit 702 is also operated with higher driving frequency, and thus, black frame insertion can be performed.

In addition, when the channel width of the thin film transistor in the scanning line driver circuit 702 is increased or a plurality of scanning line driver circuits are provided, for example, higher frame frequency can be realized. For example, the frame frequency can be octupled (e.g., 960 Hz or 800 Hz) or more. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized. As an example, the channel width of the second thin film transistor 172 is preferably greater than or equal to 300 μm, more preferably greater than or equal to 1000 μm.

When the circuit as shown in FIGS. 42 to 44 includes a transistor in which a microcrystalline semiconductor is used for a channel formation region, the layout area can be reduced. Accordingly, the area of a frame of a liquid crystal display device, which is an example of the display device, can be reduced. For example, a transistor in which an LPSAS film is used for a channel formation region has higher field effect mobility than a transistor in which an amorphous semiconductor film is used for a channel formation region; thus, the channel width of the transistor in which the LPSAS film is used for the channel formation region can be smaller. As a result, the frame of the liquid crystal display device can be narrow. As an example, the channel width of the second thin film transistor 172 is preferably less than or equal to 3000 μm, more preferably less than or equal to 2000 μm.

In the second thin film transistor 172 in FIG. 44, a period during which a low-level signal is output to the third wiring 503 is long. In this period, the second thin film transistor 172 is kept in an on state. Therefore, extreme stress is applied to the second thin film transistor 172, and characteristics of the transistor are likely to deteriorate. When the characteristics of the transistor deteriorate, the threshold voltage is gradually increased. Thus, a current value is decreased. In order to supply enough current even when the transistor deteriorates, the channel width of the second thin film transistor 172 is preferably large. Alternatively, compensation is preferably added so that a circuit operation is not affected even when the transistor deteriorates. For example, it is preferable that a transistor be provided in parallel with the second thin film transistor 172, and the transistor and the second thin film transistor 172 be alternately turned on, so that the deterioration is less likely to affect the switching characteristics.

Note that a transistor in which an LPSAS film is used for a channel formation region is less likely to deteriorate compared with a transistor in which an amorphous semiconductor film is used for a channel formation region. Accordingly, when an LPSAS film is used for a channel formation region, the channel width of the transistor can be reduced. Further, the transistor can operate normally without any circuit for compensation for deterioration. Accordingly, the layout area can be reduced.

Embodiment Mode 5

Figure 46A:
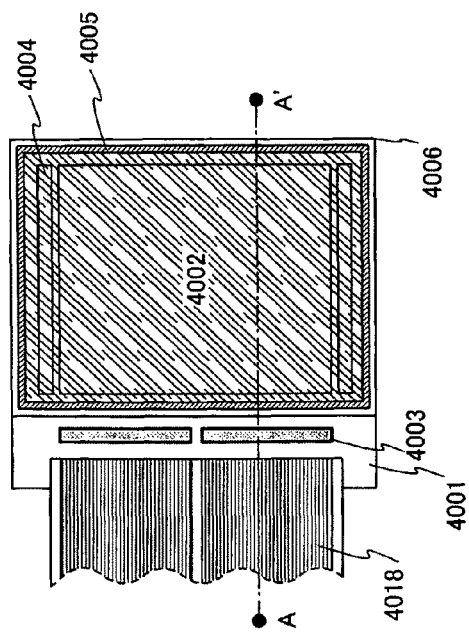
FIGS. 46A and 46B are a top view and a cross-sectional view, respectively, illustrating a liquid crystal display panel of the present invention.
Figure 46B:
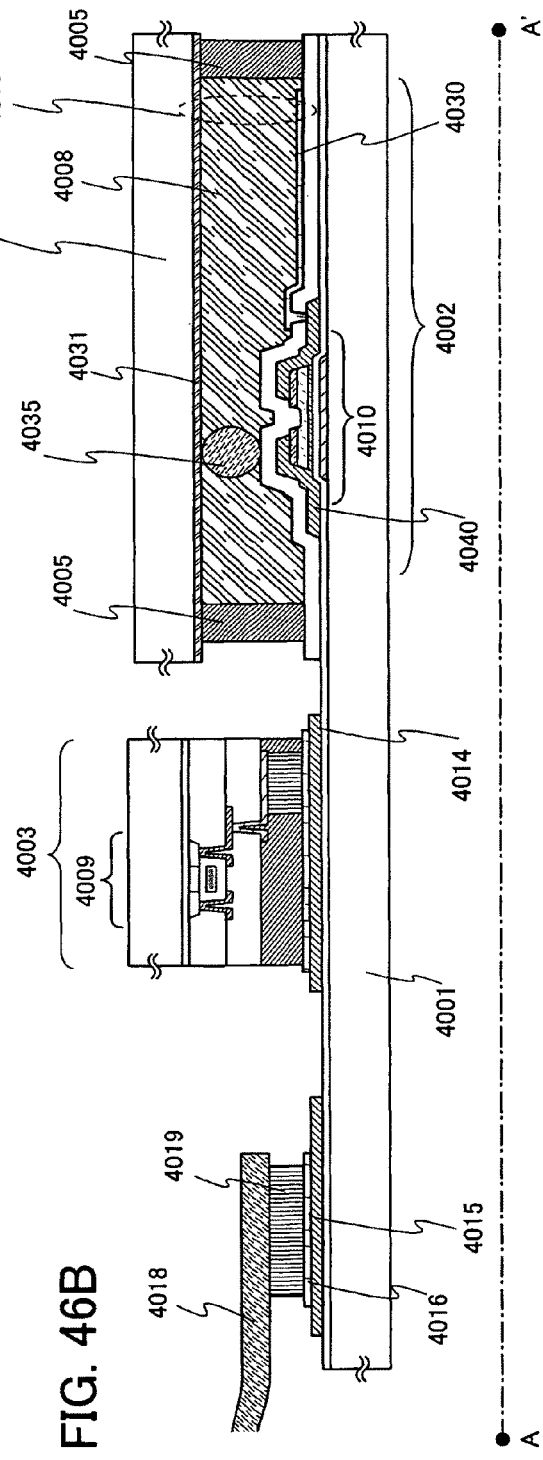

Next, an external view and a cross section of a liquid crystal display panel, which is one mode of a display device of the present invention, is described with reference to FIGS. 46A and 46B. FIG. 46A is a top view of a panel in which a thin film transistor 4010 including an LPSAS film and a liquid crystal element 4013 that are formed over a first substrate 4001 are sealed with a sealant 4005 between the first substrate 4001 and a second substrate 4006. FIG. 46B is a cross-sectional view taken along a line A-A' of FIG. 46A.

The sealant 4005 is provided so as to surround a pixel portion 4002 and a scanning line driver circuit 4004 that are provided over the first substrate 4001. The second substrate 4006 is provided over the pixel portion 4002 and the scanning line driver circuit 4004. Thus, the pixel portion 4002 and the scanning line driver circuit 4004 as well as liquid crystals 4008 are sealed with the sealant 4005 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. This embodiment mode describes an example in which the signal line driver circuit including a thin film transistor in which a polycrystalline semiconductor film is used for a channel formation region is attached to the first substrate 4001. Alternatively, a signal line driver circuit may be formed using a thin film transistor in which a single-crystalline semiconductor is used for a channel formation region and attached to the first substrate 4001. FIG. 46B shows a thin film transistor 4009 that is formed using a polycrystalline semiconductor film and included in the signal line driver circuit 4003 as an example.

The pixel portion 4002 and the scanning line driver circuit 4004 that are formed over the first substrate 4001 each include a plurality of thin film transistors, and the thin film transistor 4010 included in the pixel portion 4002 is illustrated as an example in FIG. 46B. The thin film transistor 4010 corresponds to a thin film transistor in which an LPSAS film is used for a channel formation region.

In addition, a pixel electrode 4030 of a liquid crystal element 4013 is electrically connected to the thin film transistor 4010 through a wiring 4040. A counter electrode 4031 of the liquid crystal element 4013 is formed on the second substrate 4006. The liquid crystal element 4013 corresponds to a region where the pixel electrode 4030 and the counter electrode 4031 sandwich the liquid crystals 4008.

The first substrate 4001 and the second substrate 4006 can be formed using glass, metal (a typical example is stainless steel), ceramics, or plastics. As plastics, a fiberglass-reinforced plastics (FRP) plate, a polyvinyl fluoride (PVF) film, a polyester film, or an acrylic resin film can be used. Further, sheet in which aluminum foil is sandwiched by PVF films or polyester films can also be used.

A spherical spacer 4035 is provided to control a distance (a cell gap) between the pixel electrode 4030 and the counter electrode 4031. A spacer which is obtained by selectively etching an insulating film may also be used.

A variety of signals and potential are supplied to the signal line driver circuit 4003 that is formed separately, the scanning line driver circuit 4004, or the pixel portion 4002 through leading wirings 4014 and 4015 from an FPC 4018.

In this embodiment mode, a connecting terminal 4016 is formed of the same conductive film as that of the pixel electrode 4030 included in the liquid crystal element 4013. In addition, the leading wirings 4014 and 4015 are formed of the same conductive film as that of the wiring 4040.

The connecting terminal 4016 is electrically connected to a terminal included in the FPC 4018 through an anisotropic conductive film 4019.

Although not illustrated, the liquid crystal display device shown in this embodiment mode includes an alignment film, a polarizing plate, and further, may include a color filter and a blocking film.

FIGS. 46A and 46B illustrate an example in which the signal line driver circuit 4003 is formed separately and mounted on the first substrate 4001, but this embodiment mode is not limited to this structure. The scanning line driver circuit may be formed separately and then mounted, or only a part of the signal line driver circuit or a part of the scanning line driver circuit may be formed separately and then mounted.

This embodiment mode can be carried out in combination with a structure of another embodiment mode.

Embodiment Mode 6

Figure 47A:
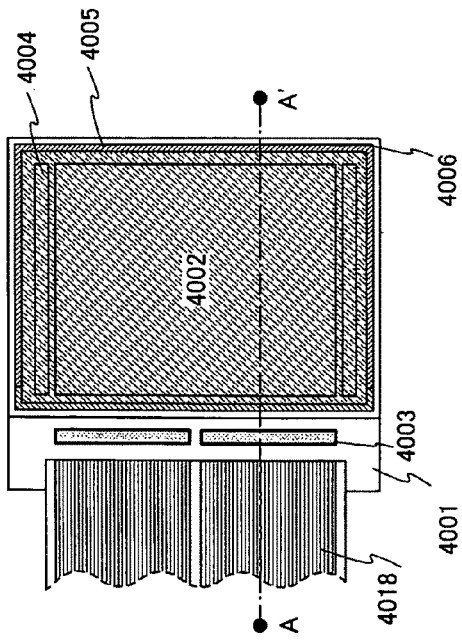
FIGS. 47A and 47B are a top view and a cross-sectional view, respectively, illustrating a light-emitting display panel of the present invention.
Figure 47B:
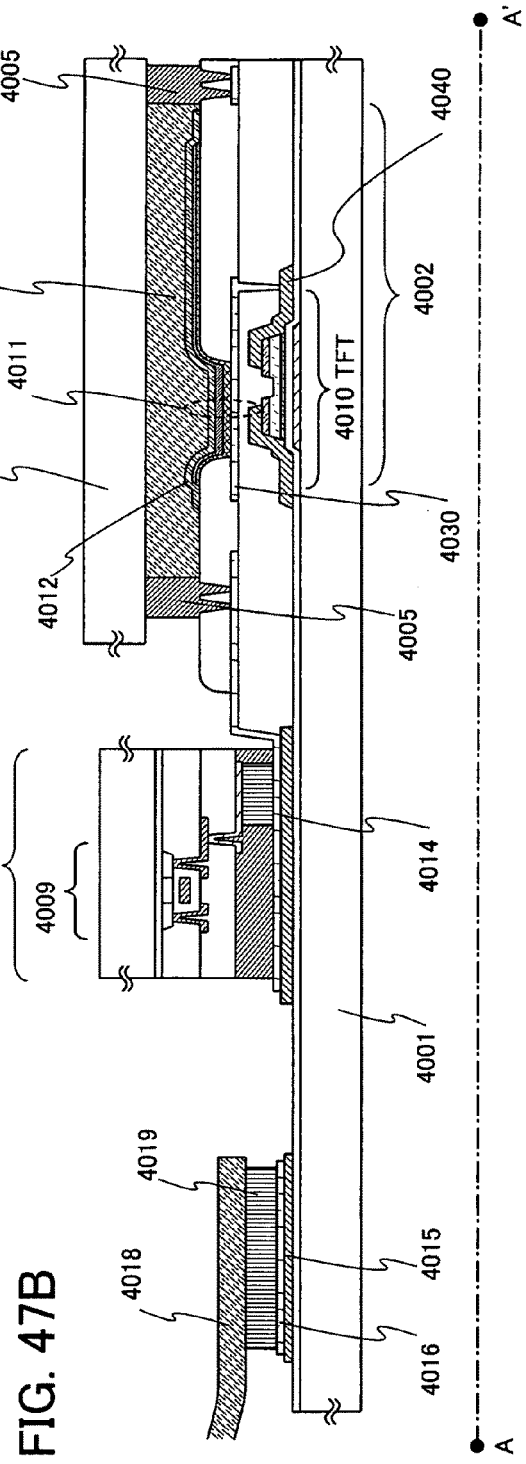

Next, an external view and a cross section of a light-emitting display panel, which is one mode of a display device of the present invention, is described with reference to FIGS. 47A and 47B. FIG. 47A is a top view of a panel in which a thin film transistor including a channel formation region formed of an LPSAS film and a light-emitting element that are formed over a first substrate are sealed with a sealant between the first substrate and a second substrate. FIG. 47B is a cross-sectional view taken along a line A-A' of FIG. 47A.

A sealant 4005 is provided so as to surround a pixel portion 4002 and a scanning line driver circuit 4004 that are provided over a first substrate 4001. A second substrate 4006 is provided over the pixel portion 4002 and the scanning line driver circuit 4004. Thus, the pixel portion 4002 and the scanning line driver circuit 4004 as well as a filler 4007 are sealed with the sealant 4005 between the first substrate 4001 and the second substrate 4006. A signal line driver circuit 4003 that is formed using a polycrystalline semiconductor film over a substrate which is prepared separately is mounted in a region that is different from the region surrounded by the sealant 4005 over the first substrate 4001. This embodiment mode describes an example in which the signal line driver circuit 4003 including a thin film transistor including a channel formation region formed of a polycrystalline semiconductor film is attached to the first substrate 4001. Alternatively, a signal line driver circuit may be formed using a thin film transistor including a channel formation region formed of a single-crystalline semiconductor and may be attached to the first substrate 4001. FIG. 47B shows a thin film transistor 4009 that is formed using a polycrystalline semiconductor film and included in the signal line driver circuit 4003 as an example.

The pixel portion 4002 and the scanning line driver circuit 4004 that are provided over the first substrate 4001 each include a plurality of thin film transistors. FIG. 47B shows a thin film transistor 4010 included in the pixel portion 4002 as an example. In this embodiment mode, the thin film transistor 4010 is illustrated as a driving TFT but may also be a current control TFT or an erasing TFT. The thin film transistor 4010 corresponds to a thin film transistor in which an LPSAS film is used for a channel formation region.

A pixel electrode 4030 of the light-emitting element 4011 is electrically connected to a source or drain electrode 4040 of the thin film transistor 4010. Further in this embodiment mode, a light-transmitting conductive film 4012 is provided over the pixel electrode 4030 with a light-emitting layer therebetween. The structure of the light-emitting element 4011 is not limited to the structure described in this embodiment mode. The structure of the light-emitting element 4011 can be changed as appropriate in accordance with a direction of light taken from the light-emitting element 4011, polarity of the thin film transistor 4010, or the like.

A variety of signals and potential which are applied to the signal line driver circuit 4003 that is formed separately, the scanning line driver circuit 4004, or the pixel portion 4002 are supplied from an FPC 4018 through a leading wiring 4014 and a leading wiring 4015, although not illustrated in the cross-sectional view of FIG. 47B.

In this embodiment mode, a connecting terminal 4016 is formed of the same conductive film as that of the pixel electrode 4030 included in the light-emitting element 4011. In addition, the leading wirings 4014 and 4015 are formed of the same conductive film as that of a wiring 4040.

The connecting terminal 4016 is electrically connected to a terminal included in the FPC 4018 through an anisotropic conductive film 4019.

A substrate located in a direction of extracting light from the light-emitting element 4011 needs to be transparent. In that case, a light-transmitting material such as a glass plate, a plastic plate, a polyester film, or an acrylic film is used.

As the filler 4007, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used as the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment may be carried out, by which reflected light can be diffused by projections and depressions on a surface, thereby reducing reflection.

FIGS. 47A and 47B illustrate an example in which the signal line driver circuit 4003 is formed separately and mounted on the first substrate 4001, but this embodiment mode is not limited to this structure. The scanning line driver circuit may be formed separately and then mounted, or only a part of the signal line driver circuit or a part of the scanning line driver circuit may be formed separately and then mounted.

This embodiment mode can be carried out in combination with a structure of another embodiment mode.

Embodiment Mode 7

Display devices or the like that are obtained according to the present invention can be used for active matrix display device modules. That is to say, the present invention can be carried out in all electronic devices in which these modules are incorporated into display portions.

As such electronic devices, cameras such as video cameras and digital cameras; displays that can be mounted on a person's head (goggle-type displays); car navigation systems; projectors; car stereos; personal computers; portable information terminals (e.g., mobile computers, mobile phones, and electronic books); and the like can be given. Examples of these devices are illustrated in FIGS. 40A to 40D.

FIG. 40A illustrates a television device. A television device can be completed by incorporating a display module into a chassis as illustrated in FIG. 40A. A display panel including components up to an FPC is also referred to as a display module. A main screen 2003 is formed with a display module. In addition, a speaker unit 2009, operation switches, and the like are provided as accessory equipment. In this manner, a television device can be completed.

As illustrated in FIG. 40A, a display panel 2002 including display elements is incorporated into a chassis 2001. In addition to reception of general television broadcast by a receiver 2005, communication of information in one direction (from a transmitter to a receiver) or in two directions (between a transmitter and a receiver or between receivers) can be performed by connection to a wired or wireless communication network through a modem 2004. The television device can be operated using switches that are incorporated into the chassis or with a remote control device 2006 that is provided separately, and a display portion 2007 that displays output information may be provided for the remote control device.

Further, in the television device, a sub-screen 2008 may be formed using a second display panel and may be used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display is possible with low power consumption. Furthermore, in order to give priority to a shift toward lower power consumption, the main screen 2003 may be formed with a liquid crystal display panel, and the sub-screen 2008 may be formed with a light-emitting display panel, and the sub-screen 2008 may be configured to be capable of being turned on and off.

Figure 41:
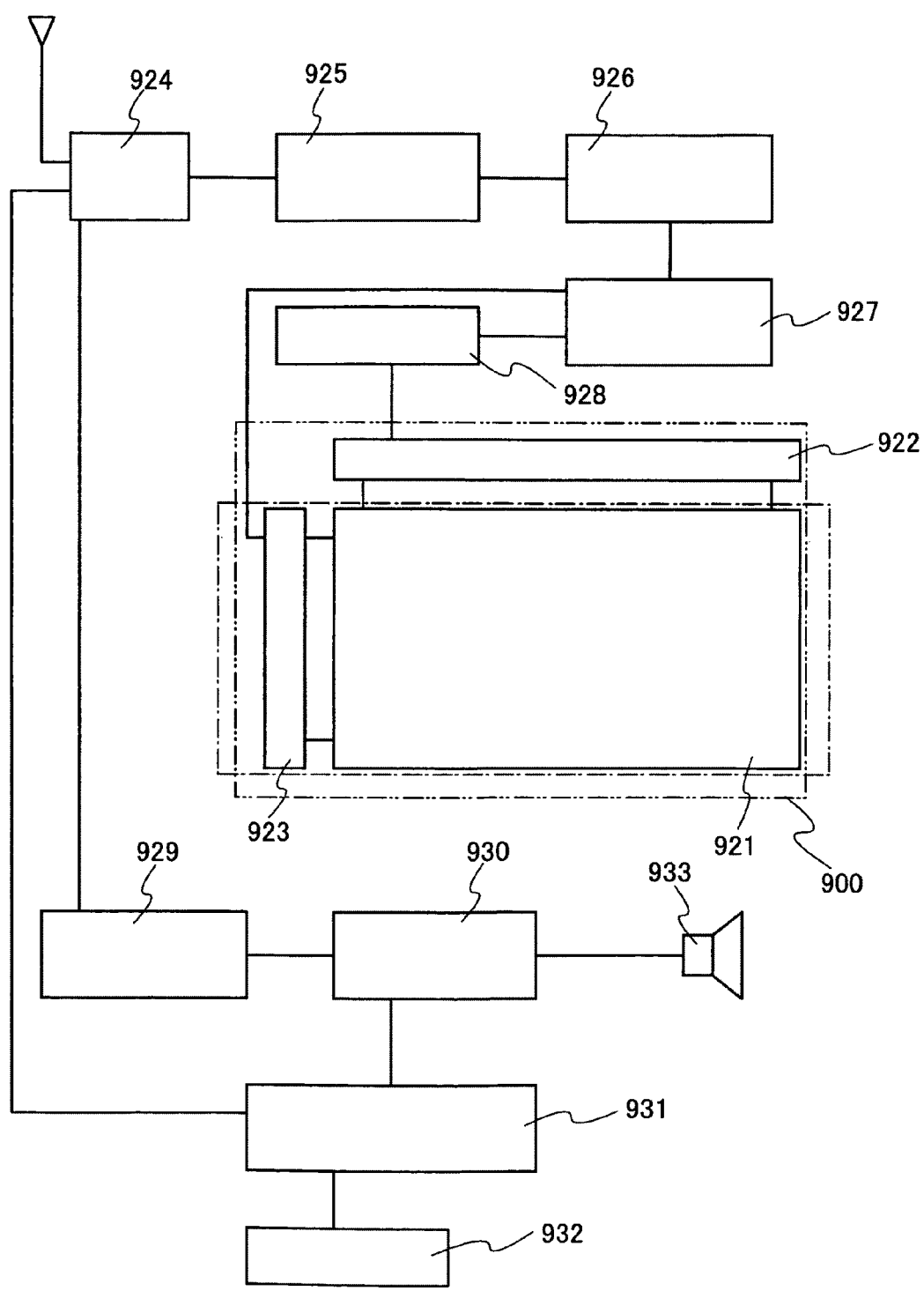
FIG. 41 is a diagram illustrating an electronic device including a light-emitting device of the present invention.

FIG. 41 is a block diagram showing a main structure of the television device. A pixel portion 921 is formed in a display panel 900. A signal line driver circuit 922 and a scanning line driver circuit 923 may be mounted on the display panel 900 by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can match input specification of the driver IC, and the like are provided on an input side of the video signal. The control circuit 927 outputs signals to both a scanning line side and a signal line side. In a case of digital driving, a signal divide circuit 928 may be provided on the signal line side and an input digital signal may be divided into m pieces and supplied.

An audio signal among signals received by the tuner 924 is sent to an audio signal amplifier circuit 929 and is supplied to a speaker 933 through an audio signal process circuit 930. A control circuit 931 receives control information of a receiving station (reception frequency) or sound volume from an input portion 932 and transmits signals to the tuner 924 and the audio signal process circuit 930.

Needless to say, the present invention is not limited to a use for television devices, and can be applied to a variety of applications such as monitors of personal computers, or display media that have a large area, such as information display boards in railway stations, airports, and the like, or street-side advertisement display boards.

FIG. 40B illustrates one mode of a mobile phone 2301. The mobile phone 2301 includes a display portion 2302, an operation portion 2303, and the like. The display device described in the preceding embodiment modes is applied to the display portion 2302, so that mass productivity can be improved.

A portable computer illustrated in FIG. 40C includes a main body 2401, a display portion 2402, and the like. The display device described in the preceding embodiment modes is applied to the display portion 2402, so that mass productivity can be improved.

FIG. 40D illustrates a desk lamp including a lighting portion 2501, a lampshade 2502, an adjustable arm 2503, a support 2504, a base 2505, and a power supply 2506. The desk lamp is manufactured with use of a light-emitting device of the present invention for the lighting portion 2501. The lighting equipment includes a ceiling light, a wall light, and the like in its category. Use of the display device shown in the preceding embodiment modes can increase mass productivity and provide inexpensive desk lamps.

Embodiment 1

Microcrystalline silicon films were formed over glass substrates and irradiated with laser beams. FIG. 48, FIGS. 49A and 49B, and FIG. 50 show measured results of energy densities of the laser beams; and surface states, crystallinity, and surface roughness of formed silicon films.

The microcrystalline silicon films with a thickness of 10 nm were formed over the glass substrates under such a condition that the RF power source frequency was 13.56 MHz; the power of the RF power source was 100 W; the film deposition temperature was 280° C.; the flow ratio of hydrogen to silane gas was 100:1; and the pressure was 280 Pa.

Then, the microcrystalline silicon films were irradiated with excimer laser beams (with a frequency of 308 nm). Table 1 shows energy densities of samples at this time.

Ic/Ia are more than 3 and less than 7, which shows that amorphous silicon and polysilicon are mixed.

When the energy densities are 370 mJ/cm² (the sample 6), 401 mJ/cm² (the sample 7), and 433 mJ/cm² (the sample 8), Ic/Ia are more than 13 and less than 20, which show that amorphous silicon and polysilicon are mixed. Further, the results show that the percentage of the polysilicon is increased.

When the energy densities are 467 mJ/cm² (the sample 9) and 502 mJ/cm² (the sample 10), Ic/Ia are more than 23 and less than 27, which shows that amorphous silicon and polysilicon are mixed. Further, the results show that the percentage of the polysilicon is increased.

These results show that polysilicon is included in a higher percentage and the crystallinity of a microcrystalline silicon film is increased as the energy density of a laser beam is increased, and that a microcrystalline silicon film is preferably irradiated with a laser beam having the energy density of

| | Samples | | | | | | | | | |
|---|---|---|---|---|---|---|---|---|---|---|
| | Sample 1 | Sample 2 | Sample 3 | Sample 4 | Sample 5 | Sample 6 | Sample 7 | Sample 8 | Sample 9 | Sample 10 |
| Energy Densities (mJ/cm²) | 248 | 268 | 291 | 315 | 342 | 370 | 401 | 433 | 467 | 502 |

Figure 48:
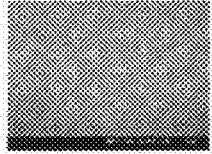
FIG. 48 shows photographs showing microcrystalline semiconductor films obtained in Embodiment 1, which were observed with an SEM.

FIG. 48 shows surface states of the samples 1 to 10 observed with a scanning electron microscope (SEM). Upper rows in the table of each sample are scanning electron micrographs of 20,000-time magnification, and lower rows are those of 300,000-time magnification.

The surface states of the samples 1 to 5 were similar to that of a microcrystalline silicon film with which a laser beam is not irradiated, and the size of microcrystals was several tens of nm.

The scanning electron micrographs of the samples 6 to 8 show that microcrystals irregular in size were formed.

Further, scanning electron micrographs of the samples 9 to 10 show that crystal grains had as large sizes as greater than or equal to 100 nm.

The above results show that the energy density of a laser beam with which a microcrystalline silicon film is not melted is from 248 to 342 mJ/cm².

Figure 49A:
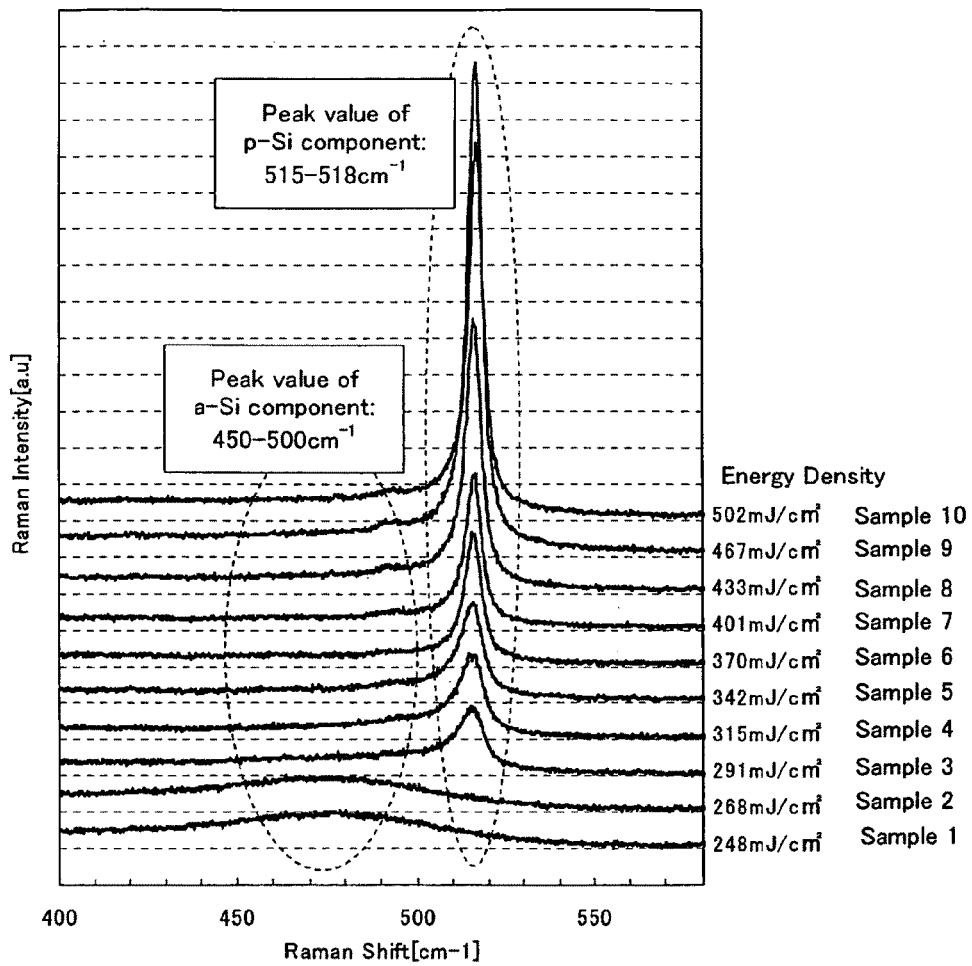
FIGS. 49A and 49B are graphs showing results of measuring microcrystalline semiconductor films obtained in Embodiment 1, by a Raman spectroscopy method.

FIG. 49A show measured results of Raman scattering spectra of the samples 1 to 10. The peak value of amorphous silicon is 480 cm⁻¹. The peak value of polysilicon is from 515 to 518 cm⁻¹. The peak value of single-crystalline silicon is 520.5 cm⁻¹.

The samples 1 and 2 had broad peaks in 450 to 500 cm⁻¹, which shows that they included amorphous silicon. The samples 3 to 10 had peaks in 515 to 518 cm⁻¹, and the results thereof show that the half-widths (FWHM: full width at half maximum) decreased and the crystallinity increased as the energy densities of the laser beams were increased.

Figure 49B:
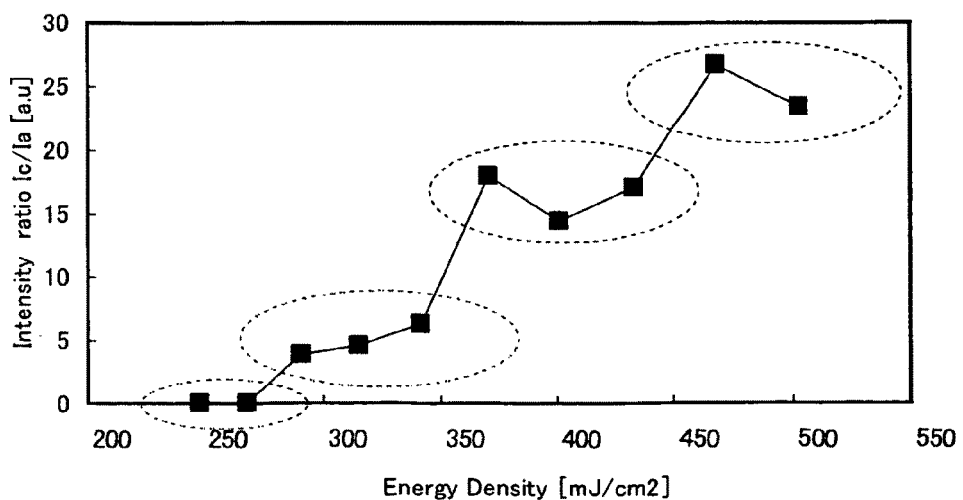

FIG. 49B shows a graph of crystalline/amorphous peak intensity ratios (hereinafter referred to as Ic/Ia) of LPSAS films to energy densities of the laser beams.

When the energy densities are 248 mJ/cm² (the sample 1) and 268 mJ/cm² (the sample 2), Ic/Ia are less than 1, which shows that most parts are amorphous silicon.

When the energy densities are 291 mJ/cm² (the sample 3), 315 mJ/cm² (the sample 4), and 342 mJ/cm² (the sample 5), more than or equal to 291 mJ/cm² in order to form a silicon film that includes crystal grains at a high percentage.

FIGS. 48, 49A, and 49B show that the range of the energy density of a laser beam with which a microcrystalline silicon film with a thickness of 10 nm is not melted and can have increased crystallinity, i.e., the range of the energy density of the laser beam with which an LPSAS film can be formed is from 290 to 350 mJ/cm inclusive, preferably from 291 to 342 mJ/cm² inclusive.

Figure 50:
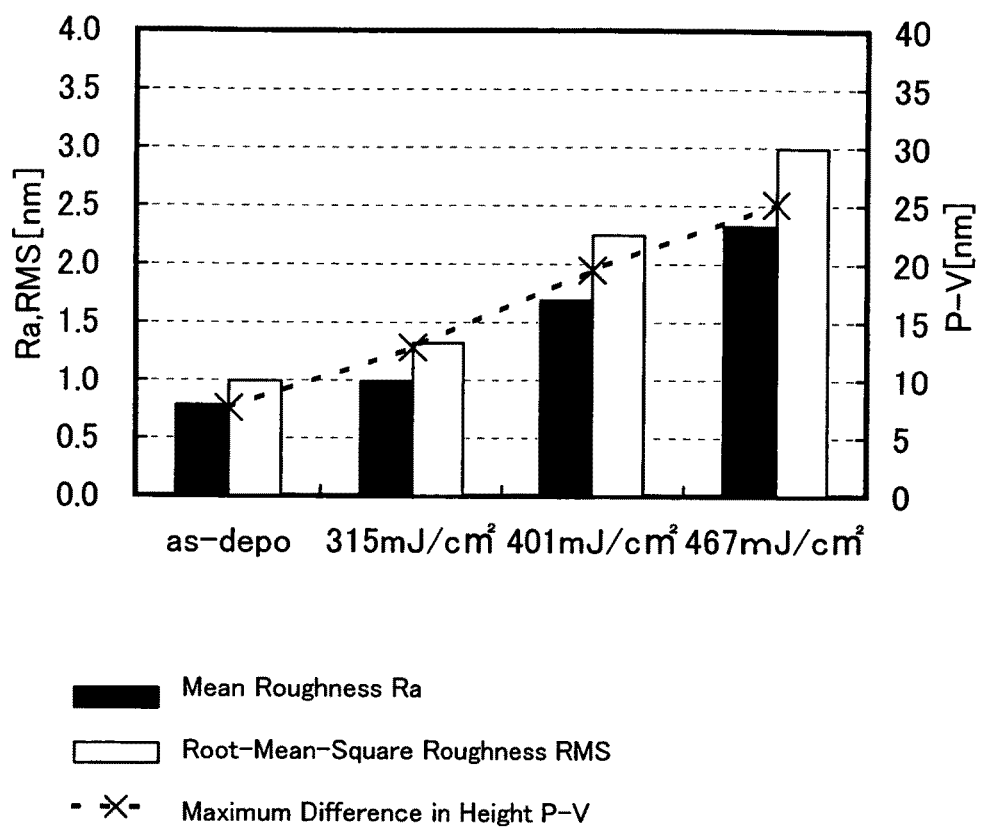
FIG. 50 is a graph showing results of measuring microcrystalline semiconductor films obtained in Embodiment 1, in a DFM.

FIG. 50 show changes in roughness of microcrystalline silicon films when the films are irradiated with laser beams.

Here, roughness of microcrystalline silicon films that had a thickness of 10 nm and were formed under such a condition that the RF power source frequency was 13.56 MHz, the power of the RF power source was 100 W, the film deposition temperature was 280° C., the flow ratio of hydrogen to silane gas was 100:1, and the pressure was 280 Pa; and roughness of silicon films formed by irradiating the microcrystalline silicon films with laser beams having the energy density of 315 mJ/cm², 401 mJ/cm², and 467 mJ/cm², respectively, was measured by non-contact mode atomic force microscopy (AFM) in a dynamic force mode (DFM). Further, as a comparative example, surface roughness of a microcrystalline silicon film which is not irradiated with a laser beam (shown as "as-depo") is shown. FIG. 50 shows mean roughness, root-mean-square roughness, and maximum difference in height.

FIG. 50 shows that the surface becomes rougher by increasing the energy density of the laser beam, and that when the energy of the laser beam reaches at least 401 mJ/cm², the microcrystalline silicon film is melted and crystals grow secondarily to move the volume of silicon, so that pinholes are generated in the silicon film and roughness (ridges) of the surface is generated or increased. However, FIG. 50 further shows that the crystallinity can be increased while increase in the roughness of the surface is suppressed, by irradiating the microcrystalline silicon film having a thickness of 10 nm with a laser beam having the energy density of 315 mJ/cm$^2$. Depending on a film formed between a microcrystalline silicon film and a substrate, the film can absorb heat; thus, a laser beam having higher energy than the above range needs to be used for irradiation in some cases.

Embodiment 2

Figure 51:
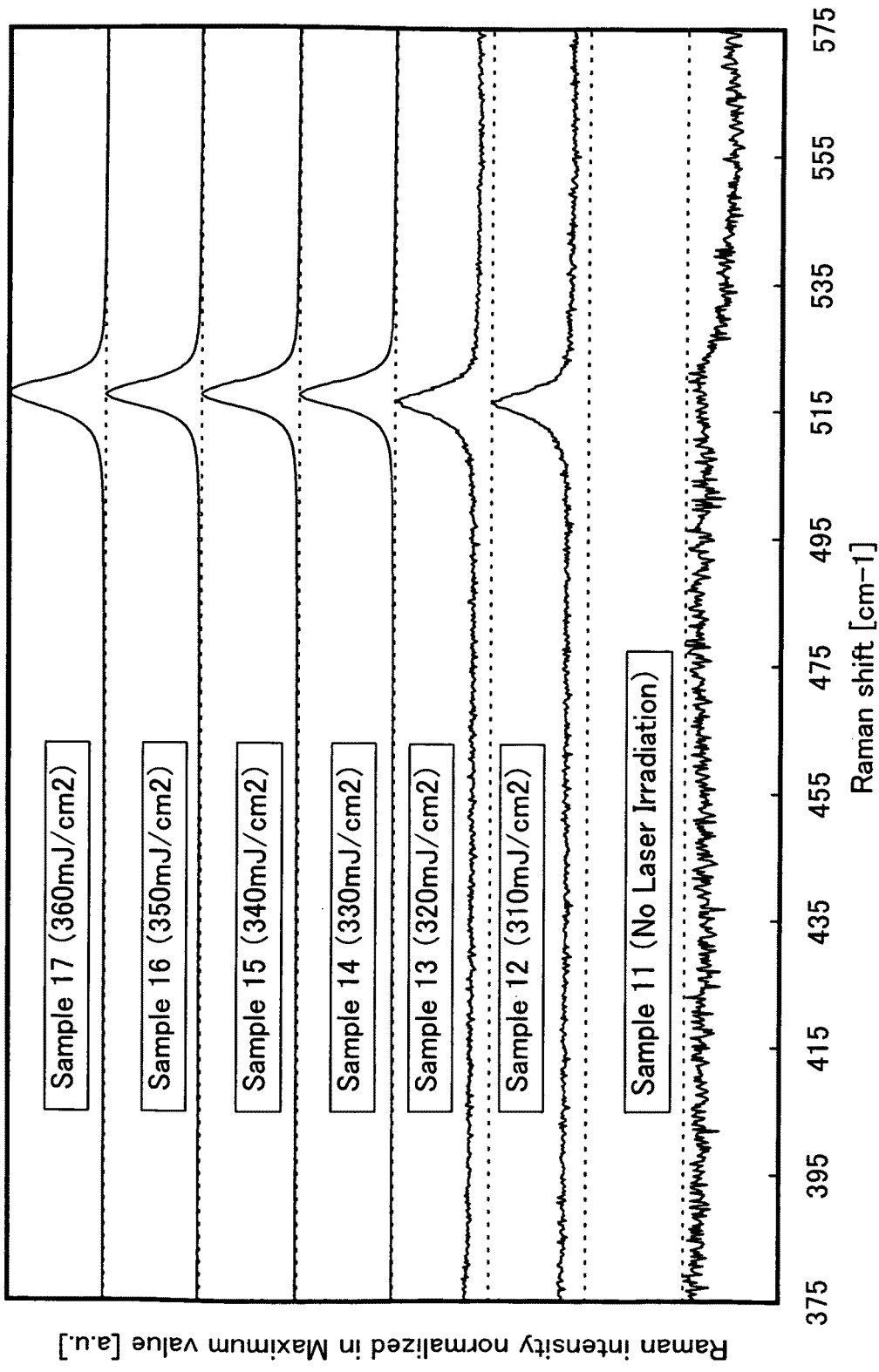
FIG. 51 is a graph showing results of measuring microcrystalline semiconductor films obtained in Embodiment 2, by a Raman spectroscopy method.

In this embodiment, silicon nitride films were formed as base films over glass substrates and microcrystalline silicon films were formed thereover, and some of the microcrystalline silicon films were irradiated with laser beams. FIG. 51 shows the energy densities of the laser beams and the crystallinity of silicon films obtained.

Silicon oxynitride films were formed over substrates. Here, glass substrates were used as the substrates. Further, silicon oxynitride films with a thickness of 100 nm were formed as the base films under such a condition that the RF power source frequency was 60 MHz; the power of the RF power source was 150 W; the film deposition temperature was 400° C.; the flow ratio of silane to dinitrogen monoxide was 1:200; and the pressure was 40 Pa.

Then, microcrystalline silicon films were formed over the base films.

The microcrystalline silicon films with a thickness of 30 nm were formed under such a condition that the RF power source frequency was 13.56 MHz; the power of the RF power source was 100 W; the film deposition temperature was 280° C.; the flow ratio of hydrogen to silane gas was 100:1; and the pressure was 280 Pa.

Then, the microcrystalline silicon films were irradiated with excimer laser beams (with a frequency of 308 nm). Table 2 shows energy densities of samples at this time.

| | Samples | | | | | | |
|---|---|---|---|---|---|---|---|
| | Sample 11 | Sample 12 | Sample 13 | Sample 14 | Sample 15 | Sample 16 | Sample 17 |
| Energy Densities (mJ/cm$^2$) | 0 | 310 | 320 | 330 | 340 | 350 | 360 |

FIG. 51 shows the results of the crystallinity of the microcrystalline silicon films measured by a Raman scattering spectroscopy. The peak value of amorphous silicon is 480 cm$^{-1}$. The peak value of polysilicon is from 515 to 518 cm$^{-1}$. The peak value of single-crystalline silicon is 520.5 cm$^{-1}$.

A sample 11 in which the microcrystalline silicon film was not irradiated with a laser beam had a broad peak of from 450 to 500 cm$^{-1}$, which shows that it included amorphous silicon. Further, the sample 11 had a small peak of from 515 to 520 cm$^{-1}$, which shows that it included microcrystalline silicon.

The silicon films of samples 12 to 17, in which the microcrystalline silicon films were irradiated with laser beams having energy of 310 to 360 mJ/cm$^2$, did not have any broad peaks in 450 to 500 cm$^{-1}$, but each had a peak in around 516 to 520 cm$^{-1}$, which shows that amorphous components in the microcrystalline silicon films had grew in a solid phase and became microcrystals by irradiation with the laser beams.

Embodiment 3

This embodiment shows measured results of electric characteristics of a thin film transistor manufactured according to the process for manufacturing a thin film transistor shown in FIGS. 1A to 1C, FIGS. 2A to 2C, and FIGS. 3A to 3C.

First, the process for manufacturing a thin film transistor is described.

As shown in FIG. 1A, a gate electrode 51 was formed over a substrate 50. At this time, a glass substrate was used as the substrate 50. Further, for a gate electrode 51, a molybdenum film with a thickness of 150 nm was formed by sputtering a molybdenum target with argon. Then, the molybdenum film was etched using a resist mask formed through a photolithography process, so that a molybdenum layer was formed as the gate electrode 51. After that, the resist mask was removed.

Next, gate insulating films 52a and 52b and a microcrystalline semiconductor film 53a were formed successively over the gate electrode 51 and the substrate 50.

As the gate insulating film 52a, a silicon nitride film with a thickness of 123 nm was formed under such a condition that the RF power source frequency was 60 MHz; the power of the RF power source was 100 W; the film deposition temperature was 400° C.; the flow ratio of silane to ammonia and argon was 1:80:10; and the pressure was 40 Pa.

As the gate insulating film 52b, a silicon oxynitride film with a thickness of 100 nm was formed under such a condition that the RF power source frequency was 60 MHz; the power of the RF power source was 150 W; the film deposition temperature was 400° C.; the flow ratio of silane to dinitrogen monoxide was 1:200; and the pressure was 40 Pa.

Then, a protective film was formed on an inner wall of a reaction chamber. As the protective film, an amorphous silicon film with a thickness of 100 nm was formed under such a condition that the RF power source frequency was 13.56 MHz; the power of the RF power source was 60 W; the film deposition temperature was 280° C.; the flow rate of silane was 100 sccm; and the pressure was 280 Pa.

Next, the substrate was placed in the reaction chamber and the microcrystalline semiconductor film 53a was formed over the gate insulating film 52b. As the microcrystalline semiconductor film 53a, a microcrystalline silicon film with a thickness of 30 nm was formed under such a condition that the RF power source frequency was 13.56 MHz; the power of the RF power source was 100 W; the film deposition temperature was 280° C.; the flow ratio of silane to hydrogen was 1:100; and the pressure was 280 Pa. Before this process, an amorphous silicon (a-Si) film had been formed on the inner wall of the reaction chamber.

After a natural oxide film formed on a surface of the microcrystalline semiconductor film 53a was removed with hydrofluoric acid, the microcrystalline semiconductor film 53a was irradiated with a laser beam, so that an LPSAS film 53b shown in FIG. 1B was formed. Here, the microcrystalline semiconductor film 53a was irradiated with excimer laser light having energy of 380 mJ/cm$^2$ in an air atmosphere. After that, an oxide film on a surface of the LPSAS film 53b was removed with hydrofluoric acid.

Subsequently, a buffer layer 54 and a semiconductor film 55 to which an impurity element imparting one conductivity type was added (hereinafter simply referred to as an "impurity semiconductor film 55") were formed over the LPSAS film 53b as shown in FIG. 1C.

As the buffer layer 54, an amorphous silicon film with a thickness of 80 nm was formed under such a condition that the RF power source frequency was 13.56 MHz; the power of the RF power source was 60 W; the film deposition temperature was 280° C.; the flow ratio of silane to hydrogen was 14:15; and the pressure was 170 Pa.

As the impurity semiconductor film 55, an amorphous silicon film with a thickness of 50 nm to which phosphorus was added was formed under such a condition that the RF power source frequency was 13.56 MHz; the power of the RF power source was 60 W, the film deposition temperature was 280° C.; the flow ratio of silane to 0.5% phosphine (diluted with hydrogen) was 10:17; and the pressure was 170 Pa.

Next, a resist was applied to the impurity semiconductor film 55, and then a resist mask 56 was formed through a photolithography process. Subsequently, the LPSAS film 53b, the buffer layer 54, and the impurity semiconductor film 55 were etched using the resist mask 56, so that a semiconductor layer in an island shape was formed as shown in FIG. 2A. Here, the LPSAS film 53b, the buffer layer 54, and the impurity semiconductor film 55 were etched using a parallel plate reactive ion etching (RIE) apparatus under such a condition that the inductively coupled plasma (ICP) power was 150 W; the bias power was 40 W; the pressure was 1.0 Pa; chlorine was fed as an etching gas at a flow rate of 100 sccm; and the etching time was 100 seconds. As a result, an LPSAS film 61, a buffer layer 62, and a semiconductor film 63 to which the impurity element imparting one conductivity type had been added (hereinafter simply referred to as an "impurity semiconductor film 63"), which were in an island shape, were formed. After that, the resist mask 56 was removed.

Then as shown in FIG. 2B, a conductive film 65 was formed to cover the LPSAS film 61, the buffer layer 62, and the impurity semiconductor film 63, which were in an island shape. Here, the conductive film 65 with a single-layer structure was formed instead of the conductive films 65a to 65c with a three-layer structure. Specifically, a molybdenum film with a thickness of 300 nm was formed by sputtering a molybdenum target with argon.

Next, a resist was applied over the conductive film 65, and then resist masks 66 were formed through a photolithography process. Subsequently, the conductive film 65 was wet-etched to form a conductive film 71 as shown in FIG. 2C. In this embodiment, the conductive film 71 had a parallel shape instead of a C shape in a plan view.

Then, the impurity semiconductor film 63 was etched using the resist masks 66 to form a pair of impurity semiconductor layers 72 as shown in FIG. 3A. In this step, part of a surface of the buffer layer was also etched to be a buffer layer 73. Here, the buffer layer 62 and the impurity semiconductor film 63 were etched using the parallel plate RIE etching apparatus under such a condition that the ICP power was 150 W; the bias power was 40 W; the pressure was 1.0 Pa; chlorine was fed as an etching gas at a flow rate of 100 sccm; and the etching time was 44 seconds. After that, the resist masks were removed.

Subsequently, the buffer layer 73 and the pair of impurity semiconductor layers 72 were irradiated with chlorine plasma to remove impurities remaining in the buffer layer 73. Here, a surface of the buffer layer 62 was etched under such a condition that the source power was 2000 W; the pressure was 0.67 Pa; chlorine was fed as an etching gas at a flow rate of 100 sccm; and the etching time was 30 seconds.

Then, an insulating film 76 was formed. Here, as the insulating film 76, a silicon nitride film with a thickness of 300 nm was formed under such a condition that the RF power source frequency was 13.56 MHz; the power of the RF power source was 150 W; the film deposition temperature was 280° C.; the flow ratio of silane to ammonia, nitrogen, and hydrogen was 2:22:45:45; and the pressure was 160 Pa.

Next, a resist was applied to the insulating film 76, and then part of the insulating film 76 was dry-etched using a resist mask formed through a photolithography process, thereby exposing the conductive film. Further, part of the insulating film and gate insulating films 52a and 52b was dry-etched to expose the gate electrode 51. Here, with use of the parallel plate RIE apparatus, plasma was generated using $CHF_3$ at a flow rate of 50 sccm and helium at a flow rate of 100 sccm under such a condition that the ICP power was 475 W; the bias power was 300 W; and the pressure was 5.5 Pa. Then, the insulating film 76 and the gate insulating film 52b were etched, using $CHF_3$ at a flow rate of 7.5 sccm and helium at a flow rate of 142.5 sccm for etching gases, for etching time of 92 seconds. Subsequently, the gate insulating film 52a was etched for 71 seconds under the same condition as the above. After that, the resist mask was removed.

Then, a conductive layer was formed over the insulating film 76. Here, an ITO film with a thickness of 50 nm was formed as the conductive layer by a sputtering method. However, the ITO film is not necessarily formed.

Through the above process, a thin film transistor was formed as shown in FIG. 3C.

Figure 52:
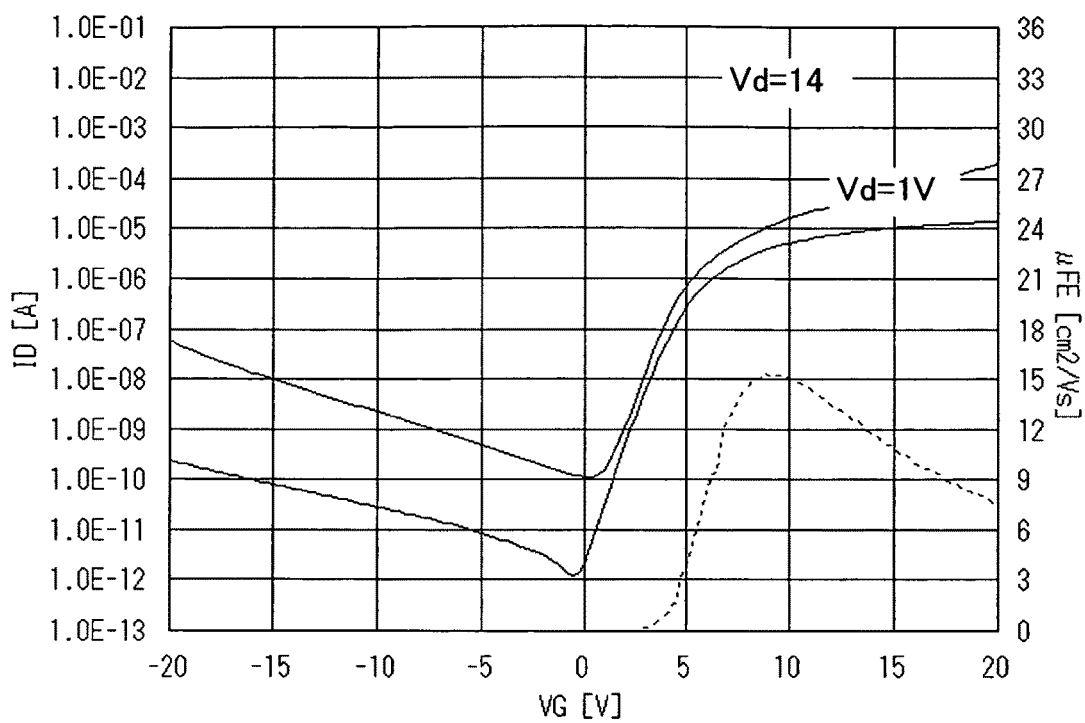
FIG. 52 is a graph showing electric characteristics of thin film transistors obtained in Embodiment 3.

FIG. 52 shows measured results of electric characteristics of the thin film transistor. The thin film transistor of this embodiment had a channel length of 6 μm and a channel width of 25 μm. Solid lines show current-voltage properties when the drain voltages were 1 V and 14 V. A broken line shows electric field mobility when the drain voltage was 1 V. The maximum field effect mobility was 15 $cm^2/V \cdot s$. As shown above, a thin film transistor with higher mobility can be manufactured in which an LPSAS film is used for a channel formation region, compared to a thin film transistor in which an amorphous silicon film or a microcrystalline silicon film is used for a channel formation region.

This application is based on Japanese Patent Application serial No. 2007-190236 filed with Japan Patent Office on Jul. 20, 2007, the entire contents of which are hereby incorporated by reference.

What is claimed is:

1. A method for manufacturing a display device, comprising the steps of:
    forming a gate electrode over a substrate;
    forming a gate insulating film over the substrate and over the gate electrode;
    forming a microcrystalline semiconductor film over the gate insulating film;
    irradiating the microcrystalline semiconductor film with a laser beam;
    forming a buffer layer comprising an amorphous semiconductor film over the microcrystalline semiconductor film, after the step of irradiating;
    performing a nitrogen plasma treatment or a halogen plasma treatment to a surface of the buffer layer;
    forming an impurity semiconductor film over the buffer layer, to which an impurity element which imparts one conductivity type is added;
    forming a source region and a drain region by selectively etching the impurity semiconductor film;
    forming a source electrode over the source region, and a drain electrode over the drain region; and
    forming a pixel electrode in contact with one of the source electrode and the drain electrode.

2. The method for manufacturing the display device according to claim 1, further comprising the steps of:
    forming an interlayer insulating film over the source electrode and the drain electrode;
    forming a contact hole over any one of the source electrode and the drain electrode; and
    wherein the pixel electrode is formed over the interlayer insulating film, so as to be connected to the one of the source electrode and the drain electrode through the contact hole.

3. The method for manufacturing the display device according to claim 2, further comprising the steps of:
   forming a second contact hole over the other of the source electrode and the drain electrode; and
   forming a wiring over the interlayer insulating film, which is connected to the other of the source electrode and the drain electrode through the second contact hole.

4. The method for manufacturing the display device according to claim 1,
   wherein the microcrystalline semiconductor film comprises a semiconductor crystal with a crystal diameter of from 0.5 nm to 50 nm.

5. The method for manufacturing the display device according to claim 1,
   wherein the amorphous semiconductor film includes any of nitrogen, hydrogen, fluorine, chlorine, bromine and iodine.

6. The method for manufacturing the display device according to claim 1,
   wherein the display device is a liquid crystal display device.

7. The method for manufacturing the display device according to claim 1,
   wherein the display device is a light-emitting device.

8. The method for manufacturing the display device according to claim 1,
   wherein the buffer layer has a thickness of from 30 to 500 nm inclusive.

9. A method for manufacturing a display device, comprising the steps of:
   forming a gate electrode over a substrate;
   forming a gate insulating film over the substrate and over the gate electrode;
   forming a microcrystalline semiconductor film over the gate insulating film;
   irradiating the microcrystalline semiconductor film with a laser beam;
   forming a buffer layer over the microcrystalline semiconductor film, after the step of irradiating;
   forming an impurity semiconductor film over the buffer layer, to which an impurity element which imparts one conductivity type is added;
   forming a source region and a drain region by selectively etching the impurity semiconductor film;
   selectively etching the buffer layer and the microcrystalline semiconductor film after the step of forming the source region and the drain region;
   forming a source electrode over the source region, and a drain electrode over the drain region, after the step of selectively etching the buffer layer and the microcrystalline semiconductor film; and
   forming a pixel electrode in contact with one of the source electrode and the drain electrode.

10. The method for manufacturing the display device according to claim 9, further comprising the steps of:
    forming an interlayer insulating film over the source electrode and the drain electrode;
    forming a contact hole over any one of the source electrode and the drain electrode; and
    wherein the pixel electrode is formed over the interlayer insulating film, so as to be connected to the one of the source electrode and the drain electrode through the contact hole.

11. The method for manufacturing the display device according to claim 10, further comprising the steps of:
    forming a second contact hole over the other of the source electrode and the drain electrode; and
    forming a wiring over the interlayer insulating film, which is connected to the other of the source electrode and the drain electrode through the second contact hole.

12. The method for manufacturing the display device according to claim 9,
    wherein the microcrystalline semiconductor film comprises a semiconductor crystal with a crystal diameter of from 0.5 nm to 50 nm.

13. The method for manufacturing the display device according to claim 9,
    wherein the buffer layer comprises an amorphous semiconductor film.

14. The method for manufacturing the display device according to claim 9,
    wherein the buffer layer comprises an amorphous semiconductor film including any of nitrogen, hydrogen, fluorine, chlorine, bromine and iodine.

15. The method for manufacturing the display device according to claim 9,
    wherein the display device is a liquid crystal display device.

16. The method for manufacturing the display device according to claim 9,
    wherein the display device is a light-emitting device.

17. A method for manufacturing a display device, comprising the steps of:
    forming a gate electrode over a substrate;
    forming a gate insulating film over the substrate and over the gate electrode;
    forming a microcrystalline semiconductor film over the gate insulating film;
    irradiating the microcrystalline semiconductor film with a laser beam;
    forming a buffer layer over the microcrystalline semiconductor film, after the step of irradiating;
    forming an impurity semiconductor film over the buffer layer, to which an impurity element which imparts one conductivity type is added;
    forming a conductive film over the impurity semiconductor film;
    forming a first resist mask over the conductive film, by a photolithography process using a multi-tone photomask;
    selectively etching the conductive film, the buffer layer and the microcrystalline semiconductor film;
    forming a second resist mask by ashing the first resist mask;
    forming a source electrode and a drain electrode by selectively etching the conductive film using the second resist mask;
    forming a source region under the source electrode and a drain region under the drain electrode, by selectively etching the impurity semiconductor film using the second resist mask; and
    forming a pixel electrode in contact with one of the source electrode and the drain electrode.

18. The method for manufacturing the display device according to claim 17, further comprising the steps of:
    forming an interlayer insulating film over the source electrode and the drain electrode;
    forming a contact hole over any one of the source electrode and the drain electrode; and
    wherein the pixel electrode is formed over the interlayer insulating film, so as to be connected to the one of the source electrode and the drain electrode through the contact hole.

19. The method for manufacturing the display device according to claim 18, further comprising the steps of:
   forming a second contact hole over the other of the source electrode and the drain electrode; and
   forming a wiring over the interlayer insulating film, which is connected to the other of the source electrode and the drain electrode through the second contact hole.

20. The method for manufacturing the display device according to claim 17,
   wherein the microcrystalline semiconductor film comprises a semiconductor crystal with a crystal diameter of from 0.5 nm to 50 nm.

21. The method for manufacturing the display device according to claim 17,
   wherein the buffer layer comprises an amorphous semiconductor film.

22. The method for manufacturing the display device according to claim 17,
   wherein the buffer layer comprises an amorphous semiconductor film including any of nitrogen, hydrogen, fluorine, chlorine, bromine and iodine.

23. The method for manufacturing the display device according to claim 17,
   wherein the display device is a liquid crystal display device.

24. The method for manufacturing the display device according to claim 17,
   wherein the display device is a light-emitting device.

* * * * *